(12) United States Patent
Yudanov et al.

(10) Patent No.: US 12,353,762 B2
(45) Date of Patent: Jul. 8, 2025

(54) SIGNAL DEVELOPMENT CACHING IN A MEMORY DEVICE

(71) Applicant: Micron Technology, Inc., Boise, ID (US)

(72) Inventors: Dmitri A. Yudanov, Rancho Cordova, CA (US); Shanky Kumar Jain, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 17/980,546

(22) Filed: Nov. 3, 2022

(65) Prior Publication Data
US 2023/0066051 A1 Mar. 2, 2023

Related U.S. Application Data

(62) Division of application No. 17/414,296, filed as application No. PCT/US2019/067829 on Dec. 20, 2019, now Pat. No. 11,520,529.
(Continued)

(51) Int. Cl.
*G11C 11/22* (2006.01)
*G06F 3/06* (2006.01)
(Continued)

(52) U.S. Cl.
CPC .......... *G06F 3/0659* (2013.01); *G06F 3/0604* (2013.01); *G06F 3/0673* (2013.01);
(Continued)

(58) Field of Classification Search
CPC .............. G11C 11/221; G11C 11/2257; G11C 11/2273; G11C 11/2275
See application file for complete search history.

(56) References Cited

U.S. PATENT DOCUMENTS 4,493,026 A 1/1985 Olnowich
5,226,009 A 7/1993 Arimoto
(Continued)

FOREIGN PATENT DOCUMENTS

CN 1212430 A 3/1999
CN 1480950 A 3/2004
(Continued)

OTHER PUBLICATIONS

Aboughazaleh, N. et al., "Near-memory Caching for Improved Energy Consumption", Proceedings of the 2005 International Conference on Computer Design (ICCD'05), Oct. 2, 2005, pp. 105-110.
(Continued)

*Primary Examiner* — Han Yang
(74) *Attorney, Agent, or Firm* — Holland & Hart LLP

(57) ABSTRACT

Methods, systems, and devices for signal development caching in a memory device are described. In one example, a memory device in accordance with the described techniques may include a memory array, a sense amplifier array, and a signal development cache configured to store signals (e.g., cache signals, signal states) associated with logic states (e.g., memory states) that may be stored at the memory array (e.g., according to various read or write operations). In various examples, accessing the memory device may include accessing information from the signal development cache, or the memory array, or both, based on various mappings or operations of the memory device.

20 Claims, 14 Drawing Sheets

Related U.S. Application Data

(60) Provisional application No. 62/783,388, filed on Dec. 21, 2018.

(51) Int. Cl.

| | | |
|---|---|---|
| *G06F 9/54* | (2006.01) | |
| *G06F 12/02* | (2006.01) | |
| *G06F 12/0802* | (2016.01) | |
| *G06F 12/0873* | (2016.01) | |
| *G06F 12/0875* | (2016.01) | |
| *G06F 12/0893* | (2016.01) | |
| *G06F 12/1045* | (2016.01) | |
| *G11C 7/08* | (2006.01) | |
| *G11C 7/10* | (2006.01) | |
| *G11C 8/08* | (2006.01) | |
| *G11C 11/406* | (2006.01) | |
| *G11C 11/4074* | (2006.01) | |
| *G11C 11/408* | (2006.01) | |
| *G11C 11/4091* | (2006.01) | |
| *G11C 11/4096* | (2006.01) | |

(52) U.S. Cl.
CPC .......... *G06F 9/546* (2013.01); *G06F 12/0246* (2013.01); *G06F 12/0802* (2013.01); *G06F 12/0873* (2013.01); *G06F 12/0875* (2013.01); *G06F 12/0893* (2013.01); *G06F 12/1045* (2013.01); *G11C 7/08* (2013.01); *G11C 7/1012* (2013.01); *G11C 7/1063* (2013.01); *G11C 7/109* (2013.01); *G11C 8/08* (2013.01); *G11C 11/221* (2013.01); *G11C 11/2257* (2013.01); *G11C 11/2259* (2013.01); *G11C 11/2273* (2013.01); *G11C 11/2275* (2013.01); *G11C 11/2297* (2013.01); *G11C 11/406* (2013.01); *G11C 11/40603* (2013.01); *G11C 11/4074* (2013.01); *G11C 11/4085* (2013.01); *G11C 11/4091* (2013.01); *G11C 11/4096* (2013.01); *G06F 2212/60* (2013.01); *G06F 2212/608* (2013.01); *G06F 2212/72* (2013.01); *G06F 2212/7201* (2013.01)

(56) References Cited

U.S. PATENT DOCUMENTS

| | | |
|---|---|---|
| 5,341,501 A | 8/1994 | Keeley et al. |
| 5,377,154 A | 12/1994 | Takasugi |
| 5,596,521 A | 1/1997 | Tanaka et al. |
| 5,787,267 A | 7/1998 | Leung et al. |
| 5,818,787 A | 10/1998 | Miyamoto et al. |
| 5,875,452 A | 2/1999 | Katayama et al. |
| 5,909,407 A | 6/1999 | Yamamoto et al. |
| 6,205,076 B1 | 3/2001 | Wakayama et al. |
| 6,320,778 B1 | 11/2001 | Tanaka et al. |
| 7,009,880 B1 | 3/2006 | Liu |
| 7,085,190 B2 | 8/2006 | Worley et al. |
| 7,216,272 B2 | 5/2007 | Loh |
| 7,286,425 B2 | 10/2007 | Barth, Jr. |
| 8,090,999 B2 | 1/2012 | Roohparvar |
| 8,873,329 B1 | 10/2014 | Zheng et al. |
| 9,313,435 B2 | 4/2016 | Nitta et al. |
| 9,443,602 B2 | 9/2016 | Sakaue et al. |
| 9,509,317 B2 | 11/2016 | Masleid et al. |
| 9,535,844 B1 | 1/2017 | Cooney et al. |
| 9,761,312 B1 | 9/2017 | Kajigaya |
| 10,153,020 B1 | 12/2018 | Vimercati |
| 10,153,022 B1 | 12/2018 | Di Vincenzo |
| 10,395,710 B1 | 8/2019 | Abedifard et al. |
| 11,372,595 B2 | 6/2022 | Yudanov et al. |
| 2001/0026465 A1 | 10/2001 | Choi et al. |
| 2001/0050873 A1 | 12/2001 | Tanaka et al. |
| 2002/0067650 A1 | 6/2002 | Tanaka et al. |
| 2002/0154536 A1 | 10/2002 | Perner |
| 2002/0161967 A1 | 10/2002 | Kirihata et al. |
| 2002/0181307 A1 | 12/2002 | Fifield et al. |
| 2002/0186591 A1 | 12/2002 | Lee et al. |
| 2003/0021159 A1 | 1/2003 | Issa |
| 2003/0107923 A1 | 6/2003 | Roohparvar |
| 2004/0240288 A1 | 12/2004 | Takahashi |
| 2005/0030817 A1 | 2/2005 | Luk et al. |
| 2006/0056264 A1 | 3/2006 | Worley et al. |
| 2006/0087894 A1 | 4/2006 | Kim |
| 2006/0214086 A1 | 9/2006 | Fukushima |
| 2006/0221704 A1 | 10/2006 | Li et al. |
| 2007/0061507 A1 | 3/2007 | Iwanari et al. |
| 2007/0097768 A1 | 5/2007 | Barth |
| 2007/0168836 A1 | 7/2007 | Dempsey et al. |
| 2007/0250667 A1 | 10/2007 | Dement et al. |
| 2008/0037356 A1 | 2/2008 | Kajigaya |
| 2008/0080266 A1 | 4/2008 | Khellah et al. |
| 2008/0239811 A1 | 10/2008 | Tanaka |
| 2009/0129173 A1 | 5/2009 | Kajiyama et al. |
| 2009/0268537 A1 | 10/2009 | Kajigaya |
| 2010/0128515 A1 | 5/2010 | Fukushi |
| 2011/0044095 A1 | 2/2011 | Sato et al. |
| 2011/0119451 A1 | 5/2011 | Fuller et al. |
| 2011/0205776 A1 | 8/2011 | Murata |
| 2011/0208901 A1 | 8/2011 | Kim et al. |
| 2011/0246729 A1 | 10/2011 | Smith |
| 2011/0280086 A1 | 11/2011 | Choi et al. |
| 2012/0082174 A1 | 4/2012 | Chen et al. |
| 2012/0099390 A1* | 4/2012 | Cho ................... G11C 7/1048 365/207 |
| 2012/0127805 A1 | 5/2012 | Dreesen et al. |
| 2012/0151232 A1 | 6/2012 | Fish, III |
| 2012/0159076 A1 | 6/2012 | Tanpure et al. |
| 2012/0243304 A1 | 9/2012 | Hoya |
| 2012/0300566 A1 | 11/2012 | Mueller et al. |
| 2013/0145097 A1 | 6/2013 | Ingle et al. |
| 2013/0242684 A1 | 9/2013 | Takizawa |
| 2014/0177343 A1 | 6/2014 | Chan et al. |
| 2014/0181424 A1 | 6/2014 | Park |
| 2014/0325129 A1 | 10/2014 | Ahlquist |
| 2015/0130971 A1 | 5/2015 | Oike et al. |
| 2015/0229859 A1 | 8/2015 | Guidash et al. |
| 2016/0155481 A1 | 6/2016 | Park |
| 2016/0179685 A1 | 6/2016 | Byun |
| 2016/0239060 A1 | 8/2016 | Koob et al. |
| 2016/0283392 A1 | 9/2016 | Greenfield et al. |
| 2016/0336055 A1 | 11/2016 | Kato |
| 2016/0350230 A1 | 12/2016 | Murphy |
| 2017/0133096 A1 | 5/2017 | Yoo et al. |
| 2017/0153826 A1 | 6/2017 | Cho et al. |
| 2017/0263304 A1 | 9/2017 | Vimercati |
| 2017/0270051 A1 | 9/2017 | Chen et al. |
| 2017/0271019 A1 | 9/2017 | Park et al. |
| 2017/0277637 A1 | 9/2017 | Willcock et al. |
| 2017/0287541 A1 | 10/2017 | Vimercati |
| 2017/0309330 A1 | 10/2017 | Pyo |
| 2017/0315737 A1 | 11/2017 | Kajigaya |
| 2017/0337149 A1 | 11/2017 | Onuki et al. |
| 2017/0365358 A1 | 12/2017 | Ha |
| 2018/0081774 A1 | 3/2018 | Kawamura et al. |
| 2018/0096718 A1* | 4/2018 | Kim .................. G11C 5/145 |
| 2018/0108393 A1 | 4/2018 | Vimercati |
| 2018/0130506 A1 | 5/2018 | Kang et al. |
| 2018/0150398 A1 | 5/2018 | Lu |
| 2018/0181344 A1 | 6/2018 | Tomishima et al. |
| 2018/0247687 A1 | 8/2018 | Vimercati |
| 2018/0301180 A1 | 10/2018 | Sano |
| 2018/0308538 A1 | 10/2018 | Vo et al. |
| 2018/0314635 A1 | 11/2018 | Alam |
| 2018/0349292 A1 | 12/2018 | Tal et al. |
| 2018/0358078 A1 | 12/2018 | Vimercati |
| 2019/0103145 A1 | 4/2019 | Tseng et al. |
| 2020/0042249 A1* | 2/2020 | Kang .................. G06F 12/0897 |
| 2020/0073812 A1 | 3/2020 | Willcock et al. |
| 2020/0135261 A1 | 4/2020 | Haraguchi et al. |
| 2021/0142845 A1 | 5/2021 | Murphy |

(56) References Cited

U.S. PATENT DOCUMENTS

FOREIGN PATENT DOCUMENTS

| | | |
|---|---|---|
| CN | 1698132 A | 11/2005 |
| CN | 101063957 A | 10/2007 |
| CN | 101171641 A | 4/2008 |
| CN | 101379566 A | 3/2009 |
| CN | 101558390 A | 10/2009 |
| CN | 101743597 A | 6/2010 |
| CN | 102656639 A | 9/2012 |
| CN | 102800349 A | 11/2012 |
| CN | 103221929 A | 7/2013 |
| CN | 104078077 A | 10/2014 |
| CN | 105739914 A | 7/2016 |
| CN | 106463172 A | 2/2017 |
| CN | 106683692 A | 5/2017 |
| CN | 107240410 A | 10/2017 |
| CN | 107408405 A | 11/2017 |
| CN | 107430550 A | 12/2017 |
| CN | 107683505 A | 2/2018 |
| CN | 107924364 A | 4/2018 |
| CN | 108121671 A | 6/2018 |
| CN | 108701077 A | 10/2018 |
| CN | 108780656 A | 11/2018 |
| CN | 108885595 A | 11/2018 |
| CN | 108885891 A | 11/2018 |
| EP | 0662663 A2 | 7/1995 |
| EP | 0717412 B1 | 9/2002 |
| JP | 63-197099 A | 8/1988 |
| JP | 01-166850 A | 6/1989 |
| JP | 03-015958 A | 1/1991 |
| JP | 05-217374 A | 8/1993 |
| JP | 07-211057 A | 8/1995 |
| JP | 07-211061 A | 8/1995 |
| JP | 09-180437 A | 7/1997 |
| JP | 11-066850 A | 3/1999 |
| JP | 11-073763 A | 3/1999 |
| JP | 11-339466 A | 12/1999 |
| JP | 2000-020396 A | 1/2000 |
| JP | 2001-005725 A | 1/2001 |
| JP | 2001-006379 A | 1/2001 |
| JP | 2001-273193 A | 10/2001 |
| JP | 2002-334580 A | 11/2002 |
| JP | 2003-007049 A | 1/2003 |
| JP | 2004-348916 A | 12/2004 |
| JP | 2006-236304 A | 9/2006 |
| JP | 2007-048286 A | 2/2007 |
| JP | 2007-080325 A | 3/2007 |
| JP | 2012-198972 A | 10/2012 |
| JP | 2012-203938 A | 10/2012 |
| JP | 2013-196717 A | 9/2013 |
| JP | 2017-212022 A | 11/2017 |
| JP | 2018-503903 A | 2/2018 |
| JP | 2018-181394 A | 11/2018 |
| KR | 10-2007-0066185 A | 6/2007 |
| KR | 10-2010-0113389 A | 10/2010 |
| TW | 200426833 A | 12/2004 |
| TW | 201735038 A | 10/2017 |
| TW | 201805945 A | 2/2018 |
| TW | 201824280 A | 7/2018 |
| TW | I630621 B | 7/2018 |
| WO | 2017/136203 A1 | 8/2017 |
| WO | 2017/192759 A1 | 11/2017 |
| WO | 2018/125385 A1 | 7/2018 |
| WO | 2018/163252 A1 | 9/2018 |

OTHER PUBLICATIONS

China National Intellectual Property Administration, "First Office Action," issued in connection with Chinese Application No. 201980084160.X, dated Jan. 11, 2022 (13 pages).

European Patent Office, "Supplementary European search report and Search Opinion", issued in connection with European Patent Application No. 19898746.3 dated Sep. 9, 2022 (9 pages).

European Patent Office, "Supplementary European search report and Search Opinion", issued in connection with European Patent Application No. 19899500.3 dated Sep. 12, 2022 (9 pages).

European Patent Office, "Supplementary European search report and Search Opinion", issued in connection with European Patent Application No. 19900061.3 dated Aug. 30, 2022 (9 pages).

European Patent Office, "Supplementary European search report and Search Opinion", issued in connection with European Patent Application No. 19900287.4 dated Sep. 14, 2022 (11 pages).

European Patent Office, "Supplementary European search report and Search Opinion", issued in connection with European Patent Application No. 19900288.2 dated Sep. 15, 2022 (10 pages).

European Patent Office, "Supplementary European search report and Search Opinion", issued in connection with European Patent Application No. 19900916.8 dated Sep. 16, 2022 (10 pages).

Intellectual Property Office, "Office Action," issued in connection with ROC (Taiwan) Patent Application No. 108144214, dated Oct. 26, 2020 (6 pages).

International Search Report and Written Opinion received for PCT Patent Application No. PCT/US19/64597, mailed on Mar. 20, 2020, 9 pages.

International Search Report and Written Opinion received for PCT Patent Application No. PCT/US19/67829, mailed on Apr. 28, 2020, 13 pages.

International Search Report and Written Opinion received for PCT Patent Application No. PCT/US19/67832, mailed on Apr. 28, 2020, 9 pages.

International Search Report and Written Opinion received for PCT Patent Application No. PCT/US19/67834, mailed on Apr. 28, 2020, 10 pages.

International Search Report and Written Opinion received for PCT Patent Application No. PCT/US19/67838, mailed on Apr. 28, 2020, 10 pages.

International Search Report and Written Opinion received for PCT Patent Application No. PCT/US19/67840, mailed on Apr. 28, 2020, 7 pages.

International Search Report and Written Opinion received for PCT Patent Application No. PCT/US19/67844, mailed on Apr. 8, 2020, 8 pages.

Japan Patent Office, "Notice of Rejection Ground," issued in connection with Japanese Patent Application No. 2021-535559, dated Feb. 1, 2022 (10 pages).

Japan Patent Office, "Decision to Grant a Patent", issued in connection with Japan Patent Application No. 2021-535529 dated Jun. 14, 2022 (5 pages).

Japan Patent Office, "Notice of Rejection Ground", issued in connection with Japan Patent Application No. 2021-533238 dated Sep. 6, 2022 (16 pages).

Japan Patent Office, "Notice of Rejection Ground", issued in connection with Japan Patent Application No. 2021-533432 dated Aug. 16, 2022 (29 pages).

Japan Patent Office, "Notice of Rejection Ground", issued in connection with Japan Patent Application No. 2021-535534 dated Jul. 5, 2022 (19 pages).

Japan Patent Office, "Notice of Rejection Ground", issued in connection with Japan Patent Application No. 2021-535536 dated Jul. 5, 2022 (18 pages).

Japan Patent Office, "Office Action", issued in connection with Japan Patent Application No. 2021-535540 dated Jun. 21, 2022 (17 pages).

Office Action received for Chinese Patent Application No. 201980084160.X, mailed on Jan. 11, 2022, 20 pages (8 pages of English Translation and 12 pages of Original Document).

Taiwan Intellectual Property Office, "Office Action," issued in connection with ROC (Taiwan) Patent Application No. 108144214, dated Sep. 28, 2021 (18 pages with translation).

Cao, Z., et al., "Fast bipolar 1024-bit random access memory (RAM) for high performance storage system", Computer research and development, Issue 01, Jan. 15, 1978, 7 pages.

Chinese Patent Office, "Office Action," issued in connection with Chinese Patent Application No. 201980082612.0 dated Oct. 9, 2023 (15 pages total; 7 pages Original & 8 pages machine translation).

(56) References Cited

OTHER PUBLICATIONS

Chinese Patent Office, "Office Action," issued in connection with Chinese Patent Application No. 201980082657.8 dated Nov. 1, 2023 (29 pages total; 10 pages Original & 19 pages machine translation).

Chinese Patent Office, "Office Action," issued in connection with Chinese Patent Application No. 201980084236.9 dated Sep. 4, 2023 (16 pages total; 8 pages Original & 8 pages machine translation).

Chinese Patent Office, "Office Action," issued in connection with Chinese Patent Application No. 201980084464.6 dated Aug. 1, 2023 (32 pages) (12 pages of English Translation and 20 pages of Original Document).

Japan Patent Office, "Office Action," issued in connection with Japan Patent Application No. 2022-168730 dated Sep. 5, 2023 (13 pages) (7 pages of English Translation and 6 pages of Original Document).

John Kirkwood, "Sybase SQL Server 11", Hope, Oct. 31, 1998, pp. 169-270.

Xin, X., "Design and Application: CAM Based on FPGA", Journal of National University of Defense Technology, vol. 23, No. 5, 2001, 5 pages. (English Abstract attached).

Zhou KE, Research on Storage Optimization Based on Solid State Drive's Characteristics, Huazhong University of Science & Technology, Feb. 2013, 116 pages. (English Abstract attached).

Chinese patent office, "CN Notice of Allowance, including Search Report," issued in connection with China Patent Application No. 201980084464.6 dated Jul. 11, 2024 (8 pages total; 4 pages Original & 4 pages machine translation).

Chinese patent office, "China Office Action," issued in connection with China Patent Application No. 201980084464.6 dated Feb. 23, 2024 (33 pages) (13 pages of English Translation and 20 pages of Original Document) . . . .

Chinese patent office, "CN Notice of Allowance," issued in connection with China Patent Application No. 201980084236.9 dated Feb. 4, 2024 (8 pages total; 4 pages Original & 4 pages translation).

Chinese patent office, "China Office Action," issued in connection with China Patent Application No. 201980084212.3 dated Oct. 31, 2024 (19 pages) (9 pages of English Translation and 10 pages of Original Document).

Chinese patent office, "China Office Action," issued in connection with China Patent Application No. 201980084577.6 dated Oct. 31, 2024 (11 pages) (4 pages of English Translation and 7 pages of Original Document).

Chinese patent office, "China Office Action," issued in connection with China Patent Application No. 202410511570.0 dated Feb. 27, 2025 (17 pages) (9 pages of English Translation and 8 pages of Original Document).

* cited by examiner

SIGNAL DEVELOPMENT CACHING IN A MEMORY DEVICE

CROSS REFERENCE

The present Application for Patent is a divisional of U.S. patent application Ser. No. 17/414,296 by Yudanov et al., entitled "SIGNAL DEVELOPMENT CACHING IN A MEMORY DEVICE," filed Jun. 15, 2021, which is a 371 national phase filing of International Patent Application No. PCT/US19/67829 by Yudanov et al., entitled "SIGNAL DEVELOPMENT CACHING IN A MEMORY DEVICE," filed Dec. 20, 2019, and claims the benefit of U.S. Provisional Patent Application No. 62/783,388 by Yudanov et al., entitled "MULTIPLEXED SIGNAL DEVELOPMENT IN A MEMORY DEVICE" and filed Dec. 21, 2018, each of which is assigned to the assignee hereof, and each of which is expressly incorporated by reference herein.

BACKGROUND

The following relates generally to memory systems and more specifically to signal development caching in a memory device.

Memory devices are widely used to store information in various electronic devices such as computers, wireless communication devices, cameras, digital displays, and the like. Information is stored by programing different states of a memory device. For example, binary memory devices have two logic states, often denoted by a logic "1" or a logic "0". In other memory devices, more than two logic states may be stored. To access the stored information, a component of the electronic device may read, or sense, the stored logic state in the memory device. To store information, a component of the electronic device may write, or program, the logic state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
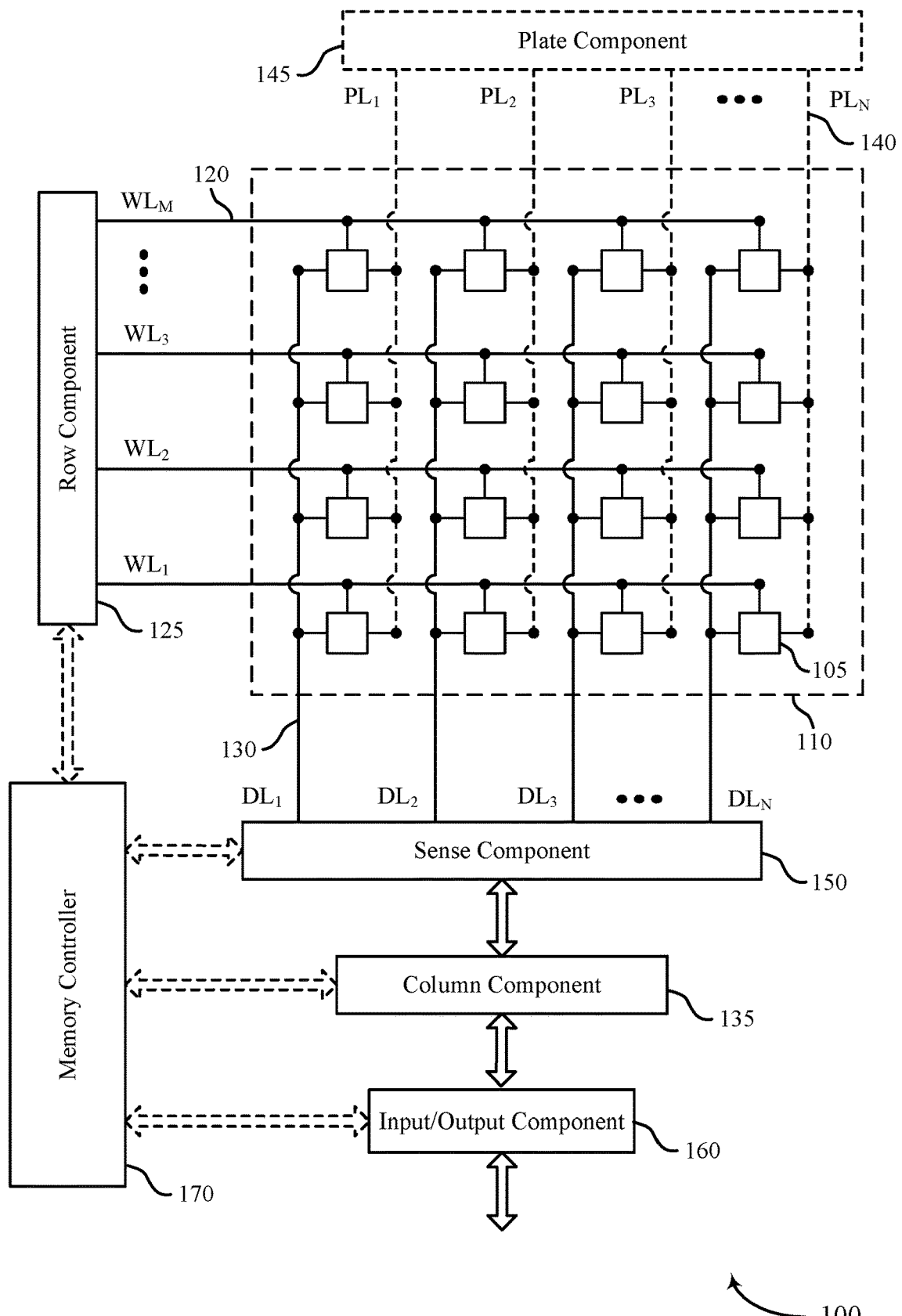
FIG. 1 illustrates an example memory device that supports signal development caching in accordance with examples as disclosed herein.

Different latencies associated with different components used in a memory access operation, or different latencies otherwise associated with portions of a memory access operation, may cause delays in performing the memory access operation. For example, when a latency associated with developing a signal based on accessing a memory cell (e.g., an operation that includes coupling a memory cell with a signal development component) is longer in duration than a latency associated with generating an output signal at a sense amplifier (e.g., a sensing or latching operation at the sense amplifier), a memory device may be able to generate output signals more quickly than it can perform underlying signal development operations upon which the output signals are based. For a memory device that has a single signal development component for each sense amplifier (e.g., a 1:1 mapping of signal development components and sense amplifiers), the throughput of the memory device may therefore be limited by the latency or cycle duration associated with the signal development component or signal development operations, which may affect latency-sensitive applications.

In accordance with examples as disclosed herein, a memory device may include a signal development cache having a set of cache elements (e.g., signal storage elements) that may be selectively coupled with or decoupled from sense amplifiers of the memory device. For example, an array of sense amplifiers may be coupled with a selection component (e.g., a multiplexer (MUX), a transistor network, a transistor array, a switching network, a switching array), and the selection component may be coupled with a set of signal development cache elements that may each be associated with one or more memory cells of the memory device. In some examples, cell access signals (e.g., cell read signals, cell write signals) may be developed (e.g., based at least in part on a coupling with or other accessing of a respective memory cell) at each of the signal development cache elements independently from others of the signal development cache elements. As used herein, a "set" may include one or more elements (e.g., one element, two elements, three elements, and so on).

In some examples (e.g., in a read operation), signal development cache elements may each be coupled with a respective memory cell or access line during overlapping time intervals, such that multiple cell access signals (e.g., multiple cell read signals associated with the respective memory cell or access line of each of the respective signal development components) may be generated during the overlapping time intervals. A signal development cache element may subsequently be coupled with the sense amplifier via the selection component to generate a sense or latch signal (e.g., an output signal of the sense amplifier, based on a respective cell access signal), which may be associated with a particular logic state that was stored by a respective memory cell (e.g., associated with the respective cell access signal). In examples where cell access signals have been developed at multiple signal development cache elements, the multiple signal development cache elements may be coupled with the sense amplifier in a sequential manner to generate sense or latch signals in a sequential manner.

In accordance with examples as disclosed herein, signal development caching can leverage storage elements (e.g., cache elements) different than storage elements of a memory array (e.g., memory elements) to support various pipelining of information, including pipelining associated with read operations, write operations, transfer operations, and others. In some examples, storage elements in a signal development cache may leverage a different storage technology than memory cells of a memory array, or may store signal states (e.g., cache states) differently than an associated memory array stores logic states.

Features of the disclosure introduced above are further described with reference to FIGS. 1 through 3 in the context of memory arrays and memory circuits that support signal development caching in a memory device. Specific examples are then described with reference to FIGS. 4A through 5B, which illustrate particular read operations and write operations that support signal development caching in a memory device. Further examples of circuits, components, and arrangements that may support the described operations are described with reference to FIGS. 6 through 9. These and other features of the disclosure are further described with respect to FIGS. 10 through 12, which illustrate a block diagrams and flowcharts that support signal development caching in a memory device.

FIG. 1 illustrates an example memory device 100 that supports signal development caching in accordance with examples as disclosed herein. The memory device 100 may also be referred to as an electronic memory apparatus. The memory device 100 may include memory cells 105 that are programmable to store different states such as memory states, which may be referred to herein as logic states. In some cases, a memory cell 105 may be programmable to store two logic states, denoted a logic 0 and a logic 1. In some cases, a memory cell 105 may be programmable to store more than two logic states. Additionally or alternatively, a memory cell 105 may be programmable to store a memory state based on an analog or stochastic operation (e.g., related to a neural network), where the memory state correspond to information other than a logic 0 or a logic 1. In some examples, the memory cells 105 may include a capacitive memory element, a ferroelectric memory element, a material memory element, a resistive element, a self-selecting memory element, a thresholding memory element, or any combination thereof.

The set of memory cells 105 may be part of a memory section 110 of the memory device 100 (e.g., including an array of memory cells 105), where in some examples a memory section 110 may refer to a contiguous tile of memory cells 105 (e.g., a contiguous set of elements of a semiconductor chip). In some examples, a memory section 110 may refer to the smallest set of memory cells 105 that may be biased in an access operation, or a smallest set of memory cells 105 that share a common node (e.g., a common plate line, a set of plate lines that are biased to a common voltage). Although a single memory section 110 of the memory device 100 is shown, various examples of a memory device in accordance with examples as disclosed herein may have a set of memory sections 110. In one illustrative example, a memory device 100, or a subsection thereof (e.g., a core of a multi-core memory device 100, a chip of a multi-chip memory device) may include 32 "banks" and each bank may include 32 sections. Thus, a memory device 100, or subsection thereof, according to the illustrative example may include 1,024 memory sections 110.

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged and negatively charged capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating (e.g., non-conductive) layer between terminals of the capacitor. Different levels of polarization of a ferroelectric capacitor may represent different logic states (e.g., supporting two or more logic states in a respective memory cell 105). In some examples, ferroelectric materials have non-linear polarization properties.

In some examples, a memory cell 105 may include a material portion, which may be referred to as a memory element, a memory storage element, a self-selecting memory element, or a self-selecting memory storage element. The material portion may have a variable and configurable electrical resistance or other characteristic that is representative of different logic states. For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of relatively large crystal grains that may be substantially crystalline) may have a relatively low electrical resistance, and may alternatively be referred to as a "SET" logic state. A more-amorphous state of the material (e.g., an entirely amorphous state, some distribution of relatively small crystal grains that may be substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage. In some examples, electrical current may flow through a memory element in the more-amorphous state when a voltage greater than the threshold voltage is applied across the memory element. In some examples, electrical current may not flow through a memory element in the more-amorphous state when a voltage less than the threshold voltage is applied across the memory element. In some cases, a memory element in a more-crystalline state may not be associated with a threshold voltage (e.g., may be associated with a threshold voltage of zero). In some examples, electrical current may flow through a memory element in the more-crystalline state in response to a non-zero voltage across the memory element.

In some cases, a material in both the more-amorphous state and the more-crystalline state may be associated with threshold voltages. For example, self-selecting or thresholding memory may be based on differences in a threshold voltage of a memory cell between different programmed states (e.g., by way of different compositional distributions). The logic state of a memory cell 105 having such a memory element may be set by biasing or heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. In various examples, such arrays may be divided into a set of memory sections 110, where each memory section 110 may be arranged within a deck or level, distributed across multiple decks or levels, or any combination thereof. Such arrangements may increase the number of memory cells 105 that may be placed or created on a single die or substrate as compared with 2D arrays, which in turn may reduce production costs or increase the performance of a memory device 100, or both. The decks or levels may be separated by an electrically insulating material. Each deck or level may be aligned or positioned so that memory cells 105 may be approximately aligned with one another across each deck, forming a stack of memory cells 105.

In the example of memory device 100, each row of memory cells 105 of the memory section 110 may be coupled with one of a set of first access lines 120 (e.g., a word line (WL), such as one of $WL_1$ through $WL_M$), and each column of memory cells 105 may be coupled with one of a set of second access lines 130 (e.g., a digit line (DL), such as one of $DL_1$ through $DL_N$). In some examples, a row of memory cells 105 of a different memory section 110 (not shown) may be coupled with one of a different plurality of first access lines 120 (e.g., a word line different from $WL_1$ through $WL_M$), and a column of memory cells 105 of the different memory section 110 may be coupled with one of a different plurality of second access lines 130 (e.g., a digit line different from $DL_1$ through $DL_N$). In some cases, first access lines 120 and second access lines 130 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 120 and an access line 130. This intersection, or an indication of this intersection, may be referred to as an address of a memory cell 105. A target or selected memory cell 105 may be a memory cell 105 located at the intersection of an energized or otherwise selected access line 120 and an energized or otherwise selected access line 130. In other words, an access line 120 and an access line 130 may be energized or otherwise selected to access (e.g., read, write, rewrite, refresh) a memory cell 105 at their intersection. Other memory cells 105 that are in electronic communication with (e.g., connected to) the same access line 120 or 130 may be referred to as untargeted or non-selected memory cells 105.

In some architectures, the logic storing component (e.g., a capacitive memory element, a ferroelectric memory element, a resistive memory element, other memory element) of a memory cell 105 may be electrically isolated from a second access line 130 by a cell selection component, which, in some examples, may be referred to as a switching component or a selector device. A first access line 120 may be coupled with the cell selection component (e.g., via a control node or terminal of the cell selection component), and may control the cell selection component of or associated with the memory cell 105. For example, the cell selection component may be a transistor and the first access line 120 may be coupled with a gate of the transistor (e.g., where a gate node of the transistor may be a control node of the transistor). Activating the first access line 120 of a memory cell 105 may result in an electrical connection or closed circuit between the logic storing component of the memory cell 105 and its corresponding second access line 130. The second access line 130 may then be accessed to read or write the memory cell 105.

In some examples, memory cells 105 of the memory section 110 may also be coupled with one of a plurality of third access lines 140 (e.g., a plate line (PL), such as one of $PL_1$ through $PL_N$). Although illustrated as separate lines, in some examples, the plurality of third access lines 140 may represent or be otherwise functionally equivalent with a common plate line, a common plate, or other common node of the memory section 110 (e.g., a node common to each of the memory cells 105 in the memory section 110), or other common node of the memory device 100. In some examples, the plurality of third access lines 140 may couple memory cells 105 with one or more voltage sources for various sensing and/or writing operations including those described herein. For example, when a memory cell 105 employs a capacitor for storing a logic state, a second access line 130 may provide access to a first terminal or a first plate of the capacitor, and a third access line 140 may provide access to a second terminal or a second plate of the capacitor (e.g., a terminal associated with an opposite plate of the capacitor as opposed to the first terminal of the capacitor, a terminal otherwise on the opposite side of a capacitance from the first terminal of the capacitor). In some examples, memory cells 105 of a different memory section 110 (not shown) may be coupled with one of a different plurality of third access lines 140 (e.g., a set of plate lines different from $PL_1$ through $PL_N$, a different common plate line, a different common plate, a different common node), which may be electrically isolated from the illustrated third access line 140 (e.g., plate lines $PL_1$ through $PL_N$).

The plurality of third access lines 140 may be coupled with a plate component 145, which may control various operations such as activating one or more of the plurality of third access lines 140, or selectively coupling one or more of the plurality of third access lines 140 with a voltage source or other circuit element. Although the plurality of third access lines 140 of the memory device 100 are shown as substantially parallel with the plurality of second access lines 130, in other examples, a plurality of third access lines 140 may be substantially parallel with the plurality of first access lines 120, or in any other configuration.

Although the access lines described with reference to FIG. 1 are shown as direct lines between memory cells 105 and coupled components, access lines may be associated with other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 120, or with (e.g., between) a memory cell 105 and an access line 130. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

Access operations such as reading, writing, rewriting, and refreshing may be performed on a memory cell 105 by activating or selecting a first access line 120, a second access line 130, and/or a third access line 140 coupled with the memory cell 105, which may include applying a voltage, a charge, or a current to the respective access line. Access lines 120, 130, and 140 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal (e.g., a cell access signal, a cell read signal) may be used to determine the logic state stored by the memory cell 105. For example, a memory cell 105 with a capacitive memory element storing a logic state may be selected, and the resulting flow of charge via an access line and/or resulting voltage of an access line may be detected, converted, or amplified to determine the programmed logic state stored by the memory cell 105.

Accessing memory cells 105 may be controlled through a row component 125 (e.g., a row decoder), a column component 135 (e.g., a column decoder), or a plate component 145 (e.g., a plate driver), or a combination thereof. For example, a row component 125 may receive a row address from the memory controller 170 and select or activate the appropriate first access line 120 based on the received row address. Similarly, a column component 135 may receive a column address from the memory controller 170 and select or activate the appropriate second access line 130. Thus, in some examples, a memory cell 105 may be accessed by selecting or activating a first access line 120 and a second access line 130. In some examples, such access operations may be accompanied by a plate component 145 biasing one or more of the third access lines 140 (e.g., biasing one of the third access lines 140 of the memory section 110, biasing all of the third access lines 140 of the memory section, biasing a common plate line of the memory section 110 or the memory device 100, biasing a common node of the memory section 110 or the memory device 100), which may be referred to as "moving the plate" of memory cells 105, the memory section 110, or the memory device 100. In various examples, any one or more of the row component 125, the column component 135, or the plate component 145 may be referred to as, or otherwise include access line drivers or access line decoders.

In some examples, the memory controller 170 may control the operation (e.g., read operations, write operations, rewrite operations, refresh operations, discharge operations, dissipation operations, equalization operations) of memory cells 105 through the various components (e.g., row component 125, column component 135, plate component 145, sense component 150). In some cases, one or more of the row component 125, the column component 135, the plate component 145, and the sense component 150 may be co-located or otherwise included with the memory controller 170. In some examples, any one or more of a row component 125, a column component 135, or a plate component 145 may also be referred to as a memory controller or circuit for performing access operations of the memory device 100. In some examples, any one or more of a row component 125, a column component 135, or a plate component 145 may be described as controlling or performing operations for accessing a memory device 100, or controlling or performing operations for accessing the memory section 110 of the memory device 100.

The memory controller 170 may generate row and column address signals to activate a desired access line 120 and access line 130. The memory controller 170 may also generate or control various voltages or currents used during the operation of memory device 100. Although a single memory controller 170 is shown, a memory device 100 may have more than one memory controller 170 (e.g., a memory controller 170 for each of a set of memory sections 110 of a memory device 100, a memory controller 170 for each of a number of subsets of memory sections 110 of a memory device 100, a memory controller 170 for each of a set of chips of a multi-chip memory device 100, a memory controller 170 for each of a set of banks of a multi-bank memory device 100, a memory controller 170 for each core of a multi-core memory device 100, or any combination thereof), where different memory controllers 170 may perform the same functions and/or different functions.

Although the memory device 100 is illustrated as including a single row component 125, a single column component 135, and a single plate component 145, other examples of a memory device 100 may include different configurations to accommodate a memory section 110 or a set of memory sections 110. For example, in various memory devices 100 a row component 125 may be shared among a set of memory sections 110 (e.g., having subcomponents common to all of the set of memory sections 110, having subcomponents dedicated to respective ones of the set of memory sections 110), or a row component 125 may be dedicated to one memory section 110 of a set of memory sections 110. Likewise, in various memory devices 100, a column component 135 may be shared among a set of memory sections 110 (e.g., having subcomponents common to all of the set of memory sections 110, having subcomponents dedicated to respective ones of the set of memory sections 110), or a column component 135 may be dedicated to one memory section 110 of a set of memory sections 110. Additionally, in various memory devices 100, a plate component 145 may be shared among a set of memory sections 110 (e.g., having subcomponents common to all of the set of memory sections 110, having subcomponents dedicated to respective ones of the set of memory sections 110), or a plate component 145 may be dedicated to one memory section 110 of a set of memory sections 110.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105 (e.g., the memory cells 105 of a memory section 110), are set to a single logic state.

A memory cell 105 may be read (e.g., sensed) by a sense component 150 when the memory cell 105 is accessed (e.g., in cooperation with the memory controller 170) to determine a logic state stored by the memory cell 105. For example, the sense component 150 may be configured to sense a current or charge through the memory cell 105, or a voltage resulting from coupling the memory cell 105 with the sense component 150 or other intervening component (e.g., a signal development component between the memory cell 105 and the sense component 150), responsive to a read operation. The sense component 150 may provide an output signal indicative of (e.g., based at least in part on) the logic state stored by the memory cell 105 to one or more components (e.g., to the column component 135, the input/output component 160, the memory controller 170). In various memory devices 100, a sense component 150 may be shared among a set or bank of memory sections 110 (e.g., having subcomponents common to all of the set or bank of memory sections 110, having subcomponents dedicated to respective ones of the set or bank of memory sections 110), or a sense component 150 may be dedicated to one memory section 110 of a set or bank of memory sections 110.

In some examples, during or after accessing a memory cell 105, the logic storage portion of memory cell 105 may discharge, or otherwise permit electrical charge or current to flow via its corresponding access lines 120, 130, or 140. Such charge or current may result from biasing, or applying a voltage, to the memory cell 105 from one or more voltage sources or supplies (not shown) of the memory device 100, where such voltage sources or supplies may be part of a row component 125, a column component 135, a plate component 145, a sense component 150, a memory controller 170, or some other component (e.g., a biasing component). In some examples, a discharge of a memory cell 105 may cause a change in the voltage of the access line 130, which the sense component 150 may compare to a reference voltage to determine the stored state of the memory cell 105. In some examples, a voltage may be applied to a memory cell 105 (e.g., using the corresponding access line 120 and access line 130) and the presence or magnitude of a resulting current may depend on the applied voltage and the resistance state of a memory element of the memory cell 105, which the sense component 150 may use to determine the stored state of the memory cell 105.

In some examples, when a read signal (e.g., a read pulse, a read current, a read voltage) is applied across a memory cell 105 with a material memory element storing a first logic state (e.g., a SET state, associated with a more-crystalline atomic configuration), the memory cell 105 conducts current due to the read pulse exceeding a threshold voltage of the memory cell 105. In response to, or based at least in part on this, the sense component 150 may therefore detect a current through the memory cell 105 as part of determining the logic state stored by the memory cell 105. When a read pulse is applied to the memory cell 105 with the memory element storing a second logic state (e.g., a RESET state, associated with a more-amorphous atomic configuration), which may occur before or after the application of a read pulse across a memory cell 105 with a memory element storing a first logic state, the memory cell 105 may not conduct current due to the read pulse not exceeding the threshold voltage of the memory cell 105. The sense component 150 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 120, 130, or 140. In some examples, a logic state stored by a memory cell 105 may be determined based at least in part on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied during portions of a read operation). For example, if an applied read voltage does not result in current flow, one or more other read voltages may be applied (e.g., until a current is detected by sense component 150). Based at least in part on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 150. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 150 may include various switching components, selection components, multiplexers, transistors, amplifiers, capacitors, resistors, voltage sources, or other components to detect, convert, or amplify a difference in sensing signals (e.g., a difference between a read voltage and a reference voltage, a difference between a read current and a reference current, a difference between a read charge and a reference charge), which, in some examples, may be referred to as sensing or latching or generating a sense or latch signal. In some examples, a sense component 150 may include a collection of components (e.g., circuit elements, circuitry) that are repeated for each of a set of access lines 130 connected to the sense component 150. For example, a sense component 150 may include a separate sensing circuit or circuitry (e.g., a separate sense amplifier, a separate signal development component) for each of a set of access lines 130 coupled with the sense component 150, such that a logic state may be separately detected for a respective memory cell 105 coupled with a respective one of the set of access lines 130. In some examples, a reference signal source (e.g., a reference component) or generated reference signal may be shared between components of the memory device 100 (e.g., shared among one or more sense components 150, shared among separate sensing circuits of a sense component 150, shared among access lines 120, 130, or 140 of a memory section 110).

The sense component 150 may be included in a device that includes the memory device 100. For example, the sense component 150 may be included with other read and write circuitry, decoding circuitry, or register circuitry of the memory that may be coupled with or to the memory device 100. In some examples, the detected logic state of a memory cell 105 may be output through a column component 135 or an input/output component 160 as an output. In some examples, a sense component 150 may be part of a column component 135, a row component 125, or a memory controller 170. In some examples, a sense component 150 may be connected to or otherwise in electronic communication with a column component 135, a row component 125, or memory controller 170.

Although a single sense component 150 is shown, a memory device 100 (e.g., a memory section 110 of a memory device 100) may include more than one sense component 150. For example, a first sense component 150 may be coupled with a first subset of access lines 130 and a second sense component 150 may be coupled with a second subset of access lines 130 (e.g., different from the first subset of access lines 130). In some examples, such a division of sense components 150 may support parallel (e.g., simultaneous) operation of multiple sense components 150. In some examples, such a division of sense components 150 may support matching sense components 150 having different configurations or characteristics to particular subsets of the memory cells 105 of the memory device (e.g., supporting different types of memory cells 105, supporting different characteristics of subsets of memory cells 105, supporting different characteristics of subsets of access lines 130).

Additionally or alternatively, two or more sense components 150 may be coupled (e.g., selectively coupled) with a same set of access lines 130 (e.g., for component redundancy). In some examples, such a configuration may support maintaining functionality to overcome a failure or otherwise poor or degraded operation of one of the redundant sense components 150. In some examples, such a configuration may support the ability to select one of the redundant sense components 150 for particular operational characteristics (e.g., as related to power consumption characteristics, as related to access speed characteristics for a particular sensing operation, as related to operating memory cells 105 in a volatile mode or a non-volatile mode).

In some memory architectures, accessing a memory cell 105 may degrade or destroy a logic state stored by one or more memory cells 105 of the memory section 110, and rewrite or refresh operations may be performed to return the original logic state to the memory cells 105. In DRAM or FeRAM, for example, a capacitor of a memory cell 105 may be partially or completely discharged or depolarized during a sense operation, thereby corrupting the logic state that was stored in the memory cell 105. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 120, 130, or 140 may result in the discharge of all memory cells 105 coupled with the activated access line 120, 130, or 140. Thus, several or all memory cells 105 coupled with an access line 120, 130, or 140 associated with an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in some examples, refreshing the logic state of the memory cell 105 may or may not be needed in the absence or presence of other access operations. For example, the logic state stored by a memory cell 105 may be refreshed at periodic intervals by applying an appropriate write, refresh, or equalization pulse or bias to maintain the stored logic state. Refreshing the memory cell 105 may reduce or eliminate read disturb errors or logic state corruption due to a charge leakage or a change in an atomic configuration of a memory element over time.

A memory cell 105 may be set or written or refreshed by activating the relevant first access line 120, second access line 130, and/or third access line 140 (e.g., via a memory controller 170). In other words, a logic state may be stored in the memory cell 105 (e.g., via a cell access signal, via a cell write signal). Row component 125, column component 135, or plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of PCM, a memory element may be written by applying a current with a profile that causes (e.g., by way of heating and cooling) the memory element to form an atomic configuration associated with a desired logic state.

The sense component 150 may include multiple signal development components that may be selectively coupled with or decoupled from respective ones of a set of the sense amplifiers. For example, a sense amplifier of the sense component 150 may be coupled with a selection component of the sense component 150, and the selection component may be coupled with a set of signal development components of the sense component 150 that may be associated with one or more memory cells 105 or one or more access lines (e.g., one or more access lines 130) of the memory device 100. In some examples, cell access signals may be developed at each of the signal development components independently from others of the signal development components.

In some examples, signal development components of the sense component 150 may each be coupled with a respective memory cell during overlapping time intervals, such that multiple cell access signals (e.g., cell read signals, cell write signals, each associated with the respective memory cell of each of the respective signal development components) may be generated during the overlapping time intervals. In examples where cell access signals have been developed at multiple signal development components (e.g., in read operations of multiple memory cells 105, in a multi-cell read operation), the multiple signal development components may be coupled with the sense amplifier (e.g., in a sequential manner, in a step-wise manner) to generate sense or latch signals of the sense amplifier based at least in part on the cell access signals (e.g., in a sequential manner, in a step-wise manner). In examples where a sequence of sense or latch signals is associated with writing or re-writing a set of memory cells 105 (e.g., in write or refresh operations of multiple memory cells 105, in a multi-cell write or refresh operation), multiple signal development components may be coupled with the sense amplifier (e.g., in a sequential manner, in a step-wise manner) to generate multiple cell access signals based at least in part on the sense or latch signals of the sense amplifier (e.g., in a sequential manner, in a step-wise manner). In some examples, the multiplexed signal development components of the sense component 150 may compensate for parts of a signal development component or portions of an access operation that are associated with different latency, which may reduce the impact of access serialization.

Figure 2:
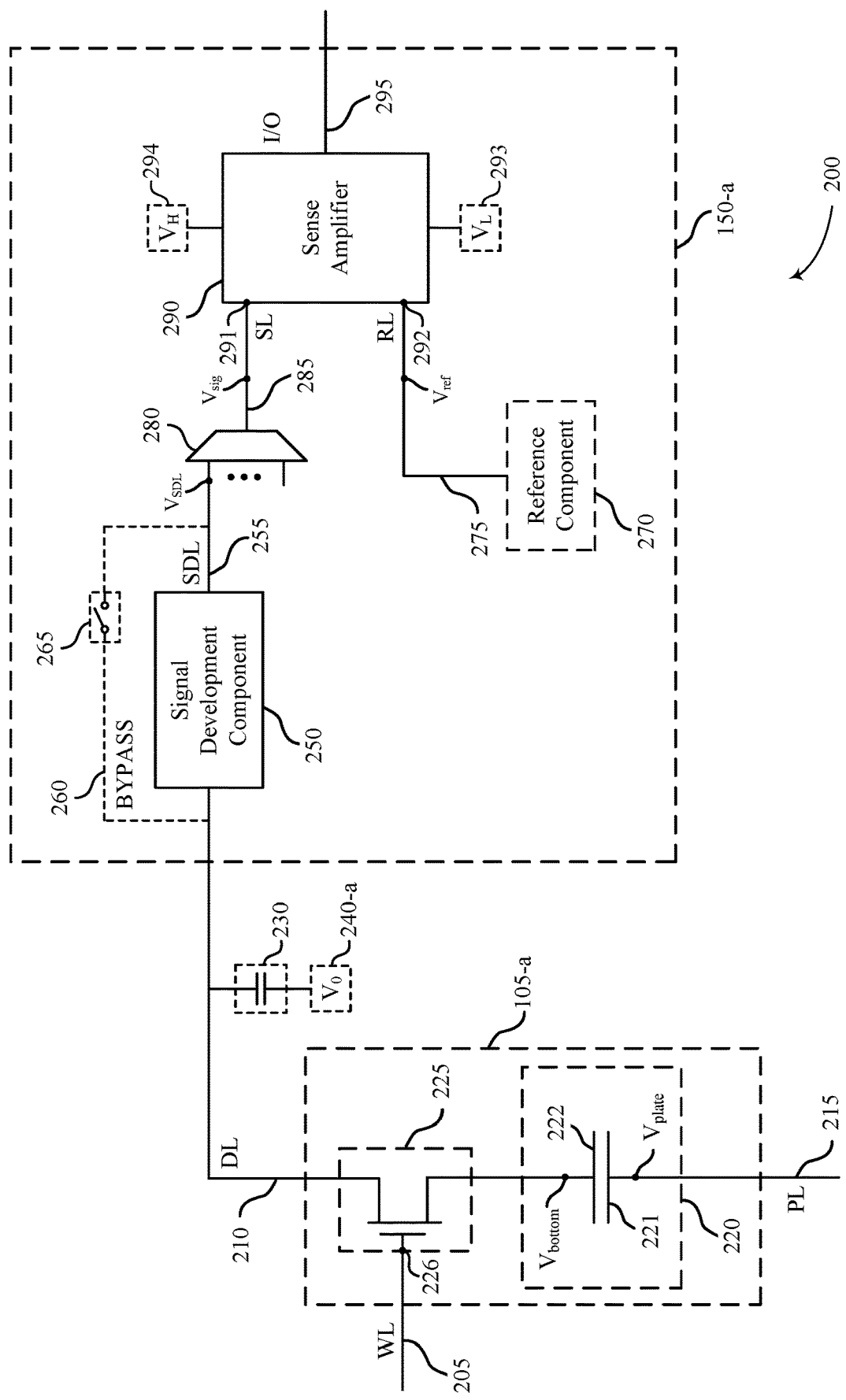
FIG. 2 illustrates an example circuit that supports signal development caching in a memory device in accordance with examples as disclosed herein.

FIG. 2 illustrates an example circuit 200 that supports signal development caching in a memory device in accordance with examples as disclosed herein. Circuit 200 may include a memory cell 105-a and a sense component 150-a, which may be examples of a memory cell 105 and a sense component 150 described with reference to FIG. 1. Circuit 200 may also include a word line 205, a digit line 210, and a plate line 215, which, in some examples, may correspond to a first access line 120, a second access line 130, and a third access line 140, respectively (e.g., of a memory section 110), as described with reference to FIG. 1. In some examples, the plate line 215 may be illustrative of a common plate line, a common plate, or another common node for the memory cell 105-a and another memory cell 105 (not shown) of a same memory section 110. Circuit 200 illustrates circuitry that may support the described techniques for signal development caching in a memory device.

The sense component 150-a may include a sense amplifier 290 (e.g., an amplifier component, an input/output amplifier, a "latch"), which may include a first node 291 and a second node 292. In various examples, the first node 291 and the second node 292, may be coupled with different access lines of a circuit (e.g., a signal line 285 and a reference line 275 of the circuit 200, respectively), or may be coupled with a common access line of a different circuit (not shown). In some examples, the first node 291 may be referred to as a signal node, and the second node 292 may be referred to as a reference node. The sense amplifier 290 may be associated with (e.g., coupled with, coupled to) one or more input/output (I/O) lines (e.g., I/O line 295), which may include an access line coupled with a column component 135 via input/output component 160 described with reference to FIG. 1. Although the sense amplifier 290 is illustrated as having a single I/O line 295, a sense amplifier in accordance with examples as disclosed herein may have more than one I/O line 295 (e.g., two I/O lines 295). In various examples, other configurations and nomenclature for access lines and/or reference lines are possible in accordance with examples as disclosed herein.

The memory cell 105-a may include a logic storage component (e.g., a memory element, a storage element, a memory storage element), such as a capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage, $V_{plate}$, and cell bottom 222 may be associated with a voltage, $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various logic states may be stored by charging, discharging, or polarizing the capacitor 220.

The capacitor 220 may be in electronic communication with the digit line 210, and the stored logic state of the capacitor 220 may be read or sensed by operating various elements represented in circuit 200. For example, the memory cell 105-a may also include a cell selection component 225 which, in some examples, may be referred to as a switching component or a selector device coupled with or between an access line (e.g., the digit line 210) and the capacitor 220. In some examples, a cell selection component 225 may be considered to be outside the illustrative boundary of the memory cell 105-a, and the cell selection component 225 may be referred to as a switching component or selector device coupled with or between an access line (e.g., the digit line 210) and the memory cell 105-a.

The capacitor 220 may be selectively coupled with the digit line 210 when the cell selection component 225 is activated (e.g., by way of an activating logical signal or voltage), and the capacitor 220 can be selectively isolated or decoupled from the digit line 210 when the cell selection component 225 is deactivated (e.g., by way of a deactivating logical signal or voltage). A logical signal or other selection signal or voltage may be applied to a control node 226 (e.g., a control node, a control terminal, a selection node, a selection terminal) of the cell selection component 225 (e.g., via the word line 205). In other words, the cell selection component 225 may be configured to selectively couple or decouple the capacitor 220 (e.g., a logic storage component) and the digit line 210 based on a logical signal or voltage applied via the word line 205 to the control node 226.

Activating the cell selection component 225 may be referred to as selecting the memory cell 105-a in some examples, and deactivating the cell selection component 225 may be referred to as deselecting the memory cell 105-a in some examples. In some examples, the cell selection component 225 is a transistor (e.g., an n-type transistor) and its operation may be controlled by applying an activation or selection voltage to the transistor gate (e.g., a control or selection node or terminal). The voltage for activating the transistor (e.g., the voltage between the transistor gate terminal and the transistor source terminal) may be a voltage greater than the threshold voltage magnitude of the transistor (e.g., a positive activation or selection voltage). The voltage for deactivating the transistor may be a voltage less than the threshold voltage magnitude of the transistor (e.g., a ground or negative deactivation or deselection voltage).

The word line 205 may be used (e.g., by a row component 125) to activate or deactivate the cell selection component 225. For example, a selection voltage applied to the word line 205 (e.g., a word line logical signal or a word line voltage) may be applied to the gate of a transistor of cell selection component 225, which may selectively connect or couple the capacitor 220 with the digit line 210 (e.g., providing a conductive path between the capacitor 220 and the digit line 210). A deselection or deactivation voltage applied to the word line 205 may be applied to the gate of the transistor of cell selection component 225, which may selectively disconnect, decouple, or isolate the capacitor 220 from the digit line 210. In some examples, activating the cell selection component 225 may be referred to as selectively coupling the memory cell 105-a with the digit line 210, and deactivating the cell selection component 225 may be referred to as selectively decoupling or isolating the memory cell 105-a from the digit line 210.

In other examples, the positions of the cell selection component 225 and the capacitor 220 in the memory cell 105-a may be switched, such that cell selection component 225 may be coupled with or between the plate line 215 and the cell plate 221, and the capacitor 220 may be coupled with or between the digit line 210 and the other terminal of the cell selection component 225. In such an example, the cell selection component 225 may remain connected (e.g., in electronic communication) with the digit line 210 through the capacitor 220. This configuration may be associated with alternative timing and biasing for access operations.

In examples that employ a ferroelectric capacitor 220, the capacitor 220 may or may not fully discharge upon connection to or coupling with the digit line 210. In various schemes, to sense the logic state stored by a ferroelectric capacitor 220, a voltage may be applied to the plate line 215 and/or the digit line 210, and the word line 205 may be biased (e.g., by activating the word line 205) to select the memory cell 105-a. In some cases, the plate line 215 and/or the digit line 210 may be virtually grounded and then isolated from the virtual ground, which may be referred to as a floating condition, an idle condition, or a standby condition, prior to activating the word line 205.

Operation of the memory cell 105-a by varying the voltage of the cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in the stored charge of the capacitor 220, or some portion of such a charge, may be used by the sense component 150-a to determine the logic state stored by the memory cell 105-a (e.g., in a charge transfer sensing scheme). In some schemes, the change in the stored charge of the capacitor 220 may cause a change in the voltage of the digit line 210, which may be used by the sense component 150-a to determine the logic state stored by the memory cell 105-a. A cell access signal may refer to a signal generated while the memory cell 105-a is selected or activated (e.g., while coupled with the signal development component), which may include a cell read signal in a read operation of the memory cell 105-a, or a cell write signal in a write operation, a rewrite operation, or a refresh operation of the memory cell 105-a. In various examples, a cell access signal may be referred to as a cell coupling signal or a cell charge sharing signal.

In some examples, the digit line 210 may be coupled with additional memory cells 105 (not shown), which each may be coupled with different word lines 205 (not shown). In other words, different memory cells 105 that are coupled with the digit line 210 may, in some examples, be selected or activated based at least in part on different word line logical signals.

The digit line 210 may have properties that result in an intrinsic capacitance 230 (e.g., on the order of picofarads (pF), which may in some cases be non-negligible), which may couple the digit line 210 with a voltage source 240-a having a voltage $V_0$. The voltage source 240-a may represent a common ground or virtual ground voltage, or the voltage of an adjacent access line of the circuit 200 (not shown). Although illustrated as a separate element in FIG. 2, the intrinsic capacitance 230 may be associated with properties distributed throughout the digit line 210 or another part of the circuit 200.

In some examples, the intrinsic capacitance 230 may depend on physical characteristics of the digit line 210, including conductor dimensions (e.g., length, width, thickness) of the digit line 210. The intrinsic capacitance 230 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting or activating the memory cell 105-a may depend on the net capacitance of (e.g., associated with) the digit line 210. In other words, as charge flows along the digit line 210 (e.g., to the digit line 210, from the digit line 210), some finite charge may be stored along the digit line 210 (e.g., in the intrinsic capacitance 230, in another capacitance coupled with the digit line 210), and the resulting voltage of the digit line 210 may depend on the net capacitance of the digit line 210.

The circuit 200 (e.g., the sense component 150-a) may include a signal development component 250, which may be an example of a signal development component or signal development circuit coupled with or between the memory cell 105-a and the sense amplifier 290. In some examples, an access line associated with a signal development component 250 (e.g., an access line coupled with an input/output of the signal development component 250, an access line coupled with or between the signal development component 250 and the sense amplifier 290) may be referred to as a signal development line (SDL) (e.g., signal development line 255, a "cacheline" (CL)). The signal development component 250 may amplify or otherwise convert signals (e.g., cell access signals) of the digit line 210 and the signal development line 255. For example, for a read operation, the signal development component 250 may generate or be otherwise associated with generating a cell read signal based at least in part on being coupled with the capacitor 220 (e.g., prior to a sensing operation of the sense amplifier 290), which may include a charge sharing between the signal development component 250 and the capacitor 220. In another example, for a write operation, a rewrite operation, or a refresh operation, the signal development component 250 may generate or be otherwise associated with generating a cell write signal for the capacitor 220 (e.g., based at least in part on being coupled with the sense amplifier 290, in response to a write command, a refresh command, a rewrite command, or a read command), which may include a charge sharing between the signal development component 250 and the capacitor 220.

In some examples, the signal development component 250 may include a signal storage element such as capacitor (e.g., a signal development cache element, an integrator capacitor, an amplifier capacitor (AMPCap), which may in some cases alternatively be referred to as a "fast cap") or another type of charge storage element configured to store a signal or signal state different than a logic state stored at a memory cell 105 (e.g., different than a logic state stored at the memory cell 105-a). Additionally or alternatively, the signal development component 250 may include, a transistor, an amplifier, a cascode, or any other charge or voltage conversion or amplification component. For example, the signal development component 250 may include a charge transfer sensing amplifier (CTSA), which in some examples may include a transistor having a gate terminal coupled with a voltage source.

Although the sense component 150-a is illustrated with a single signal development component 250, the sense component 150-a may include one or more additional signal development components 250 (not shown) to form a set of signal development components 250 (e.g., a signal development cache) in accordance with examples as disclosed herein. Each of the set of signal development components 250 of the sense component 150-a may be associated with (e.g., configured to be selectively coupled with or decoupled from, configured to develop cell access signals for) one or more memory cells 105 or one or more digit lines 210, which may or may not include the memory cell 105-a or the digit line 210. For example, each signal development component 250 of the set of signal development components 250 may be selectively coupled with or decoupled from one or more digit lines 210 of a memory section 110 of a memory array. In examples where a respective one of the signal development components 250 is coupled with more than one memory cell 105 or more than one digit line 210, any of the memory cells 105 or digit lines 210 may be selectively coupled with or decoupled from the respective signal development component 250 by a selection component (e.g., a digit line selection component, a multiplexer, a transistor network, a transistor array, a switching network, a switching array, not shown) between the respective signal development component 250 and the associated memory cells 105 or digit lines 210.

The sense component 150-a may also include a selection component 280 (e.g., a signal development component selection component, a multiplexer, a transistor network, a transistor array, a switching network, a switching array) coupled with or between a set of signal development components 250 (e.g., with or between a set of signal development lines 255) and the sense amplifier 290. The selection component 280 may be configured to selectively couple or decouple any of the set of signal development components 250 or signal development lines 255 with the sense amplifier 290. The selection component 280 may be associated with an access line, such as the signal line 285, for conveying signals (e.g., voltage, charge, current) between the selection component 280 and the sense amplifier 290. The output of the selection component 280 (e.g., in a read operation), for example, may be an output signal (e.g., a signal conveyed via the signal line 285) that is based at least in part on an input signal (e.g., a signal conveyed from a signal development component 250 selected by the selection component 280, a signal conveyed by a signal development line 255 selected by the selection component 280). In some examples, the output signal of the selection component 280 may be equal to, or substantially equal to the input signal of the selection component 280 (e.g., where $V_{sig}=V_{SDL}$). Although described in the context of an input signal via a signal development line 255 and an output signal via a signal line 285, the interpretation of input and output may be reversed in certain access operations that employ the circuit 200 (e.g., in a write operation, a rewrite operation, a refresh operation).

In a read operation, the voltage of the signal line 285 after selecting the memory cell 105-a (e.g., a cell read signal, after coupling the memory cell 105-a or the digit line 210 with the signal development component 250, after selecting the signal development component 250 at the selection component 280) may be compared to a reference (e.g., a voltage of the reference line 275) by the sense component 150-b to determine the logic state that was stored in the memory cell 105-a (e.g., to generate a sense or latch signal). In some examples, a voltage of the reference line 275 may be provided by a reference component 270. In other examples, the reference component 270 may be omitted and a reference voltage may be provided, for example, by accessing the memory cell 105-a or the digit line 210 to generate the reference voltage (e.g., in a self-referencing access operation). Other operations may be used to support selecting and/or sensing the memory cell 105-a.

In some examples, the circuit 200 may include a bypass line 260 that may permit bypassing (e.g., selectively bypassing) the signal development component 250 or some other portion of a circuit between the memory cell 105-a and the sense amplifier 290. In some examples, the bypass line 260 may be selectively enabled or disabled by way of a switching component 265. In other words, when the switching component 265 is activated, the digit line 210 may be coupled with the signal development line 255 or the selection component 280 via the bypass line 260 (e.g., coupling the memory cell 105-a with the selection component 280 or some other portion of a circuit between the memory cell and the sense amplifier 290).

In some examples, when the switching component 265 is activated, the signal development component 250 may be selectively isolated or decoupled from one or both of the digit line 210 or the signal development line 255 (e.g., by another switching component or selection component, not shown). When the switching component 265 is deactivated, the digit line 210 may be selectively coupled with the signal development line 255 or the selection component 280 via the signal development component 250. In other examples, one or more additional selection components (not shown) may be used to selectively couple the memory cell 105-a (e.g., the digit line 210) with one of the signal development component 250 (e.g., via the signal development line 255) or the bypass line 260.

Additionally or alternatively, in some examples, a switching or selection component may be used to selectively couple the selection component 280 with one of the signal development component 250 (e.g., via the signal development line 255) or the bypass line 260. In some examples, a selectable bypass line 260 may support generating a cell access signal (e.g., a cell read signal) for detecting a logic state of the memory cell 105-a by using the signal development component 250, and generating a cell access signal (e.g., a cell write signal) to write a logic state to the memory cell 105-a that bypasses the signal development component 250.

Some examples of a memory device that supports multiplexed signal development may share a common access line (not shown) between a memory cell 105 and a sense amplifier 290 to support generating a sense signal and a reference signal from the same memory cell 105. In one example, a common access line between a signal development component 250 and a sense amplifier 290 may be referred to as a "common line," and the common access line may take the place of the signal line 285 and the reference line 275 illustrated in circuit 200.

In such examples, the common access line may be connected to the sense amplifier 290 at two different nodes (e.g., a first node 291 and a second node 292, as described herein). In some examples, a common access line may permit a self-referencing read operation to share, in both a signal generating operation and a reference generating operation, components that may exist between the sense amplifier 290 and a memory cell 105 being accessed. Such a configuration may reduce the sensitivity of the sense amplifier 290 to operational variations of various components in a memory device, such as memory cells 105, access lines (e.g., a word line 205, a digit line 210, a plate line 215), signal development circuits (e.g., signal development component 250), transistors, voltage sources 293 and 294, and others.

Although the digit line 210, the signal development line 255, and the signal line 285 are identified as separate lines, the digit line 210, the signal development line 255, the signal line 285, and any other lines connecting a memory cell 105 with a sense amplifier 290 may be referred to as a single access line in accordance with examples as disclosed herein. Constituent portions of such an access line may be identified separately for the purposes of illustrating intervening components and intervening signals in various example configurations.

The sense amplifier 290 may include various transistors or amplifiers to detect, convert, or amplify a difference in signals, which may include or otherwise be referred to as generating a sense signal or a latch signal. For example, the sense amplifier 290 may include circuit elements that receive and compare a sense signal voltage (e.g., a cell read signal, $V_{sig}$) at the first node 291 with a reference signal voltage (e.g., $V_{ref}$) at the second node 292. An output of the sense amplifier 290 (e.g., a sense or latch signal) may be driven to a higher (e.g., a positive voltage) or a lower voltage (e.g., a negative voltage, a ground voltage) based on the comparison at the sense amplifier 290.

For example, if the first node 291 has a lower voltage than the second node 292, the output of the sense amplifier 290 may be driven to a relatively lower voltage of a low voltage source 293 (e.g., a voltage of $V_L$, which may be a ground voltage substantially equal to $V_0$ or a negative voltage). A sense component 150 that includes the sense amplifier 290, or an I/O component 160 that is coupled with such a sense component 150, may latch the output of the sense amplifier 290 to determine the logic state stored in the memory cell 105-a (e.g., detecting a logic 0 when the first node 291 has a lower voltage than the second node 292).

If the first node 291 has a higher voltage than the second node 292, the output of the sense amplifier 290 may be driven to the voltage of a high voltage source 294 (e.g., a voltage of $V_H$). A sense component 150 that includes the sense amplifier 290, or an I/O component 160 that is coupled with such a sense component 150, may latch the output of the sense amplifier 290 to determine the logic state stored in the memory cell 105-a (e.g., detecting a logic 1 when the first node 291 has a higher voltage than the second node 292). The latched output of the sense amplifier 290, corresponding to the detected logic state of memory cell 105-a, may then be output via one or more input/output (I/O) lines (e.g., I/O line 295).

To perform a write operation, rewrite operation, or refresh operation on the memory cell 105-a, a voltage (e.g., a cell write signal) may be applied across the capacitor 220. Various methods may be used. In one example, the cell selection component 225 may be selected or activated through the word line 205 (e.g., by selecting or activating the word line 205) to electrically connect the capacitor 220 to the digit line 210. A voltage may be applied across capacitor 220 by controlling the voltage of the cell plate 221 (e.g., through the plate line 215) and the cell bottom 222 (e.g., through the digit line 210). In some examples, write operations, rewrite operations, or refresh operations may be based at least in part on a sense or latch signal at the sense amplifier 290, which may be based on a signal received via the I/O line 295 (e.g., a write signal, a refresh signal) or based on a signal generated at the sense amplifier 290 (e.g., a rewrite signal).

For example, to write a logic 0, the cell plate 221 may be taken high (e.g., applying a positive voltage to the plate line 215), and the cell bottom 222 may be taken low (e.g., grounding the digit line 210, virtually grounding the digit line 210, applying a negative voltage to the digit line 210). The opposite process may be performed to write a logic 1, where the cell plate 221 is taken low and the cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense amplifier 290 or the signal development component 250 may be used to perform the write operations, which may include coupling the low voltage source 293 or the high voltage source 294 with the digit line. When the sense amplifier 290 is used to perform the write operations, the signal development component 250 may or may not be bypassed (e.g., by applying a write signal via the bypass line 260).

The circuit 200, including the sense component 150-a, the cell selection component 225, the signal development component 250, the switching component 265, the reference component 270, the selection component 280, or the sense amplifier 290 may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, an n-type transistor may act as a switching component, where the applied voltage is a logical signal that is used to selectively enable conductivity through the transistor by applying a relatively high logical signal voltage (e.g., a voltage corresponding to a logic 1 state, which may be associated with a positive logical signal voltage supply), or to selectively disable conductivity through the transistor by applying a relatively low logical signal voltage (e.g., a voltage corresponding to a logic 0 state, which may be associated with a ground or virtual ground voltage, or a negative voltage). In some examples where a n-type transistor is employed as a switching component, the voltage of a logical signal applied to the gate terminal may be selected to operate the transistor at a particular working point (e.g., in a saturation region or in an active region).

In some examples, the behavior of an n-type transistor may be different (e.g., more complex) than a logical switching, and selective conductivity across the transistor may also be a function of varying source and drain voltages. For example, the applied voltage at the gate terminal may have a particular voltage level (e.g., a clamping voltage, a control voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, an p-type transistor may act as a switching component, where the applied voltage is a logical signal that is used to selectively enable conductivity by applying a relatively low logical signal voltage (e.g., a voltage corresponding to a logical "1" state, which may be associated with a negative logical signal voltage supply), or to selectively disable conductivity by applying a relatively high logical signal voltage (e.g., a voltage corresponding to a logical "0" state, which may be associated with a ground or virtual ground voltage, or a positive voltage). In some examples where a p-type transistor is employed as a switching component, the voltage of a logical signal applied to the gate terminal may be selected to operate the transistor at a particular working point (e.g., in a saturation region or in an active region).

In some examples, the behavior of a p-type transistor may be different (e.g., more complex) than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In some examples, the transistor(s) may be formed on a substrate that is dedicated to a particular component of the circuit 200 (e.g., a substrate for the sense amplifier 290, a substrate for the signal development component 250, a substrate for the memory cell 105-a), or the transistor(s) may be formed on a substrate that is common for particular components of the circuit 200 (e.g., a substrate that is common for the sense amplifier 290, the signal development component 250, and the memory cell 105-a). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In some examples, different portions of the circuit 200, or different operations that use portions of the circuit 200, may be associated with different latencies. For example, in one portion of an access operation (e.g., a first sub-operation, a first set of sub-operations), a cell access signal may be developed by coupling the memory cell 105-a with the signal development component 250 (e.g., based at least in part on activating or selecting the cell selection component 225, based at least in part on activating another switching component, isolation component, or selection component between the memory cell 105-a and the signal development component 250). In some examples, the cell access signal may be developed based at least in part on, or may be otherwise associated with a charge sharing between the memory cell 105-a (e.g., the capacitor 220) and the signal development component 250 (e.g., charge flowing from the capacitor 220 to the signal development component 250, charge flowing from the signal development component 250 to the capacitor 220). In some examples (e.g., in a read operation), the developed cell access signal (e.g., a cell read signal) or charge sharing may be based at least in part on a logic state stored by the memory cell 105-a. In some examples (e.g., in a write operation, a rewrite operation, a refresh operation), the developed cell access signal (e.g., a cell write signal) or charge sharing may be based at least in part on a developed sense or latch signal (e.g., at the sense amplifier 290, at the signal line 285). As disclosed herein, the charge sharing between the memory cell 105-a and the signal development component 250 may be associated with a change in voltage of the digit line 210, or a change in voltage of the signal development line 255, or both.

The development of a cell access signal for an access operation may be associated with a latency, which may refer to an amount of time (e.g., a duration) for developing the cell access signal, a delay between initiating a cell access signal development operation and a cell access signal reaching a threshold level suitable for subsequent portions of the access operation (e.g., in a read operation), or a delay between initiating a cell access signal development operation and a memory cell 105 being written with a logical value (e.g., in a write operation, a rewrite operation, or a refresh operation). In some examples (e.g., in a read operation) the duration or latency may be referred to as a "row-to-column address delay," and in some examples (e.g., in a write operation) the duration or latency may be referred to as a "row precharge delay," which may be longer or shorter than a row-to-column address delay.

In some examples, the sharing of charge between the memory cell 105-a, the digit line 210 (e.g., intrinsic capacitance 230) and the signal development component 250 may be associated with a time constant behavior (e.g., a time constant behavior of a change in voltage $V_{DL}$, a time constant behavior of a change in voltage $V_{SDL}$), or otherwise include a logarithmic or exponential behavior. The duration or latency for developing the cell access signal may refer to a duration between a coupling or activation operation (e.g., a selection or activation of the cell selection component 225, a selection or activation of another component configured to selectively couple the memory cell 105-a and the signal development component 250) and the digit line 210 or signal development line 255 reaching a steady state voltage, or the digit line 210 or signal development line 255 reaching a threshold proportion of a steady state voltage (e.g., 95% of a steady state voltage, 99% of a steady state voltage).

In some examples, the duration or latency for developing a cell access signal may be expressed as a time constant (e.g., a duration of time for reaching 63% of a change between initial voltage and steady state voltage), or expressed as a multiple of time constants. For example, the duration or latency for developing the cell access signal may be expressed as a duration of 3 time constants, or a duration otherwise associated with the cell access signal being within 5% of a steady state value. In another example, the duration or latency for developing the cell access signal may be expressed as a duration of 5 time constants, or a duration otherwise associated with the cell access signal being within 1% of a steady state value.

In some examples, charge sharing behavior and associated time constants or other latency may be based at least in part on a capacitance of the memory cell 105-*a*, the signal development component 250, or other capacitance between the memory cell 105-*a* and the signal development component 250 (e.g., intrinsic capacitance, such as intrinsic capacitance 230). For example, a relatively high capacitance of the digit line 210 (e.g., a relatively high intrinsic capacitance 230) may be associated with a relatively high latency (e.g., a relatively long duration to develop a cell read signal), and a relatively low capacitance of the digit line 210 may be associated with a relatively low latency (e.g., a relatively short duration to develop a cell read signal). In another example, a relatively high capacitance of memory cell 105-*a* (e.g., capacitor 220) may be associated with a relatively low latency (e.g., a relatively short duration to develop a cell read signal), and a relatively low capacitance of the memory cell 105-*a* may be associated with a relatively high latency (e.g., a relatively long duration to develop a cell read signal).

Although described with reference to time constant behavior, a duration or latency associated with developing a cell access signal may additionally or alternatively include other behaviors such as ramped, stepped, or oscillating (e.g., underdamped) behaviors. In some examples, developing a cell access signal may include a set of operations, such as a set of coupling, isolating, activating, deactivating, selecting, or deselecting operations, and a duration or latency associated with developing the cell access signal may include the associated circuit behaviors of each of the set of operations. For example, developing a cell access signal may include activating switching or selection components along the digit line 210 or signal development line 255, activating switching or selection components between the digit line or signal development line and another component (e.g., selectively coupling a voltage source (not shown) with the digit line 210 or the signal development line 255), or other operations or combinations of operations.

In another portion of the access operation (e.g., a second sub-operation, a second set of sub-operations), a sense signal (e.g., a latch signal, an output signal, an input/output signal) may be developed by activating the sense amplifier 290 (e.g., based at least in part on selectively coupling the signal development component 250 with the sense amplifier 290, based at least in part on selectively coupling the sense amplifier with one or both of the low voltage source 293 or the high voltage source 294). In some examples, the sense signal may be developed based at least in part on, or may be otherwise associated with a charge sharing between the signal development component 250 and the sense amplifier 290. In some examples (e.g., in a read operation), the sense signal or charge sharing may be based at least in part on the developed cell access signal (e.g., at the signal development component 250, at the signal development line 255). As described herein, the charge sharing between the signal development component 250 and the sense amplifier 290 may be associated with a change in voltage of the I/O line 295, which may be based at least in part on a comparison between voltage $V_{sig}$ and voltage $V_{ref}$ (e.g., an output of $V_L$ when $V_{sig}$ is less than $V_{ref}$, an output of $V_H$ when $V_{sig}$ is greater than $V_{ref}$).

The development of a sense or latch signal for an access operation may also be associated with a latency, which may refer to an amount of time for developing the sense or latch signal, or a delay between initiating a sense or latch signal generation operation and a sense or latch signal reaching a threshold level suitable for subsequent portions of the access operation (e.g., an output indicative of a logic state stored by the memory cell 105-*a*). For example, the sharing of charge between the signal development component 250 and the sense amplifier 290 may also be associated with a time constant behavior (e.g., a time constant behavior of a change in voltage of the I/O line 295), or other logarithmic or exponential behavior. The duration or latency for developing the sense or latch signal may refer to a duration between a coupling or activation operation (e.g., a selection or activation of a switching component or selection component, such as the selection component 280, configured to selectively couple the signal development component 250 with the sense amplifier 290, a coupling of the sense amplifier 290 with one or both of the low voltage source 293 or the high voltage source 294) and the I/O line 295 reaching a steady state voltage, or the I/O line 295 reaching a threshold proportion of a steady state voltage (e.g., 90% of a steady state voltage, 95% of a steady state voltage).

The duration or latency for developing a sense or latch signal may also be expressed as a time constant, or as a multiple of time constants. Although described with reference to time constant behavior, a duration or latency associated with developing a sense or latch signal may additionally or alternatively include other behaviors such as ramped, stepped, or oscillating (e.g., underdamped) behaviors. In some examples, developing a sense or latch signal may include a set of operations, such as a set of coupling, isolating, activating, deactivating, selecting, or deselecting operations, and a duration or latency associated with developing the sense or latch signal may include the associated circuit behaviors of each of the set of operations.

In some examples of the circuit 200, a latency associated with developing a cell access signal may be longer in duration than a latency associated with generating a sense or latch signal. For example, a charge sharing between the signal development component 250 and the memory cell 105-*a* may be associated with a different amount of charge, or a slower transfer of charge, than a charge sharing between the signal development component 250 and the sense amplifier 290. In other words, the signal development component 250 or the memory cell 105-*a* may be associated with or be otherwise considered as relatively high latency portions of the circuit 200 and the sense amplifier 290 may be associated with or considered as a relatively low latency portion of the circuit 200. In such examples, the circuit 200 may support performing input or output operations more quickly than performing signal development operations.

In accordance with examples as disclosed herein, a memory device 100 that includes the circuit 200 may couple each of a set of signal development components 250 with a respective memory cell 105 during overlapping time intervals, such that multiple cell access signals (e.g., associated with the respective memory cell 105 of each of the respective signal development components 250) may be generated during the overlapping time intervals. Each of the set of signal development components 250 may be selectively coupled with the sense amplifier 290 via the selection component 280 (e.g., in a sequential order) to generate a sequence of sense or latch signals at the sense amplifier 290, or vice versa. For example, in a read operation or set of read operations, the sequence of sense or latch signals generated at the sense amplifier 290 may be based on respective cell access signals (e.g., cell read signals) developed during overlapping time intervals at the set of signal development components 250, which may be associated with particular logic states stored by respective memory cells 105. Thus, as disclosed herein, a memory device 100 that includes the circuit 200 may include signal development components 250 that are multiplexed via the selection component 280, which in some examples may compensate for portions of an access operation that are associated with different latencies.

Figure 3:
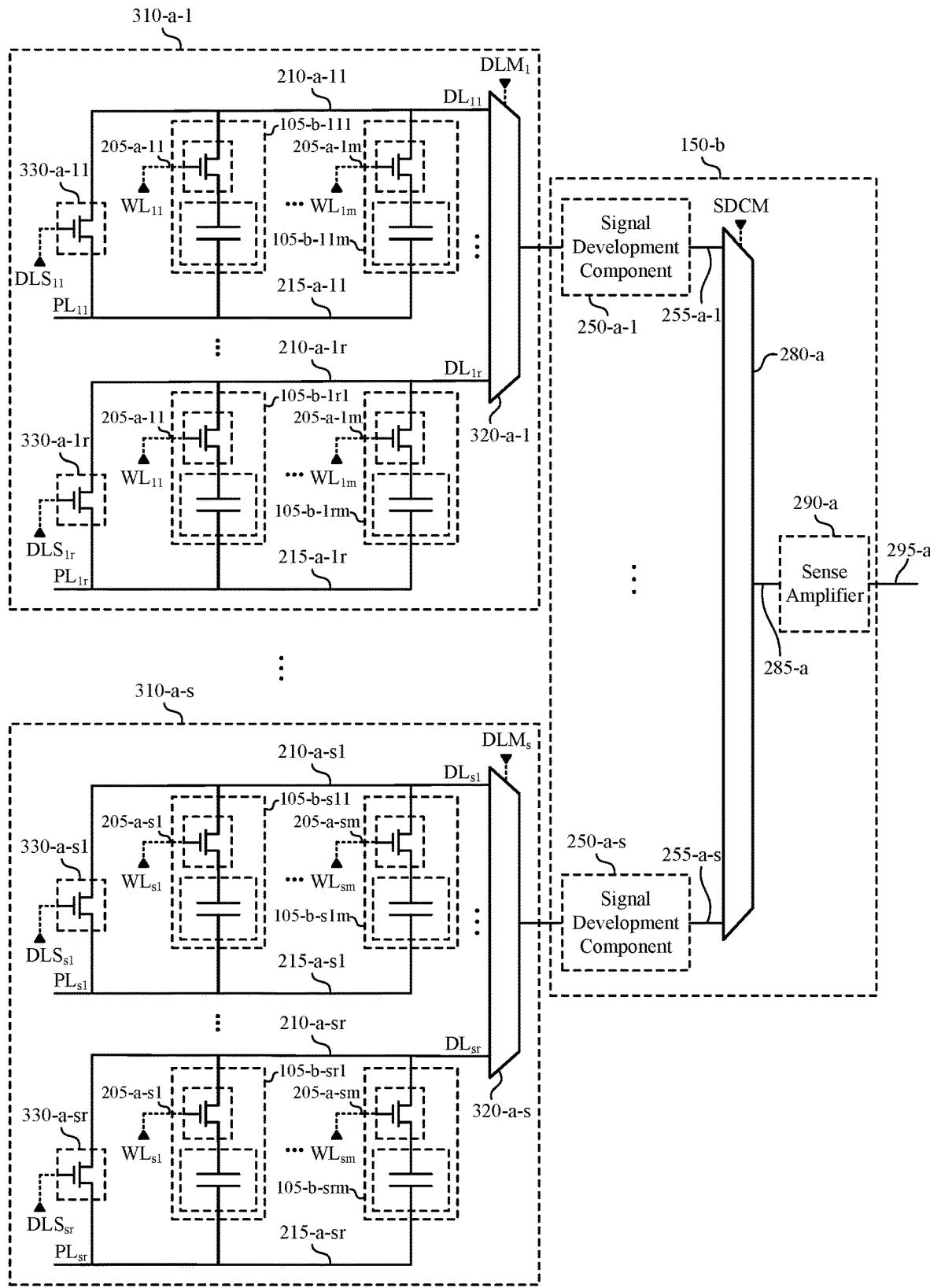
FIG. 3 illustrates an example circuit that supports signal development caching in a memory device in accordance with examples as disclosed herein.

FIG. 3 illustrates an example circuit 300 that supports signal development caching in a memory device in accordance with examples as disclosed herein. It is to be understood that circuit 300 is merely one illustrative example, and that many implementations, including other specific circuits and topologies, are possible while adhering to the principles and techniques disclosed herein, as will be appreciated by one of ordinary skill in the art.

Circuit 300 includes a set of memory cells 105-b (e.g., memory cells 105-b-111 through 105-b-srm) and a sense component 150-b. Although the memory cells 105-b are illustrated as including a capacitor and a cell selection component, memory cells 105-b in accordance with examples as disclosed herein may include various configurations (e.g., with or without cell selection components) and various types of logic storage elements (e.g., a capacitive memory element, a ferroelectric memory element, a material memory element, a resistive memory element, a thresholding memory element, other memory element) to support various types of memory devices (e.g., DRAM memory devices, FeRAM memory devices, PCM devices, chalcogenide memory devices). Circuit 300 illustrates circuitry that may support the described techniques for signal development caching in a memory device.

The sense component 150-b may include a set of signal development components 250-a (e.g., signal development components 250-a-1 through 250-a-s), each associated with one or more of the memory cells 105-b. The sense component 150-b may also include a selection component 280-a (e.g., a signal development component selection component, a MUX, a transistor network, a transistor array, a switching network, a switching array) that is coupled with the set of signal development components 250-a (e.g., via signal development lines 255-a-1 through 255-a-s). The selection component 280-a may be configured to selectively couple a selected one of the signal development components 250-a (e.g., a selected one of the signal development lines 255-a) with a sense amplifier 290-a of the sense component 150-b (e.g., via signal line 285-a, in response to a logical or selection signal, such as a signal development component multiplexing (SDCM) signal). The sense amplifier 290-a may exchange (e.g., communicate, receive, transmit) input or output signals with other components of a memory device (e.g., an input/output component 160) via the I/O line 295-a.

In the example of circuit 300, the memory cells 105-b may be arranged according to a set of domains 310-a (e.g., domains 310-a-1 through 310-a-s). In other words, the circuit 300 may illustrate an example of a set of memory cells 105-b that are divided across or otherwise associated with s domains. In the example of circuit 300, each of the domains 310-a may be associated with (e.g., coupled with) one of the signal development components 250-a (e.g., domain 310-a-1 being associated with signal development component 250-a-1). However, in various examples of circuitry that supports the described techniques, a domain 310 may be associated with more than one signal development component 250, or a signal development component 250 may be associated with more than one domain 310, or both.

Although the example domains 310-a of circuit 300 are described with reference to certain characteristics, alternative definitions or organizations of domains may also be utilized in support of the described techniques. As one such example, memory cells 105 or access lines (e.g., word lines 205, digit lines 210, plate lines 215) of a domain may be organized or subdivided in a different manner than the domains 310-a illustrated in the circuit 300, or a domain may be defined in a different manner than the domains 310-a illustrated in the circuit 300 (e.g., which components are included within an illustrative boundary of a domain), or domains may be coupled with signal development components 250 or sense amplifiers 290 in a different manner than the domains 310-a illustrated in the circuit 300 (e.g., with different multiplexing organizations or schemes, different selection components).

In the example of circuit 300, each of the domains 310-a may include memory cells 105-b that are coupled with or between one of a set of digit lines 210-a and one of a set of plate lines 215-a. For example, for domain 310-a-1, each of the set of memory cells 105-b (e.g., each of memory cells 105-b-111 through 105-b-1rm) may be coupled with one of the digit lines 210-a-11 through 210-a-1r and may be coupled with one of the plate lines 215-a-11 through 215-a-1r. In other words, the domains 310-a may illustrate an arrangement of memory cells 105-b that are divided across or otherwise associated with r digit lines 210-a or "columns." Although the example circuit 300 is illustrated as having separate plate lines 215-a, in some examples, a set of plate lines 215-a (e.g., a set of two or more of the plate lines 215-a-11 through 215-a-1r) may represent or be otherwise functionally equivalent with a common plate line of a domain 310-a (e.g., domain 310-a-1), or may represent or be otherwise functionally equivalent with a common plate line of a portion of a domain 310-a (e.g., a "sub-domain"), or a different set of plate lines 215-a (e.g., a set of two or more of the plate lines 215-a-11 through 215-a-sr) may represent or be otherwise functionally equivalent with a common plate line of a set of domains 310-a (e.g., a set of domains 310-a-1 through 310-a-s).

Domains 310-a may also illustrate an arrangement of memory cells 105-b that are divided across or otherwise associated with m word lines 205-a or "rows." For example, domain 310-a-1 may include respective sets of m memory cells 105-b that are coupled with or between each of the digit lines 210-a of the domain 310-a and the plate lines 215-a of the domain (e.g., a set of memory cells 105-b-111 through 105-b-11m coupled with or between the digit line 210-a-11 and the plate line 215-a-11). For a set of memory cells 105-b coupled with a same digit line 210-a and a same plate line 215-a, each of the set may be individually selected or accessed based at least in part on an associated logical signal WL (e.g., for domain 310-a, one of logical signals $WL_{11}$ through $WL_{1m}$). Although illustrated as sharing a common set of word lines 205-a in a domain 310-a (e.g., word lines 205-*a*-11 through 205-*a*-1*m* shared across each of the columns of domain 310-*a*-1), other examples of a memory device may have a different arrangement of word lines 205 in a domain 310.

In the example of circuit 300, each of the domains 310-*a* may also include or be otherwise associated with a selection component 320-*a* (e.g., a digit line selection component, a MUX, a transistor network, a transistor array, a switching network, a switching array) that is coupled with each of the set of digit lines 210-*a* of the domain 310-*a*. For example, the domain 310-*a*-1 may include a selection component 320-*a*-1 that is coupled with each of the digit lines 210-*a*-11 through 210-*a*-1*r*. The selection component 320-*a*-1, for example, may be configured to selectively couple a selected one of the digit lines 210-*a*-11 through 210-*a*-1*r*, or one of the memory cells 105-*b*-111 through 105-*b*-11*m*, with the signal development component 250-*a*-1 (e.g., in response to a logical or selection signal, such as a digit line multiplexing (DLM) signal $DLM_1$). Accordingly, each of the selection components 320-*a*-1 through 320-*a*-*s* may be associated with a respective one of the signal development components 250-*a*-1 through 250-*a*-*s*.

In the example of circuit 300, each of the signal development components 250-*a* may be associated with a respective set of memory cells 105-*b* or a respective set of digit lines 210-*a*. In some examples, the selection components 320-*a*-1 through 320-*a*-*s* may be an example of a plurality of second selection components, where each second selection component of the plurality of second selection components is associated with a respective signal development component 250, and is configured to selectively couple any one memory cell 105-*b* or digit line 210-*a* of the set with the respective signal development component 250.

In an illustrative example, each of the domains 310-*a* may include 1,048,576 memory cells 105-*b* arranged in 1,024 uniquely addressed rows and 1,024 columns (e.g., where m=1024 and r=1024). According to the illustrative example of circuit 300, one signal development component 250-*a* may be mapped to a particular domain 310-*a*, but in other examples a set of more than one signal development component 250-*a* may be mapped to a particular domain 310-*a* (e.g., to respective sets of digit lines 210-*a* of a domain 310-*a*). In some examples, such a mapping may be fixed (e.g., where respective sets of digit lines 210-*a* are mapped to a respective signal development component 250-*a* within each domain 310-*a*) which, in some examples, may reduce multiplexing or selection circuit complexity. In various other examples (not shown), a signal development component 250 may be mapped to more than one domain 310, more than one set of digit lines 210 (e.g., of a domain), or other configurations. Additionally or alternatively, a domain 310 or a set of digit lines 210 may be mapped to more than one signal development component 250. In other words, a memory device may include various configurations of signal development components 250 to support examples of the multiplexed signal development described herein.

In the example of circuit 300, each of the digit lines 210-*a* is associated with (e.g., configured to be selectively coupled with) a single one of the signal development components (e.g., via a respective one of the selection components 320-*a*-1). For example, the digit line 210-*a*-11 may be associated with signal development component 250-*a*-1, but not signal development component 250-*a*-*s*. However, in various examples of circuitry that supports the described techniques for signal development caching in a memory device, a particular digit line 210-*a* may be associated with (e.g., configured to be selectively coupled with) more than one signal development component 250-*a*, which may include a selection component different from the set of selection components 320-*a*-1 through 320-*a*-*s* illustrated in circuit 300. For example, the digit line 210-*a*-11 may be associated with (e.g., configured to be selectively coupled with) either the signal development component 250-*a*-1 or the signal development component 250-*a*-*s*, or any other signal development components 250-*a* of the circuit 300.

In another illustrative example that supports the described techniques for multiplexed signal development, another circuit may include several domains each with 1,048,576 memory cells 105 arranged in 1,024 uniquely addressed rows and 1,024 columns, which may refer to an organization of components that is different than the circuit 300. Each of the domains of the other circuit may be arranged such that m=1024 and r=1024, and the digit lines 210 of a respective domain of this other circuit may collectively be mapped to an array of 64 signal development components 250 (e.g., according to a many to-one mapping, according to a many-to-many mapping). In one example of the other circuit, each of the signal development components 250 may be mapped to a respective subset of the digit lines 210 of the domain (e.g., one signal development component 250 may be mapped to 1024/64=16 digit lines 210 within each domain). In some examples, such a mapping may be fixed (e.g., where groups or subsets of 16 digit lines 210 are mapped to a respective signal development component 250 within each domain) which, in some examples, may reduce multiplexing or selection circuit complexity.

In this other example, a row of 1024 memory cells 105 (e.g., spanning one domain of the other circuit) may be selected by a single word line 205 in each domain. In other words, with 64 signal development components 250 per domain and r=1024, the activation of a word line in one domain and the activation of another word line in another domain (e.g., including other independent word lines in other domains) may select memory cells 105 associated with the respective row. With 64 signal development components 250 per domain of such a circuit, 64 of the set of 1,024 memory cells 105 may be accessed at a time in each domain (e.g., by selectively coupling a respective digit line 210 with each of the 64 signal development components 250 via a respective selection component). During such accessing, other digit lines 210 may be selectively isolated from the respective signal development component 250 and other signal development components 250 interfacing the same domain. Further, the other digit lines 210 may be shunted or masked as described herein.

Thus, examples in accordance with the techniques disclosed herein may include examples in which word lines 205 within a domain, or word lines 205 across multiple domains, or some combination thereof, are independent (e.g., selectable independently of one another). Examples in accordance with the techniques disclosed herein may also include examples in which word lines 205 within a domain, or word lines 205 across multiple domains, or some combination thereof, are locked (e.g., hard-wired) to be selected together (jointly). It is to be understood that in examples in which word lines 205 are independently selectable, such word lines 205 may nevertheless be operated synchronously (e.g., as though locked), at least at certain times or under certain conditions. Further, examples in accordance with the techniques disclosed herein may include examples in which many digit lines 210 are mapped to many signal development components 250 within a domain, as well as examples where many digit lines 210 are mapped to one signal development component 250 within a domain (e.g., a selection component 280 may have many-to-one or many-to-many functionality). Aspects of these and other example variations are described throughout the disclosure, including with reference to FIGS. 8A, 8B, and 8C.

In some examples, operations associated with word line selection may be time-bounded to prevent loss or corruption of data, which may involve waiting for completion of operations that are in progress with accessed cells. For example, when switching from a first word line 205-*a* of a domain 310-*a* to a second word line 205-*a* of the same domain 310-*a*, such a switching may need to wait for cell access signal development of the domain 310-*a* (e.g., of the signal development component 250-*a*) to be completed before the switching takes place. In examples where a word line 205-*a* is shared across domains (e.g., a word line 205-*a* that is shared between domain 310-*a*-1 and 310-*a*-*s*, word line 205-*a*-11 being functionally equivalent to word line 205-*a*-s1), when switching from a first shared word line 205-*a* to a second shared word line 205-*a*, such a switching may need to wait for cell access signal development of each of the domains 310-*a*-1 and 310-*a*-*s* (e.g., each of the signal development components 250-*a*-1 and 250-*a*-*s*) to be completed before the switching takes place In the example of circuit 300, each of the domains 310-*a* may also include or be otherwise associated with a set of shunts 330-*a* (e.g., digit line shunts, digit-to-plate shunts). For example, domain 310-*a*-1 may include a set of shunts 330-*a*-11 through 330-*a*-1*r*. Each of the shunts 330-*a* may be coupled with or between a digit line 210-*a* and plate line 215-*a*. For example, for domain 310-*a*-1, shunt 330-*a*-11 may be coupled with or between the digit line 210-*a*-11 and the plate line 215-*a*-11. The shunt 330-*a*-11, for example, may be configured to selectively couple the digit line 210-*a*-11 with the plate line 215-*a*-11 (e.g., in response to a logical or switching signal $DLS_{11}$). In some examples, a shunt 330-*a* may be configured to selectively equalize a bias between a digit line 210-*a* and a plate line 215-*a*, or equalize one or more memory cells 105-*b* that are coupled with or between a digit line 210-*a* and a plate line 215-*a*. In some examples, a shunt 330-*a* may be configured to selectively discharge one or more memory cells 105-*b* that are coupled with or between a digit line 210-*a* and a plate line 215-*a*.

In some examples, the circuit 300 may be operated according to a shunt mask. For example, when multiplexing is performed on a domain 310-*a* (e.g., using selection components 320), a shunt 330-*a* of a masked digit line 210-*a* (e.g., a digit line 210-*a* that is not associated with an access operation that is being performed) may support a selective coupling with a plate line 215-*a* to prevent or reduce data loss (e.g., charge leakage) of memory cells 105-*b* that are associated with the masked digit line 210-*a*. In other words, a shunt 330-*a* may turn off bit transfer on masked digit lines 210-*a* that are not associated with an access operation that is being performed.

The selection component 280-*a* and the selection components 320-*a* may include various configurations of components, and each may be referred to as a multiplexer, a transistor network, a transistor array, a switching network, or a switching array. In one example, the selection component 280-*a* may include a set of transistors that are each coupled with the sense amplifier 290-*a* (e.g., each coupled with the signal line 285-*a*). Each of the set of transistors may also be coupled with a respective one of the signal development components 250-*a* (e.g., a respective one of the signal development lines 255-*a*-1 through 255-*a*-*s*). Each of the set of transistors may be configured to selectively couple the respective one of the signal development components 250-*a* with the sense amplifier 290-*a*, responsive to one of a set of switching or logical signals provided to a gate of the transistor.

In some examples, a selection component 280-*a* or a selection component 320-*a* may include decoder or other logical or selection signal conversion component. A decoder of the selection component 280-*a*, for example, may receive a logical or selection signal (e.g., signal SDCM), which may be a digital signal (e.g., a signal having or otherwise representing multiple bits) received over a signal bus. In some examples, the decoder may receive the digital signal as an input to generate a set of binary signals (e.g., switching or logical signals) that may be applied to the gates of a set of transistors configured in a switching arrangement. For example, the decoder of the selection component 280-*a* may receive a selection signal SDCM as a 4-bit digital input signal, and generate 16 binary (e.g., on/off) switching signals, each applied to the gate of one of a set of 16 transistors configured in a switching arrangement.

In various examples, the selection component 280-*a* may be configured such that one of the signal development components 250-*a*-1 through 250-*a*-*s* is coupled with (e.g., selectively coupled with) the sense amplifier 290-*a* at a time, and others of the signal development components 250-*a*-1 through 250-*a*-*s* may be decoupled from (e.g., selectively decoupled from) the sense amplifier 290-*a* at that time (e.g., the time when the one of the signal development components 250-*a*-1 through 250-*a*-*s* is selectively coupled with the sense amplifier 290-*a*). In some examples, the selection component 280-*a* may also be configured to support operations where none of the signal development components 250-*a*-1 through 250-*a*-*s* are coupled with the sense amplifier 290-*a* at a particular time (e.g., where each of the signal development components 250-*a*-1 through 250-*a*-*s* are selectively isolated from the sense amplifier 290-*a*). In various examples of the circuit 300, the selection components 320-*a* may include similar features or sets of features as a selection component 280-*a*, or the selection components 320-*a* may include different features or sets of features as a selection component 280-*a*.

In some examples of the circuit 300, the signal development components 250-*a* or the memory cells 105-*b* may be associated with or be otherwise considered as relatively high latency portions of the circuit 300, and the sense amplifier 290-*a* may be associated with or considered as a relatively low latency portion of the circuit 300. In accordance with examples as disclosed herein, the sense component 150-*b* may illustrate an example of dividing memory cell access circuitry into high-latency parts (e.g., signal development components 250-*a*) and low-latency parts (e.g., sense amplifier 290-*a*), and coupling a set of high-latency parts with a set of low-latency parts through a multiplexer (e.g., selection component 280-*a*).

In the example of circuit 300, the selection component 280-*a* may provide a first degree of data pipelining, which may reduce the impact of data access serialization due to row buffer conflicts. For example, the selection component 280-*a* may support overlapping data transfers on different sets of digit lines 210-*a* (e.g., different domains 310-*a*). Thus, the sense amplifier 290-*a* may be free to support read, write, rewrite, or refresh operations (e.g., while coupled with one of the signal development components 250-*a*) while other signal development components 250-*a* are involved in data transfer (e.g., while other signal development components 250-*a* are coupled with digit lines 210-*a* or memory cells 105-*b*).

The set of signal development components 250-*a* may be considered to be a small, fast local cache (e.g., a signal development cache), where the respective signal development components 250-*a* may be configured to store a signal state, different than logic states stored at the memory cells 105-*b*. Such a configuration may be used to support reducing a rate of row buffer conflicts, increasing internal bandwidth, or other benefits. In some examples, the selection components 320-*a* may provide further gains by providing a second degree of data pipelining via multiplexed digit lines 210-*a*. Thus, in accordance with examples as disclosed herein, a memory device 100 that includes the circuit 300 may include signal development components 250-*a* that are multiplexed via the selection component 280-*a*, or digit lines 210-*a* that are multiplexed via one or more selection components 320-*a*, which may compensate for portions of an access operation or portions of access circuitry that are associated with different latencies.

Various memory devices (e.g., memory device 100) may include various arrangements of the circuit 300. For example, a memory device 100 may include a set of sense components 150-*b*, or a sense component 150 may otherwise include a set of sense amplifiers 290-*a* and corresponding sets of multiplexed signal development components 250-*a*. In one example, a memory device 100, or portion thereof, may include 16 sense amplifiers 290-*a* that are multiplexed with 1024 digit lines 210-*a*, which may or may not include multiplexing via selection components 320-*a*. In some examples, a set of sense amplifiers 290-*a* may be included in a composite array where the set of sense amplifiers 290-*a* are accessed as a single "row" of sense amplifiers of the composite array. In various examples, multiplexed digit lines 210-*a* may be in the same domain 310-*a* or different domains 310. In some examples, each of the domains 310-*a* may be independently controllable, and may be accessed via the same row component 125 or different row components 125.

Figure 4A:
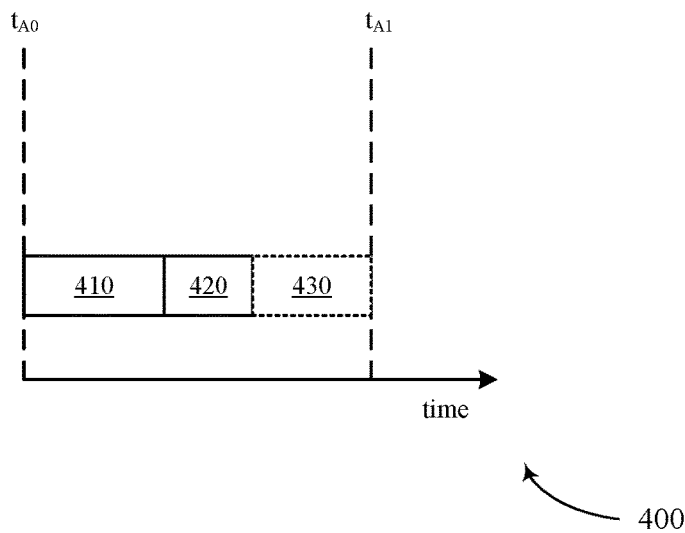
FIGS. 4A and 4B illustrate examples of read operations that support signal development caching in a memory device in accordance with examples as disclosed herein.

FIG. 4A illustrates an example of a read operation 400 that supports signal development caching in a memory device in accordance with examples as disclosed herein. The read operation 400 may illustrate portions (e.g., time intervals) of an access operation that are associated with generating cell access signals (e.g., cell read signals, cell write signals) and latch signals when accessing a memory cell 105. For example, the read operation 400 may be divided into a read signal development portion 410 (e.g., a cell read portion), a latch signal generation portion 420, and a rewrite signal development portion 430 (e.g., a cell rewrite portion). The read operation 400 may employ circuitry that supports multiplexed signal development, such as the circuit 300 described with reference to FIG. 3. As an illustrative example, the read operation 400 is described with reference to reading a logic state stored by the memory cell 105-*b*-111 of the circuit 300, but the read operation 400 may be illustrative of operations that may be performed on any one or more of the memory cells 105-*b* of the circuit 300.

The read signal development portion 410 may be associated with a charge sharing between the memory cell 105-*b*-111 (e.g., a capacitive storage element of the memory cell 105-*b*-111, a linear capacitor or a ferroelectric capacitor), the digit line 210-*a*-11 (e.g., an intrinsic capacitance 230), and the signal development component 250-*a*-1. The read signal development portion 410 may be an example of developing a signal (e.g., a signal state, a cache signal) at the signal development component 250-*a*-1 based at least in part on selectively coupling the signal development component 250-*a*-1 with the memory cell 105-*b*-111. In some examples, developing the read signal at the signal development component 250-*a*-1 is associated with a first latency (e.g., a relatively high latency or long duration). During the read signal development portion 410, the signal development component 250-*a*-1 may be selectively decoupled from the sense amplifier 290-*a*.

In some examples of the read signal development portion 410, an access line of the signal development component 250-*a*-1 (e.g., the signal development line 255-*a*-1) may be biased with a relatively high voltage, which may be associated with storing a relatively high voltage charge at the signal development component 250-*a*-1 (e.g., in a signal storage component of the signal development component 250-*a*-1, such as an integrator capacitor). In some examples, such a biasing may be associated with a "plate-low" read operation where, during the read signal development portion 410, the plate line 215-*a*-11 associated with the memory cell 105-*b*-111 being accessed is biased at a lower voltage (e.g., a ground voltage) than the digit line 210-*a*-1 associated with the memory cell 105-*b*-111.

The read signal development portion 410 may also include selectively coupling the memory cell 105-*b*-111 with the signal development component 250-*a*-1. In some examples, the read signal development portion 410 may include activating the word line 205-*a*-11 that is associated with the memory cell 105-*b*-111 that is being read (e.g., activating the logical signal $WL_1$), which may selectively couple a memory storage element (e.g., a capacitor 220) with the respective digit line 210-*a*-11 (e.g., via a cell selection component 225 of the memory cell 105-*b*-111). In some examples, the read signal development portion 410 may include selectively coupling the respective digit line 210-*a*-11 with the signal development component 250-*a*-1 (e.g., via selection component 320-*a*-1, based on a selection signal $DLM_1$, or some other switching component). Charge may accordingly be shared between the memory cell 105-*b*-111 and the signal development component 250-*a*-1, and may settle after some time (e.g., according to a time constant behavior), with changes in voltage of the digit line 210-*a*-11 and the signal development line 255-*a*-1 that are based at least in part on the logic state stored by the memory cell 105-*b*-111.

In some examples, a read signal development portion 410 may include a delay (e.g., a delay portion, a delay duration) between developing a read signal (e.g., a read signal at a signal development component 250 reaching a steady state, a read signal reaching a maximum value at a signal development component 250) and providing the developed read signal (e.g., as maintained by the signal development component 250) to a sense amplifier 290. In other words, there may be a delay or inactivity period during read signal development portion 410 before initiating a latch signal generation portion 420, which in some examples may include a decay of a developed read signal (e.g., a decay of a maintained read signal). In some examples, a circuit 300 may be configured such that a duration of such a delay or inactivity period, or an amount of decay of a developed read signal, can be tolerated while still reliably detecting a logic state stored by a memory cell 105. In some examples, such functionality of the circuit 300 may be supported by refreshing operations of signal development components 250 that mitigate decay of developed read signals (e.g., maintaining cache signals at the signal development components 250). These and other configurations may support signal development components 250 performing a caching function (e.g., a caching of a developed read signal or cache signal for some amount of time) in the circuit 300.

In some examples, the charge sharing of the read signal development portion 410 may be associated with a destructive read operation (e.g., where the originally-stored logic state of the memory cell 105-*b*-111 is lost or otherwise degraded at the memory cell 105-*b*-111), and therefore may be followed by rewrite operations (e.g., the rewrite signal development portion 430). In some examples, a rewrite operation may not immediately follow a read signal development portion 410, such as when stored data is transferred to a signal development component 250, where it may be stored and further read, written, or modified. In various examples, data may be returned to a same memory cell 105 or a different memory cell 105, which may be associated with operations that make the signal development component 250 available for other operations. In some examples, the charge sharing of the read signal development portion 410 may be associated with a non-destructive read operation (e.g., where the originally-stored logic state of the memory cell 105-*b*-111 is maintained at the memory cell 105-*b*-111), and therefore may not be followed by rewrite operations (e.g., rewrite signal development portion 430 may be omitted).

The charge sharing of the read signal development portion 410 may be associated with a delay or latency known as a row-to-column address delay. In a DRAM application, data may be stored at a memory cell 105 as electrode charge, and may be relatively fast to respond (e.g., having a relatively low latency). In an FeRAM application, data may be stored at a memory cell 105 as a cell state in form of dipole orientation or polarization. The kinetics of such dipoles may be relatively slow (e.g., having a relatively high latency), which may lead to a longer sense time for FeRAM applications (e.g., longer than DRAM applications). Thus, in some examples (e.g., in an FeRAM application), the read signal development portion 410 may be associated with a relatively high latency or long duration (e.g., in comparison with a latch signal generation portion 420). In some FeRAM applications, for example, the latency associated with the operations of the read signal development portion 410 may be approximately 50 nanoseconds.

In some examples of the read signal development portion 410, the shunts 330-*a* associated with other memory cells 105-*b* of the domain 310-*a*-1, such as shunts 330-*a*-12 (not shown, which may be associated with a digit line 210-*a*-12 or a plate line 215-*a*-12) through 330-*a*-1*r*, may be selected or activated, which may equalize a bias across memory cells 105-*b* that are not being accessed (e.g., equalizing a bias between a digit line 210-*a*-12 and a plate line 215-*a*-12, equalizing a bias between a digit line 210-*a*-1*r* and a plate line 215-*a*-1*r*, and so on). In FeRAM applications, for example, such an equalization of bias may prevent or reduce a loss of data (e.g., due to charge leakage) of memory cells 105-*b* other than the memory cell 105-*b*-111 that is being accessed during the read signal development portion 410.

The latch signal generation portion 420 may be associated with a charge sharing between the signal development component 250-*a*-1 and the sense amplifier 290-*a*. The latch signal generation portion 420 may be an example of generating an output signal of the sense amplifier 290-*a* (e.g., an amplifier component) based at least in part on the developed signal at the signal development component 250-*a*-1 (e.g., the cell read signal). In some examples, generating the latch signal at the sense amplifier 290-*a* is associated with a second latency (e.g., a relatively low latency or short duration). The transition from the read signal development portion 410 to the latch signal generation portion 420 may include selectively coupling the signal development component 250-*a*-1 with the sense amplifier 290-*a*.

In some examples, selectively coupling the signal development component 250-*a*-1 with the sense amplifier 290-*a* may include a selection via the selection component 280-*a*, based on a logical selection signal SDCM. In some examples, selectively coupling the signal development component 250-*a*-1 with the sense amplifier 290-*a* may include a selective coupling via some other switching component (e.g., an isolation switching component) between the signal development component 250-*a*-1 and the sense amplifier 290-*a*. In some examples, the charge sharing of the latch signal generation portion 420 may be relatively rapid, and may take some fraction of the amount of time involved for the charge sharing between the memory cell 105-*b*-11 and the signal development component 250-*a*-1. In other words, the latch signal generation portion 420 may be shorter in duration than the read signal development portion 410. In some FeRAM applications, for example, the latency associated with the operations of the latch signal generation portion 420 may be approximately 5 to 10 nanoseconds.

In some examples, the latch signal generation portion 420 may include "firing" the sense amplifier 290-*a*, which may include selectively coupling one or more voltage sources with the sense amplifier 290-*a* (e.g., a low voltage source 293, a high voltage source 294). Thus, an output signal may be generated at the sense amplifier 290-*a* that is based at least in part on the cell read signal (e.g., based at least in part on the logic state stored by the memory cell 105-*b*-111). The output signal may be passed from the sense amplifier 290-*a* to another component of a memory device (e.g., an input/output component 160) via the I/O line 295 to provide an indication of the data stored by the memory cell 105-*b*-111. In some examples, the output signal or some other signal associated with the generated latch signal may also be passed back to, or otherwise shared with the signal development component 250-*a*-1, which in some examples may support a rewrite operation (e.g., following a destructive read operation). For example, based on the generated latch signal or output signal (e.g., based on whether the memory cell 105-*b*-111 stored a logic 0 or a logic 1), a rewrite signal may be passed or otherwise shared or generated with the signal development component 250-*a*-1 (e.g., via the signal development line 255-*a*-1) as part of the latch signal generation portion 420. In some examples, the generated latch signal or output signal may be passed back to the signal development component 250-*a*-1 to reinforce a charge or other signal maintained at the signal development component 250-*a*-1, which may support a rewrite operation on the memory cell 105-*b*-111.

In some examples of the latch signal generation portion 420, the shunts 330-*a* associated with other memory cells 105-*b* of the domain 310-*a*-1, such as shunts 330-*a*-12 (not shown, which may be associated with a digit line 210-*a*-12 or a plate line 215-*a*-12) through 330-*a*-1*r*, may be selected or activated, which may equalize a bias across memory cells 105-*b* that are not being accessed (e.g., equalizing a bias between a digit line 210-*a*-12 and a plate line 215-*a*-12, equalizing a bias between a digit line 210-*a*-1*r* and a plate line 215-*a*-1*r*, and so on). In FeRAM applications, for example, such an equalization of bias may prevent or reduce a loss of data (e.g., due to charge leakage) of memory cells 105-*b* other than the memory cell 105-*b*-111 that is being accessed during the latch signal generation portion 420.

The rewrite signal development portion 430 may be associated with a charge sharing between the memory cell 105-*b*-111, the digit line 210-*a*-11, and the signal development component 250-*a*-1. The rewrite signal development portion 430 may be an example of developing a cell access signal (e.g., a cell write signal, a cell rewrite signal) at or using the signal development component 250-*a*-1. In some cases, developing a cell access signal (e.g., a cell write signal, a cell rewrite signal) at or using the signal development component 250-*a*-1 may be based at least in part on a latch signal of the sense amplifier 290-*a* (e.g., as generated during the latch signal generation portion 420). In some examples, a cell access signal (e.g., a cell write signal, a cell rewrite signal) at or using the signal development component 250-*a*-1 may be based on a charge or voltage maintained at the signal development component 250-*a*-1 (e.g., based at least in part on the read signal development portion 410), where the charge or voltage maintained at the signal development component 250-*a*-1 may be indicative of the logic state originally stored by the memory cell 105-*b*-111. In some examples, the charge or voltage maintained at the signal development component 250-*a*-1 may be independent of the latch signal at the sense amplifier 290-*a*, or may be reinforced by the latch signal at the sense amplifier 290-*a* (e.g., as reinforced during the latch signal generation portion 420).

In some examples, developing the rewrite signal at the signal development component 250-*a*-1 is associated with a third latency (e.g., a relatively high latency or long duration), which may or may not be equal to the first latency. The transition from the latch signal generation portion 420 to the rewrite signal development portion 430 may include selectively decoupling or isolating the signal development component 250-*a*-1 from the sense amplifier 290-*a* (e.g., via the selection component 280-*a* or an isolation switching component). Although the rewrite signal development portion 430 may support rewriting a logic state to a memory cell 105 that has been discharged, depolarized, or otherwise destroyed or degraded in a read operation, in examples of non-destructive read operations (e.g., when 105-*b*-111 maintains a stored logic state after the read signal development portion 410), the rewrite signal development portion 430 may be omitted, and the latch signal generation portion 420 may be followed by another access operation (e.g., a read operation, a write operation, a refresh operation).

In various examples, a rewrite of the memory cell 105-*b*-111 during the rewrite signal development portion 430 may be performed or modified based on whether a rewrite signal is generated or otherwise provided by the sense amplifier 290-*a*, or based on whether a rewrite signal is generated or otherwise provided by a signal development component 250-*a*. For example, a rewrite operation of the rewrite signal development portion 430 may be performed without relying on a rewrite signal of the sense amplifier 290-*a*, such as when a signal development component 250-*a* is configured to locally maintain a charge or other state (e.g., cache state, signal state) associated with the originally-stored logic state of the memory cell 105-*b*-111 until it is transferred back to the memory cell 105-*b*-111 (e.g., providing a local caching function as related to rewrite operations). In other words, the read signal development portion 410 or latch signal generation portion 420 may or may not be "destructive" from the perspective of a signal development component 250-*a*, depending on whether the signal development component 250-*a* relies on a latch signal of the sense amplifier 290-*a* for rewriting the memory cell 105-*b*-111. In some examples (e.g., when a signal development component 250-*a* is configured to maintain a charge or other state indicative of an originally-stored logic state of the memory cell 105-*b*-111), the rewrite of the memory cell 105-*b*-111 may occur after some delay period (e.g., of the rewrite signal development portion 430) depending on a duration that the signal development component 250-*a*-1 is configured to maintain such a charge or other state, or a type of control logic that implements the write-back (e.g., first-in-first-out (FIFO), least-recently used (LRU), or others).

In some examples of a rewrite operation, the circuit 300 may be configured to couple the memory cell 105-*b*-111 with a high voltage source (e.g., a high voltage rail, via the signal development component 250-*a*-1), which may be a direct coupling by pull-up or pull-down circuitry (e.g., a transistor or other switching component of the signal development component 250-*a*-1). In some examples, the signal development component 250-*a*-1 may be configured with a capacitor or other charge storage component, and the latch signal generation portion 420 or the rewrite signal development portion 430 may include charging or refreshing the capacitor or other charge storage component with a charge that is sufficient to rewrite the memory cell 105-*b*-111 (e.g., during the rewrite signal development portion 430). Thus, in various examples, the signal development component 250-*a*-1 may rewrite the logic state to the memory cell 105-*b*-111, which may be performed while the signal development component 250-*a*-1 is selectively decoupled from the sense amplifier 290-*a*, so the sense amplifier 290-*a* is free to support operations with other signal development components 250-*a*.

The charge sharing of the rewrite signal development portion 430 may be associated with a delay or latency known as a row precharge delay, which may include fully or partially rewriting a logic state originally stored at the memory cell 105-*b*-111. For example, to rewrite a logic 0, the digit line 210-*a*-11 may be biased to a positive voltage (e.g., 1.5 V) and the plate line 215-*a*-11 may be biased to a ground or negative voltage (e.g., 0 V). To rewrite a logic 1, the digit line 210-*a*-11 may be biased to a ground or negative voltage (e.g., 0 V) and the plate line 215-*a*-11 may be biased to a positive voltage (e.g., 1.5 V). In some cases, the biasing of the digit line 210-*a*-11 and the plate line 215-*a*-11 may be based at least in part on the generated latch signal (e.g., prior to the sense amplifier 290-*a* being selectively isolated from the signal development component 250-*a*-1). For example, during the rewrite signal development portion 430, the signal development component 250-*a*-1 or the sense amplifier 290-*a* may bias the digit line 210-*a*-11 to either a positive voltage or a ground voltage based at least in part on the latch signal. In some cases, such a bias may be based on a charge or other state maintained at the signal development component 250-*a*-1, which may be independent of a generated latch signal (e.g., as generated using the sense amplifier 290-*a*).

In a DRAM application, data may be written at a memory cell 105 as electrode charge, and may be relatively fast to respond (e.g., a relatively low latency). In an FeRAM application, data may be written at a memory cell 105 as cell state in form of dipole orientation or polarization. The kinetics of such dipoles may be relatively slow (e.g., a relatively high latency), which may lead to a longer write time for FeRAM applications (e.g., longer than DRAM application). Thus, in some examples (e.g., in an FeRAM application), the rewrite signal development portion 430 may be associated with a relatively high latency or long duration (e.g., in comparison with a latch signal generation portion 420). At the end of the rewrite signal development portion 430, all of the digit lines 210-*a*-11 and all of the plate lines 215-*a* of the domain 310-*a*-1 may be biased with a ground voltage, effectively equalizing a bias across each of the memory cells 105-*b* of the domain 310-*a*-11, which may support maintaining logic states stored by the memory cells 105-*b* over time.

In some examples, the shunts 330-*a* associated with other memory cells 105-*b* of the domain 310-*a*-1, such as shunts 330-*a*-12 (not shown, which may be associated with a digit line 210-*a*-12 or a plate line 215-*a*-12) through 330-*a*-1*r*, may be selected or activated during the rewrite signal development portion 430, which may equalize a bias across memory cells 105-*b* that are not being accessed (e.g., equalizing a bias between a digit line 210-*a*-12 and a plate line 215-*a*-12, equalizing a bias between a digit line 210-*a*-1*r* and a plate line 215-*a*-1*r*, and so on). Such an equalization of bias may prevent or reduce a loss of data (e.g., due to charge leakage) of memory cells 105-*b* other than the memory cell 105-*b*-111 that is being rewritten during the rewrite signal development portion 430.

The read operation 400 may be associated with the reading of a single memory cell 105-*b*-11 having a total duration of $t_{A1}$-$t_{A0}$, which includes the read signal development portion 410, the latch signal generation portion 420, and the rewrite signal development portion 430 for reading the single memory cell 105-*b*-111. In examples where the read operation 400 does not employ multiplexed signal development techniques (e.g., a sequence of read operations 400 that use the same signal development component 250), a subsequent read operation that employs the sense amplifier 290-*a* may follow the rewrite signal development portion 430. Thus, performing multiple read operations 400 (e.g., reading multiple memory cells 105-*b*) using a same signal development component 250 may involve integer multiples of the duration $t_{A1}$-$t_{A0}$ (e.g., at least 2*($t_{A1}$-$t_{A0}$) to read two memory cells 105-*b*). However, multiplexing signal development components 250-*a* (e.g., via the selection component 280-*a*) may reduce the amount of time involved for the sense amplifier 290-*a* to read multiple memory cells 105-*b*.

Figure 4B:
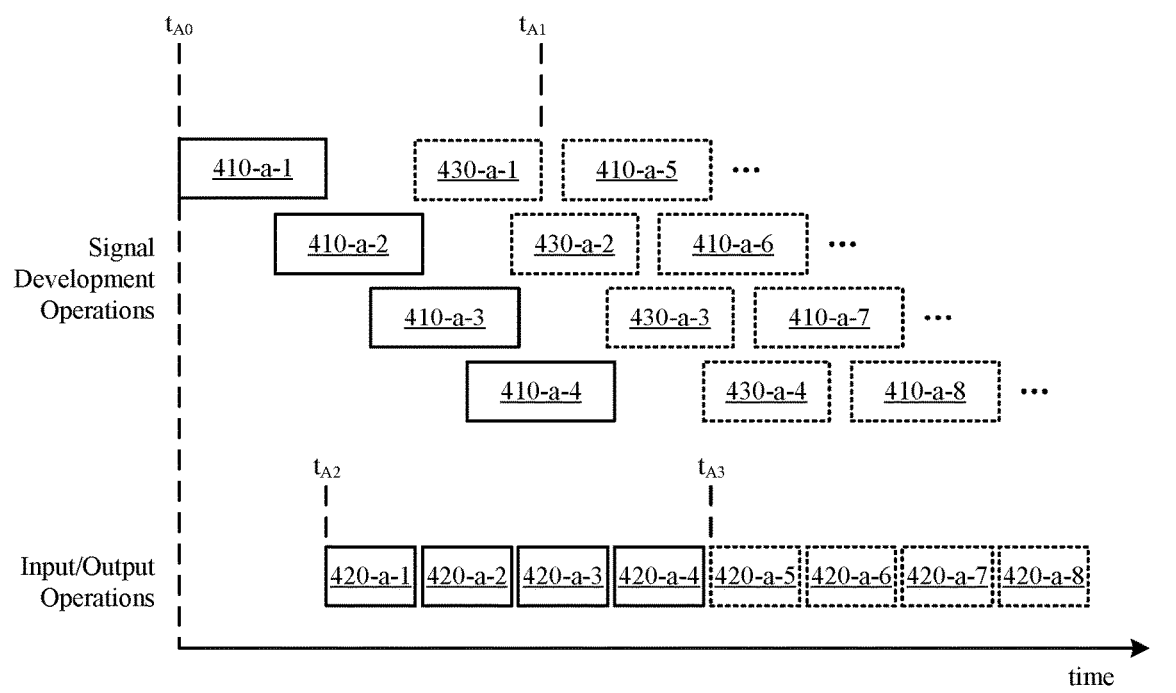

FIG. 4B illustrates an example of a read operation 450 that supports signal development caching in a memory device in accordance with examples as disclosed herein. The read operation 450 may illustrate portions (e.g., time intervals) of an access operation (e.g., a multi-cell access operation) that are associated with generating cell access signals (e.g., cell read signals, cell write signals) and latch signals when accessing four memory cells 105 (e.g., via four signal development components 250). For example, the read operation 450 may be divided into read signal development portions 410-*a*, latch signal generation portions 420-*a*, and rewrite signal development portions 430-*a* for each of a set of memory cells 105-*b*, which may be examples of corresponding portions described with reference to FIG. 4A. The read operation 450 may employ circuitry that supports multiplexed signal development, such as the circuit 300 described with reference to FIG. 3. The read operation 450 illustrates an example of separating signal development operations from input/output operations, which may improve data throughput in a memory device.

As an illustrative example, the read operation 450 is described with reference to reading a logic state stored by four memory cells 105-*b* of four different domains 310-*a*, where each of the different domains is associated with a respective signal development component 250-*a* that is multiplexed with the sense amplifier 290-*a*. Read signal development portion 410-*a*-1, latch signal generation portion 420-*a*-1, and rewrite signal development portion 430-*a*-1 may refer to, for example, a read operation of memory cell 105-*b*-111 (e.g., of a domain 310-*a*-1, associated with a signal development component 250-*a*-1). Read signal development portion 410-*a*-2, latch signal generation portion 420-*a*-2, and rewrite signal development portion 430-*a*-2 may refer to, for example, a read operation of a memory cell 105-*b*-211 (e.g., of a domain 310-*a*-2, not shown, which may be associated with a signal development component 250-*a*-2). Read signal development portion 410-*a*-3, latch signal generation portion 420-*a*-3, and rewrite signal development portion 430-*a*-3 may refer to, for example, a read operation of a memory cell 105-*b*-311 (e.g., of a domain 310-*a*-3, not shown, which may be associated with a signal development component 250-*a*-3). Read signal development portion 410-*a*-4, latch signal generation portion 420-*a*-4, and rewrite signal development portion 430-*a*-4 may refer to, for example, a read operation of a memory cell 105-*b*-411 (e.g., of a domain 310-*a*-4, not shown, which may be associated with a signal development component 250-*a*-4). Each of the signal development components 250-*a*-1, 250-*a*-2, 250-*a*-3, and 250-*a*-4 may be selectively coupled with the same sense amplifier 290-*a* via a selection component 280-*a* (e.g., based on a logical selection signal SDCM).

Each of the read signal development portions 410-*a* may be associated with charge sharing between a respective memory cell 105-*b*, a respective digit line 210-*a* and a respective signal development component 250-*a*, which may occur during overlapping time intervals. The read signal development portions 410-*a* may be examples of developing a signal (e.g., a cell read signal, a cache signal, a signal state) at a signal development component 250-*a* of a plurality of signal development components 250-*a* based at least in part on selectively coupling the signal development component 250-*a* with a memory cell 105-*b* of the plurality of memory cells 105-*b*. The read signal development portion 410-*a*-1 may be an example of coupling (e.g., via the selection component 280-*a*, via the selection component 320-*a*-1), during a first time interval (e.g., and based at least in part on determining to access the memory cell 105-*b*-111), the memory cell 105-*b*-111 (e.g., a first memory cell) with the signal development component 250-*a*-1 (e.g., a first signal development component), and the read signal development portion 410-*a*-2 may be an example of coupling (e.g., via the selection component 280-*a*, via a selection component 320-*a*-2), during a second time interval that overlaps the first time interval (e.g., and based at least in part on determining to access the memory cell 105-*b*-211), the memory cell 105-*b*-211 (e.g., a second memory cell) with the signal development component 250-*a*-2 (e.g., a second signal development component).

Charge may accordingly be shared between the memory cell 105-*b*-111 and the signal development component 250-*a*-1, between the memory cell 105-*b*-211 and the signal development component 250-*a*-2, between the memory cell 105-*b*-311 and the signal development component 250-*a*-3, and between the memory cell 105-*b*-411 and the signal development component 250-*a*-4. In other words, charge may be shared via the signal development components 250-*a*-1 through 250-*a*-4 during overlapping time intervals. In some examples, developing the cell read signals at the signal development components 250-*a*-1 through 250-*a*-4 is associated with a first latency (e.g., a relatively high latency or long duration).

In some examples of the read signal development portions 410-*a*, the shunts 330-*a* associated with other memory cells 105-*b* of the respective domain 310-*a* may be selected or activated, which may equalize a bias across memory cells 105-*b* that are not being accessed. For example, for domain 310-*a*-1, during the read signal development portion 410-*a*-1, a bias between a digit line 210-*a*-12 and a plate line 215-*a*-12 may be equalized via a shunt 330-*a*-12, a bias between a digit line 210-*a*-13 and a plate line 215-*a*-13 may be equalized via a shunt 330-*a*-13, and so on. In FeRAM applications, for example, such an equalization of bias may prevent or reduce a loss of data (e.g., due to charge leakage) of memory cells 105-*b* other than the memory cell 105-*b* that is being accessed during the respective read signal development portions 410.

The latch signal generation portions 420-*a* may be associated with a charge sharing between respective ones of the signal development components 250-*a*-1 and the sense amplifier 290-*a*, which may occur over non-overlapping time intervals. The latch signal generation portions 420-*a* may each be an example of generating an output signal of the sense amplifier 290-*a* based at least in part on the developed signal at the respective signal development component 250-*a* (e.g., based on the cell read signal, cache signal, or signal state). In some examples, generating the latch signal at the sense amplifier 290-*a* is associated with a second latency (e.g., a relatively low latency or short duration). The transition from a read signal development portion 410 to the corresponding latch signal generation portion 420-*a* may include selectively coupling the respective signal development component 250-*a* with the sense amplifier 290-*a*.

The latch signal generation portion 420-*a*-1 may be an example of coupling (e.g., via the selection component 280-*a*), during a third time interval subsequent to the first time interval, the signal development component 250-*a*-1 (e.g., the first signal development component) with the sense amplifier 290-*a*. In some examples, the third time interval may at least partially overlap the second time interval, or the third time interval may be within the second time interval. The latch signal generation portion 420-*a*-2 may be an example of coupling (e.g., via the selection component 280-*a*), during a fourth time interval subsequent to the second time interval (e.g., and subsequent to the third time interval), the signal development component 250-*a*-2 (e.g., the second signal development component) with the sense amplifier 290-*a*.

The latch signal generation portions 420-*a*-1 through 420-*a*-4 may be performed according to a sequence, which may be based at least in part on the sequence of signal development components selected or otherwise indicated by the logical selection signal SDCM. In some examples, each of the latch signal generation portions 420-*a* may be separated by a gap or delay period (e.g., the period between the latch signal generation portion 420-*a*-1 and the latch signal generation portion 420-*a*-2), which may be associated with a gap or delay of the selection component 280-*a*, a gap or delay associated with changing a value of the logical selection signal SDCM, or a period during which no signal development components 250-*a* are coupled with the sense amplifier 290-*a*. In other words, an access operation may include a gap or delay period between when one signal development component 250-*a* is selectively decoupled from the sense amplifier 290-*a* and another signal development component 250-*a* is selectively coupled with the sense amplifier 290-*a*. In other examples, such decoupling and coupling may be configured to occur simultaneously.

In some examples, the latch signal generation portions 420-*a* may include "firing" the sense amplifier 290-*a*, which may include selectively coupling one or more voltage sources with the sense amplifier 290-*a* (e.g., a low voltage source 293, a high voltage source 294). Thus, according to the sequence of latch signal generation portions 420-*a*-1 through 420-*a*-4, a sequence of output signals may be generated at the sense amplifier 290-*a* that is based at least in part on the respective sequence of cell read signals (e.g., according to the sequence or read signal development portions 410-*a*-1 through 410-*a*-4, based at least in part on the logic states stored by the accessed memory cells 105-*b*-111 through 105-*b*-411).

The output signals may be passed from the sense amplifier 290-*a* to another component of a memory device (e.g., an input/output component 160) via the I/O line 295 to provide an indication of the data stored by the memory cells 105-*b*. In some examples, the output signals or some other signals associated with the generated latch signals may also be passed back to, or otherwise shared with the signal development components 250-*a*-1 through 250-*a*-4, which in some examples may support rewrite operations (e.g., following a destructive read operation). For example, based on the generated latch signal or output signal (e.g., based on whether the memory cells 105-*b* stored a logic 0 or a logic 1), a rewrite signal may be passed or otherwise shared with the respective one of signal development components 250-*a*-1 through 250-*a*-4 as part of the latch signal generation portions 420.

In some examples of the latch signal generation portions 420-*a*, the shunts 330-*a* associated with other memory cells 105-*b* of the respective domain 310-*a* may be selected or activated, which may equalize a bias across memory cells 105-*b* that are not being accessed. For example, for domain 310-*a*-1, during the latch signal generation portion 420-*a*-1, a bias between a digit line 210-*a*-12 and a plate line 215-*a*-12 may be equalized via a shunt 330-*a*-12, a bias between a digit line 210-*a*-13 and a plate line 215-*a*-13 may be equalized via a shunt 330-*a*-13, and so on. In FeRAM applications, for example, such an equalization of bias may prevent or reduce a loss of data (e.g., due to charge leakage) of memory cells 105-*b* other than the memory cell 105-*b* that is being accessed during the respective latch signal generation portions 420.

The rewrite signal development portions 430-*a* may be associated with a charge sharing between the respective one of the memory cells 105-*b*, the respective one of the digit lines 210-*a*, and the respective one of the signal development components 250-*a*. The rewrite signal development portions 430-*a* may each be an example of developing a cell access signal (e.g., a cell write signal, a cell rewrite signal) at a signal development component 250-*a* based at least in part on a latch signal of the sense amplifier 290-*a*, or may be independent of a latch signal of the sense amplifier 290-*a*. In some examples, developing the rewrite signals at the signal development components 250-*a*-1 is associated with a third latency (e.g., a relatively high latency or long duration), which may or may not be equal to the first latency. The transition from a latch signal generation portion 420-*a* to a corresponding rewrite signal development portion 430-*a* may include selectively isolating the respective signal development component 250-*a* from the sense amplifier 290-*a* (e.g., via the selection component 280-*a* or another isolation switching component). Although the rewrite signal development portions 430-*a* may support rewriting logic states to memory cell 105 that have been discharged, depolarized, or otherwise destroyed or degraded in a read operation, in examples of non-destructive read operations, the rewrite signal development portions 430-*a* (e.g., associated with a charge sharing between a signal development component and a memory cell) may be omitted.

In some examples of the rewrite signal development portions 430-*a*, the shunts 330-*a* associated with other memory cells 105-*b* of the respective domain 310-*a* may be selected or activated, which may equalize a bias across memory cells 105-b that are not being accessed. For example, for domain 310-a-1, during the rewrite signal development portion 430-a-1, a bias between a digit line 210-a-12 and a plate line 215-a-12 may be equalized via a shunt 330-a-12, a bias between a digit line 210-a-13 and a plate line 215-a-13 may be equalized via a shunt 330-a-13, and so on. Such an equalization of bias may prevent or reduce a loss of data (e.g., due to charge leakage) of memory cells 105-b other than the memory cell 105-b that is being accessed during the rewrite signal development portions 430-a.

Like the read operation 400, the read operation 450 may also be associated with the reading of a single memory cell 105 (e.g., via the sense amplifier 290-a) having a total duration of $t_{41}$-$t_{40}$, which may include the read signal development portion 410-a-1, the latch signal generation portion 420-a-1, and the rewrite signal development portion 430-a-1 for reading the single memory cell 105-b-111. However, by employing multiplexed signal development as disclosed herein, performing multiple read operations via the same sense amplifier 290-a may not take an integer multiple of the duration of $t_{41}$-$t_{40}$ (e.g., where the integer multiple may correspond to the quantity of memory cells 105-b being accessed in parallel). Rather, by generating cell access signals (e.g., cache signals, signal states) in overlapping time intervals (e.g., the time intervals of read signal development portions 410-a or rewrite signal development portions 430-a of the signal development component 250-a-1 that overlap with the time intervals of a read signal development portions 410-a or rewrite signal development portions 430-a of the signal development component 250-a-2, and so on), the multiple memory cells 105-b may be read in a shorter time than such an integer multiple. In other words, in accordance with the described techniques for multiplexed signal development, the sense amplifier 290-a may support reading the four memory cells 105-b in a duration of $t_{43}$-$t_{42}$, a duration which may be shorter than $4*(t_{41}$-$t_{40})$ (e.g., shorter than the corresponding integer multiple of a duration for reading a single memory cell 105-b).

In one example, the rewrite signal development portions 430-a-1, 430-a-2, 430-a-3, and 430-a-4 of a first set of reads may be followed by read signal development portions 410-a-5, 410-a-6, 410-a-7, and 410-a-8, respectively, of a second set of reads. The first set of reads may be associated with a first digit line index (e.g., a value of "1" as indicated by logical selection signals $DLM_1$, $DLM_2$, $DLM_3$, and $DLM_4$), and the second set of reads may be associated with a second digit line index (e.g., a value of "2" as indicated by logical selection signals $DLM_1$, $DLM_2$, $DLM_3$, and $DLM_4$). Or, more generally, the first set of reads and the second set of reads may differ based at least in part on selected digit lines 210-a of the read operations.

In some examples (e.g., where selection components 320-a across domains 310-a are independently controllable, where logical selection signals DLM across domains 310-a are independently controllable), a new digit line 210-a may be selected for a signal development component 250 (e.g., via a selection component 320-a) as soon as a rewrite signal development portion 430 is complete for the same signal development component 250. In other words, as illustrated in the example of operation 450, a rewrite signal development portion 430-a of a first set of reads may overlap in time with a read signal development portion 410-a of a second set of reads for signal development components 250-a that are multiplexed with the same sense amplifier 290-a (e.g., the read signal development portion 410-a-5 overlapping the rewrite signal development portion 430-a-4). Thus, the periodicity for reading four memory cells 105 in the example of operation 450 where domains 310-a-1 through 310-a-4 are independently controllable may be illustrated by the time $t_{43}$-$t_{42}$, which in some examples may be equal or nearly equal to the time $t_{41}$-$t_{40}$, or $t_{41}$-$t_{40}$ plus some delay or gap period (e.g., associated with the selection of a new digit line 210-a via a selection component 320-a), or some other duration that is based on the overall duration associated with a read operation (e.g., $t_{41}$-$t_{40}$), the respective latencies of sub-operations (e.g., relative durations of read signal development portions 410, latch signal generation portions 420, rewrite signal development portions 430), and the degree of multiplexing (e.g., a quantity of signal development components 250-a that are multiplexed with the sense amplifier 290-a).

In some examples, a subsequent read may be performed on a memory cell 105-b that is coupled with a different digit line 210-a than a preceding read operation, but is coupled with a same activated word line 205-a, which may reduce latency. For example, maintaining a selected word line 205-a may eliminate a word line deselection operation and a subsequent word line selection operation. Such examples may be accompanied by shunting a digit line 210-a associated with the earlier read operation (e.g., a digit line 210-a that was previously un-shunted), and un-shunting a digit line 210-a associated with the later read operation (e.g., a digit line 210-a that was shunted during the earlier write operation).

In another example, not shown, a set of reads may be associated with a first common word line (e.g., where logical word lines $WL_{11}$, $WL_{21}$, $WL_{31}$, and $WL_{41}$ are simultaneously activated), and a second set of reads may be associated with a second common word line (e.g., where logical word lines $WL_{12}$, $WL_{22}$, $WL_{32}$, and $WL_{42}$ are simultaneously activated). Or, more generally, the first set of reads and the second set of reads may differ based at least in part on a selected common word line 205-a of the read operations. In some examples (e.g., where word lines 205-a across domains 310-a are not independently controllable), a new word line 205-a may be selected as soon as a latch signal generation portion 420 is complete or a rewrite signal development portion 430 is complete for all of the multiplexed signal development components 250-a (e.g., associated with the sense amplifier 290-a, or other set of domains 310-a that are not independently controllable). In other words, in some examples, a latch signal generation portion 420 or a rewrite signal development portion 430 of a first set of reads may not overlap in time with a read signal development portion 410 of a second set of reads for signal development components multiplexed with the same sense amplifier 290-a.

For example, when word lines 205-a are not independently controllable across domains 310-a-1 through 310-a-4, the read signal development portion 410-a-5 may follow or be otherwise subsequent to the rewrite signal development portion 430-a-4. Thus, the periodicity for reading four memory cells 105 in the example where the domains 310-a are not independently controllable may be equal to or nearly equal to the combined time of one read signal development portion 410-a, each of the latch signal generation portions 420-a-1 through 420-a-4 for the multiplexed signal development components 250-a-1 through 250-a-4, and one rewrite signal development portion 430-a, plus any relevant delay or gap periods (e.g., associated with the selection of a new word line 205-a, or the selection of new signal development components 250-*a* via a selection component 280-*a*). Accordingly, in some examples, such a periodicity where domains 310-*a* are not independently controllable may be longer than the periodicity illustrated by time $t_{42}$-$t_{40}$.

Thus, in accordance with various examples as disclosed herein, the advantages provided by the described signal development multiplexing (e.g., a reduced latency when accessing multiple memory cells 105-*b* in parallel) may scale with the relative difference in latency (e.g., durations) of read signal development portions 410, latch signal generation portions 420, and rewrite signal development portions 430. The advantages provided by the described signal development multiplexing may also depend on whether domains 310-*a* are configured to be independently controllable, or are controlled via common access lines or common logical signals.

Although the techniques of read operation 450 are described with reference to a single sense amplifier 290-*a*, the techniques of read operation 450 may be repeated for each sense amplifier 290 of a sense amplifier array, including various operations being performed concurrently (e.g., in parallel, with simultaneous or offset initiation or triggering), to support further pipelining of read operations in a memory device 100. For example, the read operation 450, or another read operation performed concurrently with or offset from the read operation 450, may include signal development operations including read signal development portions 410-*b*-1, 410-*b*-2, 410-*b*-3, and 410-*b*-4 (not shown) associated with a different sense amplifier 290 (e.g., of a same sense amplifier array). In some examples, a read signal development portion 410-*b*-1 may be initiated at the same time as, or otherwise performed concurrently with or offset from, the read signal development portion 410-*a*-1 (e.g., according to a simultaneous accessing of multiple memory cells of a row, a domain, or a subdomain, according to concurrent signal exchange with a cacheline). Likewise, a read signal development portion 410-*b*-2 may be initiated at the same time as, or otherwise performed concurrently with or offset from, the read signal development portion 410-*a*-2, and so on.

Further, the read operation 450, or another read operation performed concurrently with the read operation 450, may include input/output operations including latch signal generation portions 420-*b*-1, 420-*b*-2, 420-*b*-3, and 420-*b*-4 (not shown) associated with a different sense amplifier 290 (e.g., of a same sense amplifier array). In some examples, a latch signal generation portion 420-*b*-1 may be initiated at the same time as, or otherwise performed concurrently with or offset from, the latch signal generation portion 420-*a*-1 (e.g., according to a simultaneous sensing at a sense amplifier array, according to a simultaneous latching at a set of latches of a sense component or I/O component, according to concurrent signal exchange with a cacheline). Likewise, a latch signal generation portion 420-*b*-2 may be initiated at the same time as, or otherwise performed concurrently with or offset from, the latch signal generation portion 420-*a*-2, and so on. Although described in the context of two parallel reads associated with two different sense amplifiers 290, the described techniques may be applied to any quantity of parallel reads. For example, to support a 64-bit information transfer scheme, 64 parallel reads may be performed using 64 sense amplifiers 290 in accordance with examples as disclosed herein.

Figure 5A:
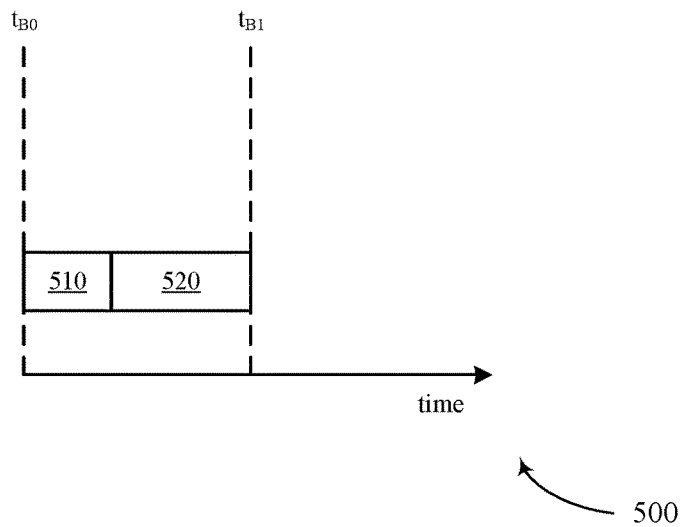
FIGS. 5A and 5B illustrate examples of write operations that support signal development caching in a memory device in accordance with examples as disclosed herein.

FIG. 5A illustrates an example of a write operation 500 that supports signal development caching in a memory device in accordance with examples as disclosed herein. The write operation 500 may illustrate portions (e.g., time intervals) of an access operation that are associated with generating latch signals and cell access signals (e.g., cell write signals) when accessing a memory cell 105. For example, the write operation 500 may be divided into a latch signal generation portion 510 and a write signal development portion 520 (e.g., a cell write portion). The write operation 500 may employ circuitry that supports multiplexed signal development, such as the circuit 300 described with reference to FIG. 3. As an illustrative example, the write operation 500 is described with reference to writing a logic state to the memory cell 105-*b*-111 of the circuit 300, but the write operation 500 may be illustrative of operations that may be performed on any one or more of the memory cells 105-*b* of the circuit 300.

The latch signal generation portion 510 may be associated with a charge sharing between the signal development component 250-*a*-1 and the sense amplifier 290-*a*. The latch signal generation portion 510 may be an example of generating a latch signal at the sense amplifier 290-*a* or the signal development component 250-*a*-1 (e.g., a cache signal, a signal state) based at least in part on a write command or write signal (e.g., from an input/output component 160 or a memory controller 170) received via I/O line 295-*a*. In some examples, generating the latch signal at the sense amplifier 290-*a* or the signal development component 250-*a*-1 is associated with a fourth latency (e.g., a relatively low latency or short duration), which may be the same as or different than the second latency of the latch signal generation portions 420 described with reference to read operations 400 and 450.

The latch signal generation portion 510 may include selectively coupling the signal development component 250-*a*-1 with the sense amplifier 290-*a* (e.g., at the beginning of the latch signal generation portion 510, or at another time after other operations of the latch signal generation portion 510 such as after receiving a write command or write signal via I/O line 295-*a*). In some examples, selectively coupling the signal development component 250-*a*-1 with the sense amplifier 290-*a* may include a selection via the selection component 280-*a*, based on a logical selection signal SDCM. In some examples, selectively coupling the signal development component 250-*a*-1 with the sense amplifier 290-*a* may include a selective coupling via some other switching component (e.g., an isolation switching component) between the signal development component 250-*a*-1 and the sense amplifier 290-*a*.

In some examples, the latch signal generation portion 510 may include "firing" the sense amplifier 290-*a*, which may include selectively coupling one or more voltage sources with the sense amplifier 290-*a* (e.g., a low voltage source 293, a high voltage source 294). Thus, a latch signal may be generated at the sense amplifier 290-*a* that is based at least in part on a write command or write signal (e.g., received via the I/O line 295-*a*). The generated latch signal or some other signal associated with the generated latch signal may be passed to, or otherwise shared with the signal development component 250-*a*-1 (e.g., storing a cache signal or signal state at a cache element of the signal development component 250-*a*-1) to support the writing of the memory cell 105-*b*-111. For example, based on the generated latch signal (e.g., based on whether the memory cell 105-*b*-111 is to store a logic 0 or a logic 1), a write signal may be passed or otherwise shared or generated with the signal development component 250-*a*-1 (e.g., via the signal development line 255-*a*-1) as part of the latch signal generation portion 510.

The write signal development portion 520 may be associated with a charge sharing between the memory cell 105-*b*-111, the digit line 210-*a*-11, and the signal development component 250-a-1. The write signal development portion 520 may be an example of developing a cell access signal (e.g., a cell write signal) at or using the signal development component 250-a-1 based at least in part on a latch signal of the sense amplifier 290-a. In some examples, developing the write signal at the signal development component 250-a-1 is associated with a fifth latency (e.g., a relatively high latency or long duration), which may or may not be equal to the third latency of the rewrite signal development portions 430 described with reference to read operations 400 and 450. The transition from the latch signal generation portion 510 to the write signal development portion 520 may include selectively decoupling or isolating the signal development component 250-a-1 from the sense amplifier 290-a (e.g., via the selection component 280-a or an isolation switching component).

In some examples of a write operation, the circuit 300 may be configured to couple the memory cell 105-b-111 with a high voltage source (e.g., a high voltage rail, via the signal development component 250-a-1), which may be a direct coupling by pull-up or pull-down circuitry (e.g., a transistor or other switching component of the signal development component 250-a-1). In some examples, the signal development component 250-a-1 may be configured with a capacitor or other charge storage component, and the latch signal generation portion 510 or the write signal development portion 520 may include charging or refreshing the capacitor or other charge storage component with a charge that is sufficient to rewrite the memory cell 105-b-111 (e.g., during the write signal development portion 520). Thus, in various examples, the signal development component 250-a-1 may write the logic state to the memory cell 105-b-111, which may be performed while the signal development component 250-a-1 is selectively decoupled from the sense amplifier 290-a, so the sense amplifier 290-a is free to support operations with other signal development components 250-a.

The charge sharing of the write signal development portion 520 may also be associated with a delay or latency known as a row precharge delay, which may include writing a logic state to the memory cell 105-b-111 based on a write command. For example, to write a logic 0, the digit line 210-a-11 may be biased to a positive voltage (e.g., 1.5 V) and the plate line 215-a-11 may be biased to a ground or negative voltage (e.g., 0 V). To write a logic 1, the digit line 210-a-11 may be biased to a ground or negative voltage (e.g., 0 V) and the plate line 215-a-11 may be biased to a positive voltage (e.g., 1.5 V). The biasing of the digit line 210-a-11 and the plate line 215-a-11 may be based at least in part on the generated latch signal (e.g., prior to the sense amplifier 290-a being selectively isolated from the signal development component 250-a-1). For example, during the write signal development portion 520, the signal development component 250-a-1 may bias the digit line 210-a-11 to either a positive voltage or a ground voltage based at least in part on the latch signal (e.g., based at least in part on a write command). At the end of the write signal development portion 520, all of the digit lines 210-a-11 and all of the plate lines 215-a of the domain 310-a-1 may be biased with a ground voltage, effectively equalizing a bias across each of the memory cells 105-b of the domain 310-a-11, which may support maintaining logic states stored by the memory cells 105-b over time.

In some examples, the shunts 330-a associated with other memory cells 105-b of the domain 310-a-1, such as shunts 330-a-12 through 330-a-1r, may be selected or activated during the write signal development portion 520, which may equalize a bias across memory cells 105-b that are not being accessed (e.g., equalizing a bias between a digit line 210-a-12 and a plate line 215-a-12, equalizing a bias between a digit line 210-a-1r and a plate line 215-a-1r, and so on). Such an equalization of bias may prevent or reduce a loss of data (e.g., due to charge leakage) of memory cells 105-b other than the memory cell 105-b-111 that is being written during the write signal development portion 520.

The write operation 500 may be associated with the writing of a single memory cell 105-b-11 having a total duration of $t_{B1}$-$t_{B0}$, which includes the latch signal generation portion 510, and the write signal development portion 520 for writing the single memory cell 105-b-111. In examples where the write operation 500 does not employ multiplexed signal development techniques (e.g., a sequence of write operations 500 that use the same signal development component 250), a subsequent write operation that employs the sense amplifier 290-a may follow the write signal development portion 520. Thus, performing multiple write operations 500 (e.g., writing multiple memory cells 105-b) using a same signal development component 250 may involve integer multiples of the duration $t_{B1}$-$t_{B0}$ (e.g., at least 2*($t_{B1}$-$t_{B0}$) to read two memory cells 105-b). However, multiplexing signal development components 250-a (e.g., via the selection component 280-a) may reduce the amount of time involved for the sense amplifier 290-a to write multiple memory cells 105-b.

Figure 5B:
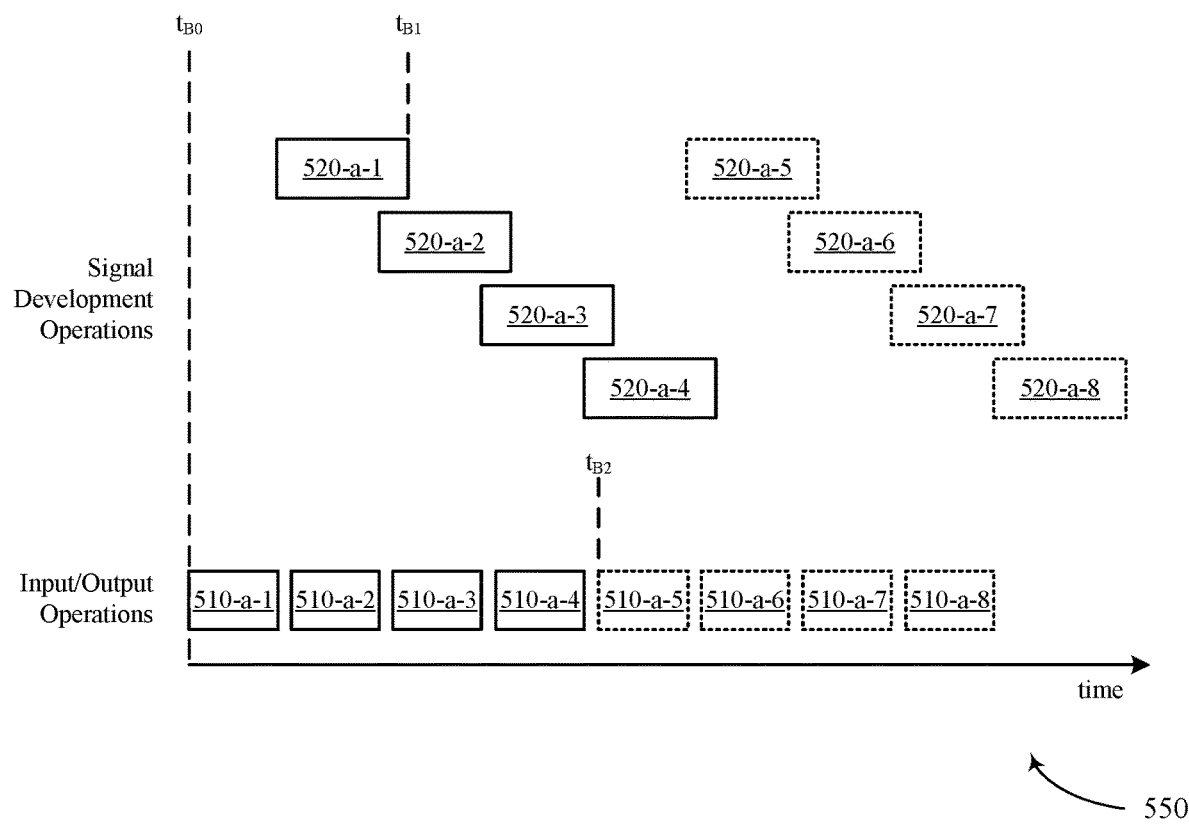

FIG. 5B illustrates an example of a write operation 550 that supports signal development caching in a memory device in accordance with examples as disclosed herein. The write operation 550 may illustrate portions (e.g., time intervals) of an access operation (e.g., a multi-cell access operation) that are associated with generating latch signals and cell access signals (e.g., cell write signals) when accessing four memory cells 105 (e.g., via four signal development components 250). For example, the write operation 550 may be divided into latch signal generation portions 510-a and write signal development portions 520-a for each of a set of memory cells 105-b, which may be examples of corresponding portions described with reference to FIG. 5A. The write operation 550 may employ circuitry that supports multiplexed signal development, such as the circuit 300 described with reference to FIG. 3. The write operation 550 illustrates an example of separating signal development operations from input/output operations, which may improve data throughput in a memory device.

As an illustrative example, the write operation 550 is described with reference to writing a logic state to four memory cells 105-b of four different domains 310-a, where each of the different domains is associated with a respective signal development component 250-a that is multiplexed with the sense amplifier 290-a. Latch signal generation portion 510-a-1 and write signal development portion 520-a-1 may refer to, for example, a write operation of memory cell 105-b-111 (e.g., of a domain 310-a-1, associated with a signal development component 250-a-1). Latch signal generation portion 510-a-2 and write signal development portion 520-a-2 may refer to, for example, a write operation of a memory cell 105-b-211 (e.g., of a domain 310-a-2, not shown, associated with a signal development component 250-a-2). Latch signal generation portion 510-a-3 and write signal development portion 520-a-3 may refer to, for example, a write operation of a memory cell 105-b-311 (e.g., of a domain 310-a-3, not shown, associated with a signal development component 250-a-3). Latch signal generation portion 510-a-4 and write signal development portion 520-a-4 may refer to, for example, a write operation of a memory cell 105-*b*-411 (e.g., of a domain 310-*a*-4, not shown, associated with a signal development component 250-*a*-4). Each of the signal development components 250-*a*-1, 250-*a*-2, 250-*a*-3, and 250-*a*-4 may be selectively coupled with a same sense amplifier 290-*a* via a selection component 280-*a* (e.g., based on a logical selection signal SDCM).

Each of the latch signal generation portions 510-*a* may be associated with a charge sharing between respective ones of the signal development components 250-*a*-1 and the sense amplifier 290-*a*, which may occur over non-overlapping time intervals. The latch signal generation portions 510-*a* may each be an example of generating a signal (e.g., a cache signal, a signal state) at a signal development component 250-*a* based at least in part on selectively coupling the signal development component 250-*a* with the sense amplifier 290-*a* (e.g., an amplifier component). In some examples, such a signal may be generated based at least in part on a write command or write signal. In some examples, generating a latch signal, cache signal, or signal state is associated with a fourth latency (e.g., a relatively low latency or short duration).

The latch signal generation portion 510-*a*-1 may be an example of coupling (e.g., via the selection component 280-*a*), during a first time interval and based at least in part on determining to access the memory cell 105-*b*-111 (e.g., a first memory cell), the signal development component 250-*a*-1 (e.g., a first signal development component) with the sense amplifier 290-*a* (e.g., an amplifier component). The latch signal generation portion 510-*a*-2 may be an example of coupling (e.g., via the selection component 280-*a*), during a second time interval subsequent to the first time interval and based at least in part on determining to access the memory cell 105-*b*-211 (e.g., a second memory cell), the signal development component 250-*a*-2 (e.g., a second signal development component) with the sense amplifier 290-*a*.

The latch signal generation portions 510-*a*-1 through 510-*a*-4 may be performed according to a sequence, which may be based at least in part on a sequence of memory cell write commands or signals (e.g., as received via I/O line 295-*a*). Such a sequence may also correspond to the sequence of signal development components 250-*a* selected or otherwise indicated by the logical selection signal SDCM. In some examples, each of the latch signal generation portions 510-*a* may be separated by a gap or delay period (e.g., the period between the latch signal generation portion 510-*a*-1 and the latch signal generation portion 510-*a*-2), which may be associated with a gap or delay of the selection component 280-*a*, a gap or delay associated with changing a value of the logical selection signal SDCM, or a period during which no signal development components 250-*a* are coupled with the sense amplifier 290-*a*. In other words, an access operation may include a gap or delay period between when one signal development component 250-*a* is selectively decoupled from the sense amplifier 290-*a* and another signal development component 250-*a* is selectively coupled with the sense amplifier 290-*a*. In other examples, such decoupling and coupling may be configured to occur simultaneously.

In some examples, the latch signal generation portions 510-*a* may include "firing" the sense amplifier 290-*a*, which may include selectively coupling one or more voltage sources with the sense amplifier 290-*a* (e.g., a low voltage source 293, a high voltage source 294). Thus, according to the sequence of latch signal generation portions 510-*a*-1 through 510-*a*-4, a sequence of signals may be generated at the sense amplifier 290-*a* or signal development components 250-*a* that is based at least in part on the respective sequence of write commands or signals.

One or more signals may be transferred between a sense amplifier 290 and a signal development component 250 as part of or in connection with a write operation. For example, the generated latch signals may also be passed back to, or otherwise shared with the signal development components 250-*a*-1 through 250-*a*-4 to support the respective write operations. For example, based on the generated latch signal (e.g., based on whether the memory cells 105-*b* are to store a logic 0 or a logic 1), a write signal may be passed or otherwise shared with the respective one of signal development components 250-*a*-1 through 250-*a*-4 as part of the latch signal generation portions 510-*a*.

The write signal development portions 520-*a* may be associated with a charge sharing between a respective one of the memory cells 105-*b*, a respective one of the digit lines 210-*a*, and a respective one of the signal development components 250-*a*. The write signal development portions 520-*a* may each be an example of developing a cell access signal (e.g., a cell write signal) at a signal development component 250-*a* based at least in part on a latch signal of the sense amplifier 290-*a*. The transition from a latch signal generation portion 510 to a corresponding write signal development portion 520-*a* may include selectively isolating the respective signal development component 250-*a* from the sense amplifier 290-*a* (e.g., via the selection component 280-*a* or another isolation switching component). The write signal development portion 520-*a*-1 may be an example of coupling, during a third time interval subsequent to the first time interval, the signal development component 250-*a*-1 (e.g., the first signal development component) with the memory cell 105-*b*-111 (e.g., the first memory cell). In some examples, the second time interval is within, or at least partially overlaps the third time interval. The write signal development portion 520-*a*-2 may be an example of coupling, during a fourth time interval subsequent to the second time interval that overlaps the third time interval, the signal development component 250-*a*-2 (e.g., the second signal development component) with the memory cell 105-*b*-211 (e.g., the second memory cell).

In some examples of the write signal development portions 520-*a*, the shunts 330-*a* associated with other memory cells 105-*b* of the respective domain 310-*a* may be selected or activated, which may equalize a bias across memory cells 105-*b* that are not being accessed. For example, for domain 310-*a*-1, during the write signal development portion 520-*a*-1, a bias between a digit line 210-*a*-12 and a plate line 215-*a*-12 may be equalized via a shunt 330-*a*-12, a bias between a digit line 210-*a*-13 and a plate line 215-*a*-13 may be equalized via a shunt 330-*a*-13, and so on. Such an equalization of bias may prevent or reduce a loss of data (e.g., due to charge leakage) of memory cells 105-*b* other than the memory cell 105-*b* that is being accessed during the write signal development portions 520-*a*.

Like the write operation 500, the write operation 550 may also be associated with the writing of a single memory cell 105 (e.g., via the sense amplifier 290-*a*) having a total duration of $t_{B1}$-$t_{B0}$, which may include the latch signal generation portion 510-*a*-1 and the write signal development portion 520-*a*-1 for writing the single memory cell 105-*b*-111. However, by employing multiplexed signal development in accordance with examples as disclosed herein, performing multiple write operations via the same sense amplifier 290-*a* may not take an integer multiple of the duration of $t_{B1}$-$t_{B0}$ (e.g., where the integer multiple may correspond to the quantity of memory cells 105-*b* being written in parallel). Rather, by generating cell access signals in overlapping time intervals (e.g., the time intervals of a write signal development portions 520-a of the signal development component 250-a-1 that overlap with the time intervals of a write signal development portions 520-a of the signal development component 250-a-2, and so on), the multiple memory cells 105-b may be written in a shorter time than such an integer multiple. In other words, in accordance with the described techniques for multiplexed signal development, the sense amplifier 290-a may support writing the four memory cells 105-b in a duration of $t_{B2}$-$t_{B0}$, a duration which may be shorter than $4*(t_{B1}-t_{B0})$ (e.g., shorter than the corresponding integer multiple of duration for writing a single memory cell 105-b).

In one example, the write signal development portions 520-a-1, 520-a-2, 520-a-3, and 520-a-4 of a first set of writes may be followed by latch signal generation portions 510-a-5, 510-a-6, 510-a-7, and 510-a-8, respectively, of a second set of writes. The first set of writes may be associated with a first digit line index (e.g., a value of "1" as indicated by logical selection signals $DLM_1$, $DLM_2$, $DLM_3$, and $DLM_4$), and the second set of writes may be associated with a second digit line index (e.g., a value of "2" as indicated by logical selection signals $DLM_1$, $DLM_2$, $DLM_3$, and $DLM_4$). Or, more generally, the first set of writes and the second set of writes may differ based at least in part on selected digit lines 210-a of the write operations. In some examples (e.g., where selection components 320-a across domains 310-a are independently controllable, where logical selection signals DLM across domains 310-a are independently controllable), a new digit line 210-a may be selected for a signal development component 250 (e.g., via a selection component 320-a) as soon as a write signal development portion 520-a is complete for the same signal development component 250. In other words, as illustrated in the example of operation 550, a write signal development portion 520-a of a first set of writes may overlap in time with a latch signal generation portion 510-a of a second set of writes for signal development components 250-a that are multiplexed with the same sense amplifier 290-a (e.g., the latch signal generation portion 510-a-5 overlapping the write signal development portion 520-a-4). Thus, the periodicity for writing four memory cells 105 in the example of operation 550 where domains 310-a-1 through 310-a-4 are independently controllable may be illustrated by the time $t_{B2}$-$t_{B0}$, which may be based on the overall duration associated with a write operation (e.g., $t_{B1}$-$t_{B0}$), the respective latencies of sub-operations (e.g., relative durations of latch signal generation portions 510-a and write signal development portions 520-a), and the degree of multiplexing (e.g., a quantity of signal development components 250-a that are multiplexed with the sense amplifier 290-a).

In some examples, a subsequent write may be performed on a memory cell 105-b that is coupled with a different digit line 210-a than a preceding write operation, but is coupled with a same activated word line 205-a, which may reduce latency. For example, maintaining a selected word line 205-a may eliminate a word line deselection operation and a subsequent word line selection operation. Such examples may be accompanied by shunting a digit line 210-a associated with the earlier write operation (e.g., a digit line 210-a that was previously un-shunted), and un-shunting a digit line 210-a associated with the later write operation (e.g., a digit line 210-a that was shunted during the earlier write operation).

In another example, not shown, a set of writes may be associated with a first common word line (e.g., where logical word lines $WL_{11}$, $WL_{21}$, $WL_{31}$, and $WL_{41}$ of different domains are simultaneously activated), and a second set of writes may be associated with a second common word line (e.g., where logical word lines $WL_{12}$, $WL_{22}$, $WL_{32}$, and $WL_{42}$ of different domains are simultaneously activated). Or, more generally, the first set of writes and the second set of writes may differ based at least in part on a selected common word line 205-a of the write operations. In some examples (e.g., where word lines 205-a across domains 310-a are not independently controllable), a new word line 205-a may be selected as soon as a write signal development portion 520 is complete for all of the multiplexed signal development components 250-a (e.g., associated with the sense amplifier 290-a, or other set of domains 310-a that are not independently controllable). In other words, in some examples, a write signal development portion 520 of a first set of writes may not overlap in time with a latch signal generation portion 510 of a second set of writes for signal development components 250 that are multiplexed with the same sense amplifier 290-a.

For example, when word lines 205-a are not independently controllable across domains 310-a-1 through 310-a-4, the latch signal generation portion 510-a-5 may follow or be otherwise subsequent to the write signal development portion 520-a-4. Thus, the periodicity for writing four memory cells 105 in the example where the domains 310-a are not independently controllable may be equal to or nearly equal to the combined time of each of the latch signal generation portions 510-a-1 through 510-a-4 and one of the write signal development portions 520-a for the multiplexed signal development components 250-a-1 through 250-a-4. Accordingly, in some examples, such a periodicity where domains 310-a are not independently controllable may be longer than the periodicity illustrated by time $t_{B2}$-$t_{B0}$.

Thus, in accordance with various examples as disclosed herein, the advantages provided by the described signal development multiplexing (e.g., a reduced latency when accessing multiple memory cells 105-b in parallel) may scale with the relative difference in latency (e.g., durations) of latch signal generation portions 510 and write signal development portions 520. The advantages of the described signal development multiplexing may also depend on whether domains 310-a are configured to be independently controllable, or are controlled via common access lines or common logical signals.

Although the techniques of write operation 550 are described with reference to a single sense amplifier 290-a, the techniques of write operation 550 may be repeated for each sense amplifier 290 of a sense amplifier array, including various operations being performed concurrently (e.g., in parallel, with simultaneous or offset initiation or triggering), to support further pipelining of write operations in a memory device 100. For example, the write operation 550, or another write operation performed concurrently with the write operation 550, may include input/output operations including latch signal generation portions 510-b-1, 510-b-2, 510-b-3, and 510-b-4 (not shown) associated with a different sense amplifier (e.g., of a same sense amplifier array). In some examples, a latch signal generation portion 510-b-1 may be initiated at the same time as, or otherwise performed concurrently with or offset from, the latch signal generation portion 510-a-1 (e.g., according to a simultaneous sensing at a sense amplifier array, according to a simultaneous latching at a set of latches of a sense component or I/O component, according to concurrent signal exchange with a cacheline). Likewise, a latch signal generation portion 510-b-2 may be initiated at the same time as, or otherwise performed concurrently with or offset from, the latch signal generation portion 510-a-2, and so on.

Further, the write operation 550, or another write operation performed concurrently with or offset from the write operation 550, may include signal development operations including write signal development portions 520-b-1, 520-b-2, 520-b-3, and 520-b-4 (not shown) associated with a different sense amplifier (e.g., of a same sense amplifier array). In some examples, a write signal development portion 520-b-1 may be initiated at the same time as, or otherwise performed concurrently with or offset from, the write signal development portion 520-a-1 (e.g., according to a simultaneous accessing of multiple memory cells of a row, a domain, or a subdomain, according to concurrent signal exchange with a cacheline). Likewise, a write signal development portion 520-b-2 may be initiated at the same time as, or otherwise performed concurrently with or offset from, the write signal development portion 520-a-2, and so on. Although described in the context of two parallel writes associated with two different sense amplifiers 290, the described techniques may be applied to any quantity of parallel writes. For example, to support a 64-bit information transfer scheme, 64 parallel writes may be performed using 64 sense amplifiers 290 in accordance with examples as disclosed herein.

Figure 6:
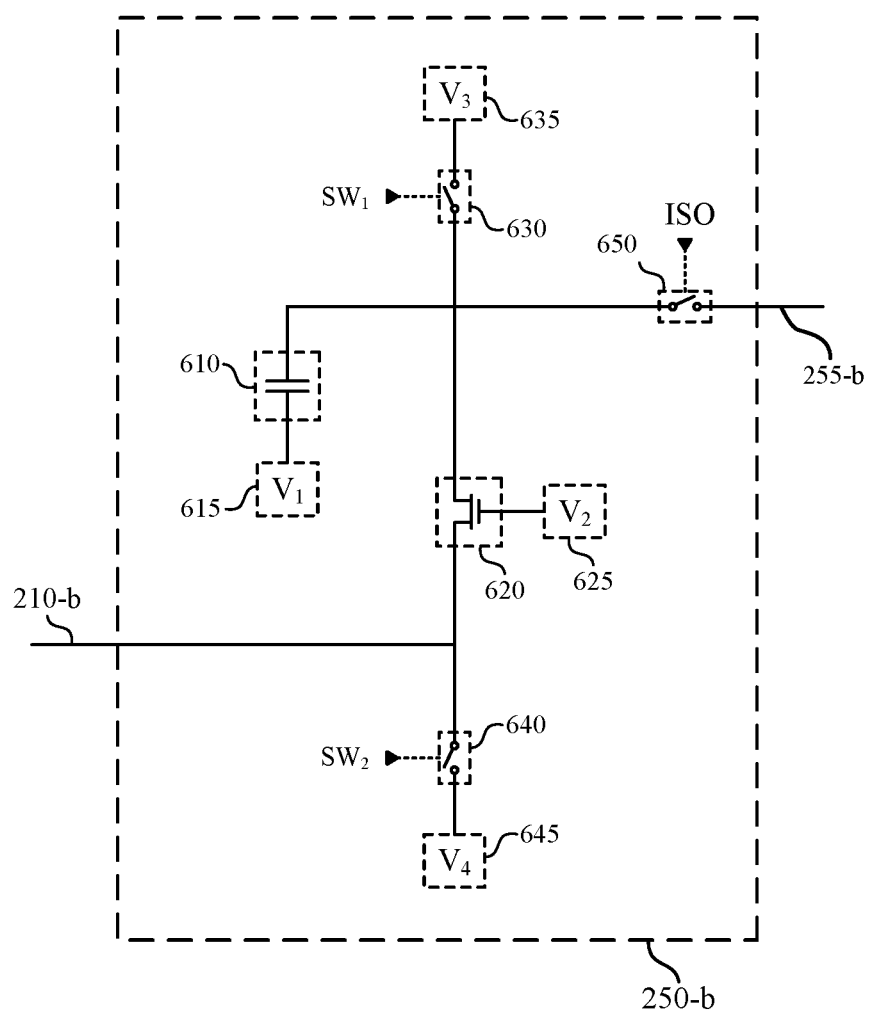
FIG. 6 illustrates an example of a signal development component that supports signal development caching in a memory device in accordance with examples as disclosed herein.

FIG. 6 illustrates an example of a signal development component 250-b that supports signal development caching in a memory device in accordance with examples as disclosed herein. The signal development component 250-b may be an example of signal development components 250 described with reference to FIGS. 1 through 5. The signal development component 250-b may be coupled with or between a digit line 210-b and a signal development line 255-b. The signal development component 250-b may include a capacitor 610 (e.g., an integrator capacitor, a storage element, a cache element, a cache storage element) and a transistor 620 that may be configured in an amplifier configuration (e.g., as a charge transfer sensing amplifier, as a cascode).

The capacitor 610 may be an example of a signal storage component or a charge storage component of the signal development component 250-b. In the example of the signal development component 250-b, the capacitor 610 may be coupled with or between a line of the signal development component 250-b (e.g., the signal development line 255-b) and a voltage source 615 (e.g., a ground voltage source, a voltage source having a reference voltage for the capacitor 610). Although illustrated as including the capacitor 610, a signal development component 250 in accordance with examples as disclosed herein may, additionally or alternatively, include or otherwise employ a transistor in a particular state, a diode, or other components that may provide functionality of a signal storage component or charge storage component in the signal development component 250. In some examples, a set of signal development components 250-b may include a set of capacitors 610, which may provide a fast, local, in-memory cache (e.g., a signal development cache) in a device that includes the set of signal development components 250-b.

In some examples, a memory device that includes the signal development component 250-b may include memory cells 105 that employ a logic storage element that includes a capacitive element (e.g., a linear capacitor in a DRAM application, a ferroelectric capacitor in an FeRAM application). In various examples, the capacitor 610 may include a same capacitive element or technology as a logic storage element (e.g., capacitor 610 may be a linear capacitor in a DRAM application, a capacitor 610 may be a ferroelectric capacitor in an FeRAM application), or a different capacitive element or technology as a logic storage element (e.g., capacitor 610 may be a linear capacitor in an FeRAM application, a PCM application, or a chalcogenide memory application).

The transistor 620 may be an example of an amplifier or voltage regulator of the signal development component 250-b, and may be configured to transfer charge between the signal development line 255-b (e.g., a first access line) and the digit line 210-b (e.g., a second access line) based at least in part on one or both of a voltage of the signal development line 255-b and a voltage of the digit line 210-b. For example, a gate node of the transistor 620 may be coupled with a voltage source 625, and charge may be transferred across the transistor based at least in part on a relationship between a voltage of the voltage source 625 (e.g., $V_2$) and a voltage of the digit line 210-b. In various examples, the transistor 620 may be associated with one or more digit lines 210 (e.g., multiplexed digit lines 210), and may be located outside the illustrative boundaries of the signal development component 250-b (e.g., in examples of memory devices that include a transistor 620 for each of a set of multiplexed digit lines 210).

The transistor 620 may provide a conversion of signals between the digit line 210-b and the signal development line 255-b. For example, the transistor 620 may permit a flow of charge (e.g., electrical current) from the signal development line 255-b (e.g., from the capacitor 610) to the digit line 210-b, as fed or enabled by the voltage source 625, upon a reduction in voltage of the digit line 210-b (e.g., upon selection of a memory cell 105, upon selection of a digit line 210 via a selection component 320). A relatively small flow of charge to the digit line 210-b may be associated with a relatively small change in voltage of the signal development line 255-b, whereas a relatively large flow of charge to the digit line 210-b may be associated with a relatively large change in voltage of the signal development line 255-b. According to the net capacitance of the signal development line 255-b (e.g., including the capacitor 610), for example, the signal development line 255-b may undergo a relatively small change in voltage or a relatively large change in voltage depending on the flow of charge across the transistor 620 after selecting a memory cell 105. In some examples, the transistor 620 or the signal development component 250-b may be isolated from the digit line 210-b by a switching component or a selection component (e.g., a selection component 320). The transistor 620 may also referred to as a "voltage regulator" or a "bias component," relating to how the transistor 620 regulates a flow of charge in response to the voltage of the digit line 210-b.

In some examples, the signal development component 250-b may include circuitry configured to support a selective coupling (e.g., of the signal development line 255-b) with a relatively high voltage (e.g., voltage source 635). For example, the signal development component 250-b may include a switching component 630 that is operable based on a logical signal $SW_1$. In some examples, the voltage source 645 may be coupled with a relatively high voltage rail or supply, which may support charging the capacitor 610 (e.g., for developing a cell access signal).

In some examples, the signal development component 250-b may include circuitry configured to support a selective coupling (e.g., of the digit line 210-b) with a reference voltage (e.g., voltage source 645). For example, the signal development component 250-b may include a switching component 640 that is operable based on a logical signal SW$_2$. In some examples, the voltage source 645 may be coupled with a ground or virtual ground rail or supply. In some examples, the voltage source 645 may be coupled with a same rail or supply as the voltage source 615 (e.g., V$_1$ may be equal to V$_4$).

In some examples, the signal development component 250-*b* may include circuitry configured to support a selective coupling (e.g., of the signal development line 255-*b*, of the signal development component 250-*b*) with another component (e.g., a selection component 280, a sense amplifier 290). For example, the signal development component 250-*b* may include a switching component 650, which may be referred to as an isolation switching component, and may be operable based on a logical signal ISO. Additionally or alternatively, an isolation switching component may be included in a sense amplifier 290 in accordance with examples as disclosed herein.

Figure 7:
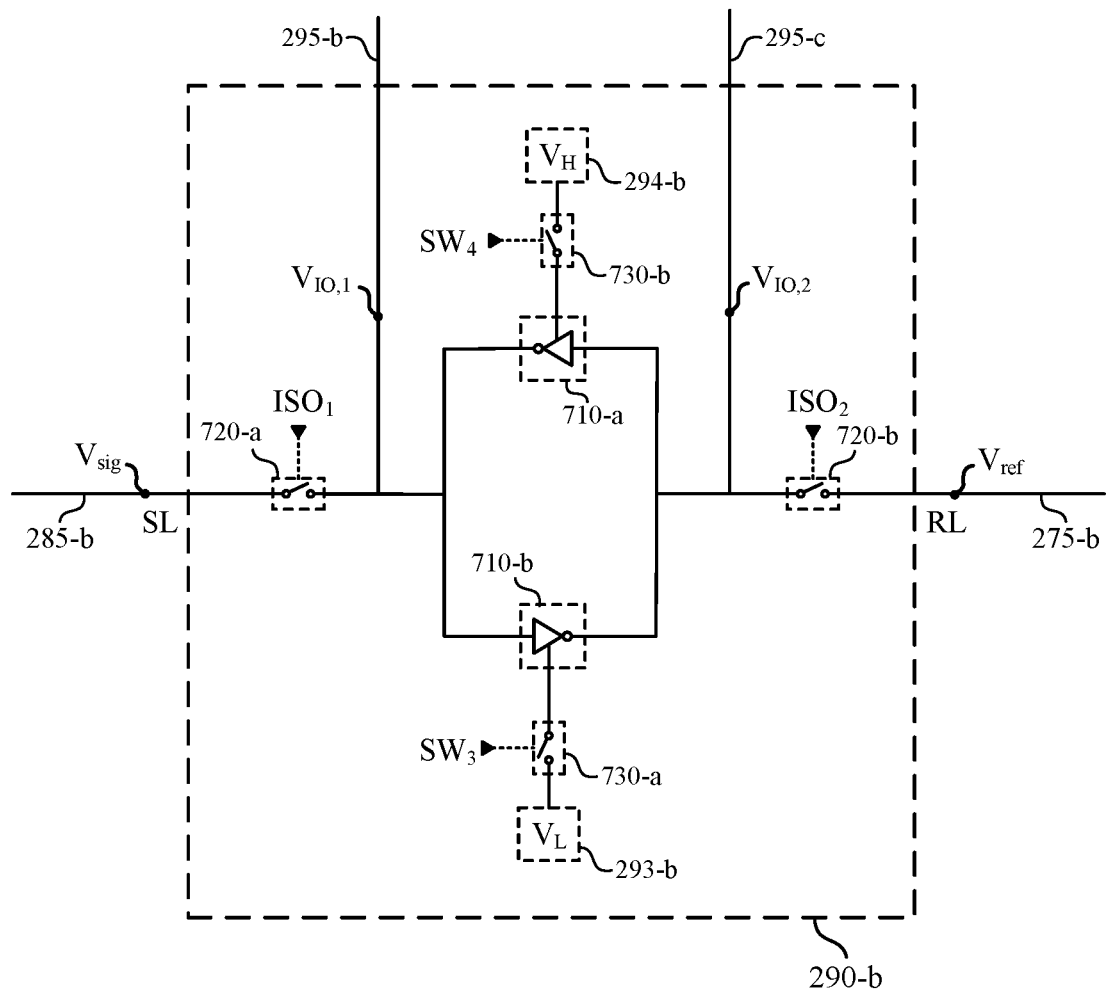
FIG. 7 illustrates an example of a sense amplifier that supports signal development caching in a memory device in accordance with examples as disclosed herein.

FIG. 7 illustrates an example of a sense amplifier 290-*b* that supports signal development caching in a memory device in accordance with examples as disclosed herein. The sense amplifier 290-*b* may be an example of sense amplifiers 290 described with reference to FIGS. 1 through 5. The sense amplifier 290-*b* may be coupled with or between a signal line 285-*b* and a reference line 275-*b*. The sense amplifier 290-*b* may also be associated with (e.g., coupled with) I/O lines 295-*b* and 295-*c*. In some examples, the sense amplifier 290-*b* may be referred to as an amplifier component of a memory device.

The sense amplifier 290-*b* may include a pair of opposed amplifiers 710-*a* and 710-*b*. Although illustrated as amplifiers 710, the sense amplifier 290-*b* may alternatively or equivalently include pairs of cross-coupled transistors (e.g., a pair of cross-coupled p-type transistors and a pair of cross-coupled n-type transistors).

In some examples, the sense amplifier 290-*b* may include circuitry configured to support a selective coupling (e.g., of the amplifiers 710-*a* and 710-*b*) with sense amplifier low and high voltage sources (e.g., voltage sources 293-*b* and 294-*b*). For example, the sense amplifier 290-*b* may include switching components 730-*a* and 730-*b* that are operable based on logical signals SW$_3$ and SW$_4$, respectively. In some examples, activating or selecting logical signals SW$_3$ and SW$_4$ may be referred to as activating or latching the sense amplifier 290-*b*.

In some examples, the sense amplifier 290-*b* may include circuitry configured to support a selective coupling with or decoupling from another component (e.g., a signal development component 250, a selection component 280, a reference component 270). For example, the sense amplifier 290-*b* may include switching components 720-*a* and 720-*b*, which may be referred to as an isolation switching component, and may be operable based on a logical signals ISO$_1$ and ISO$_2$. Additionally or alternatively, an isolation switching component may be included in a signal development component 250 or a selection component 280 in accordance with examples as disclosed herein.

In some examples (e.g., in support of a read operation), the sense amplifier 290-*b* may generate an output signal based at least in part on a cell read signal. For example, a signal development component 250 (e.g., a selected one of a set of signal development components 250) may pass a cell access signal, or otherwise share a charge with the sense amplifier 290-*b* that is based at least in part on a cell access signal, via the signal line 285-*b*. A reference component 270 may pass a reference signal, or otherwise share a charge with the sense amplifier 290-*b* that is based at least in part on a reference signal, via the reference line 275-*b*. When the signal line 285-*b* has a higher voltage than the reference line 275-*b*, the output signal may be generated with the I/O line 295-*b* having a relatively higher voltage (e.g., V$_H$) and the I/O line 295-*c* having a relatively lower voltage (e.g., V$_L$). When the reference line 275-*b* has a higher voltage than the signal line 285-*b*, the output signal may be generated with the I/O line 295-*c* having a relatively higher voltage (e.g., V$_H$) and the I/O line 295-*b* having a relatively lower voltage (e.g., V$_L$). In some examples, the switching components 720-*a* and 720-*b* may be closed to receive cell read signals or cell reference signals, and subsequently opened when activating the sense amplifier 290-*b* (e.g., "latching").

In some examples, a generated sense or latch signal, or otherwise generated output signal, may be shared or otherwise associated with a write signal or rewrite signal passed to the selected signal development component 250 via the signal line 285-*b* (e.g., after closing the switching component 720-*a*). In some examples, a write command or write signal may be received at the sense amplifier 290-*b* (e.g., from an input/output component 160 via I/O lines 295-*b* and 295-*c*), and the received write command or write signal may be latched, shared (e.g., via the signal line 285-*b*), or otherwise associated with a cell write signal generated by the selected signal development component 250. In some examples, a write command or write signal associated with the sense amplifier 290-*b* may bypass signal development components 250 (e.g., via a bypass line 260).

Figure 8A:
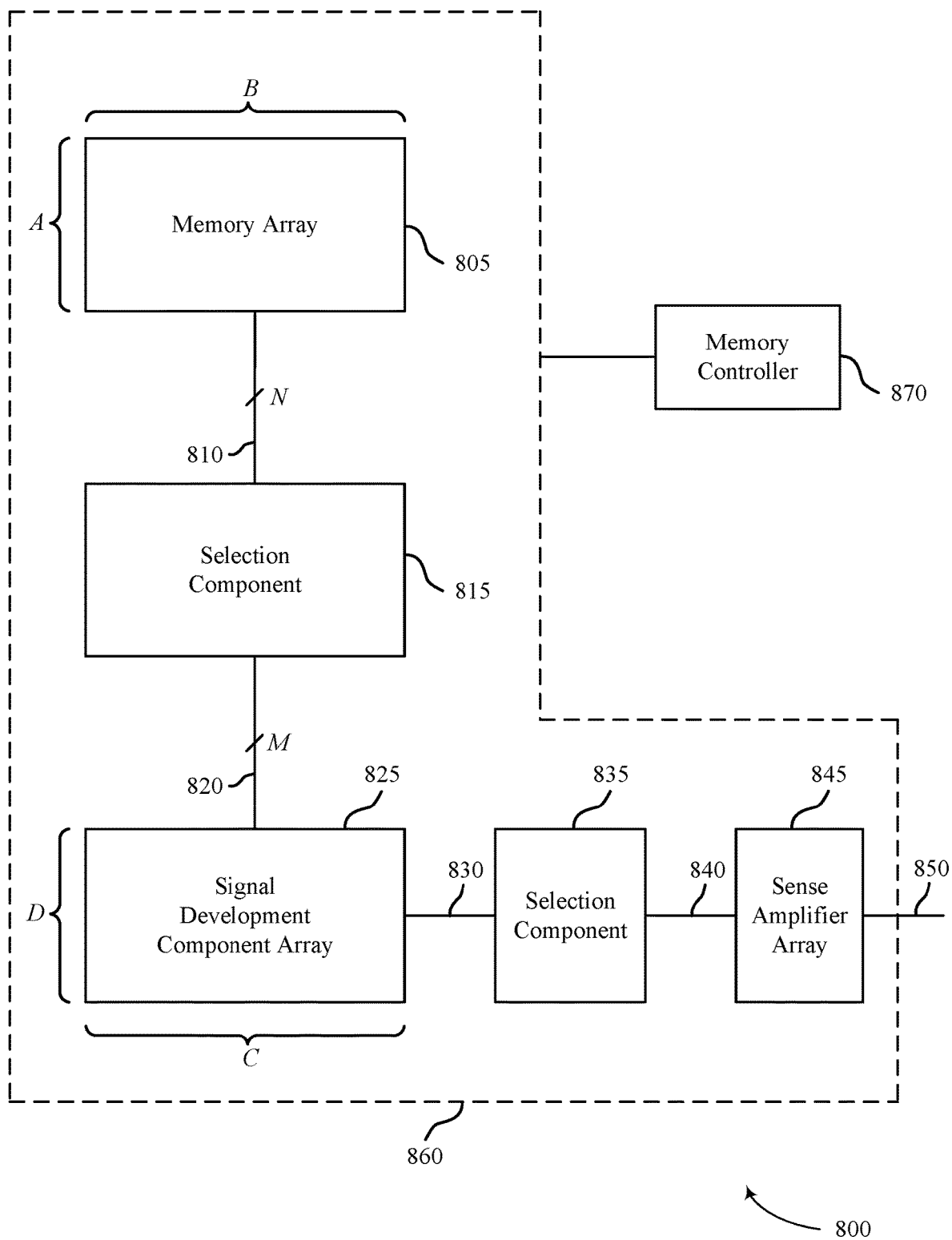
FIGS. 8A, 8B, and 8C show block diagrams of systems that support signal development caching in a memory device in accordance with examples as disclosed herein.

FIG. 8A shows a block diagram of a system 800 that supports signal development caching in accordance with examples as disclosed herein. The system 800 may include a memory array 805, a selection component 815, a signal development component array 825, a selection component 835, and a sense amplifier array 845. In some examples, these and other components may be included in a data path 860 of the system 800.

The memory array 805 may include a set of memory cells 105, which may be associated with access lines such as those described with reference to FIGS. 1 through 3 (e.g., word lines 205, digit lines 210, plate lines 215). In some examples, the memory array may be associated with A rows (e.g., A independently accessible word lines 205) and B columns (e.g., B independently accessible digit lines 210). In one example, the memory array 805 may be associated with 1,048,576 memory cells 105, arranged according to 1,024 word lines 205 and 1,024 digit lines 210. Each of the memory cells 105 may be configured to store a respective logic state, which may alternatively be referred to as a memory state.

In some examples, the memory array 805 may be arranged in a set of domains, which may be similar to domains 310 described with reference to FIG. 3. In one example, the memory array 805 may be split among 4 domains, and each of the four domains may have four independent zones with plate control (e.g., each domain of the memory array 805 may have four zones, which may be an example of subdomains, having commonly or individually biased plate lines 215). In such examples, the memory array 805 may be arranged according to 16 control zones, which may be associated with selecting 64-bit data.

The signal development component array 825 may include a set of signal development components 250, which may include aspects of signal development components 250 described with reference to FIGS. 2 through 7. The signal development component array 825, or components thereof (e.g., cache elements of the signal development component array 825) may be an example of a signal development cache in accordance with examples as disclosed herein. In some examples, signal development components 250, or cache elements thereof, of the signal development component array 825 may be arranged in a grid having C columns and D rows. In some examples, each of the D rows may be associated with a cache block, and each of the C columns may be associated with a position in a respective cache block. In one example, the signal development component array 825 may be associated with 8 cache blocks, each having 64 positions. Each of the positions of each of the cache blocks may correspond to a single signal development component 250, or cache element of a signal development component 250.

The selection component 815 may include various components that support mapping memory cells 105 of the memory array 805 with signal development components 250 of the signal development component array 825. For example, the selection component 815 may provide for selective coupling and decoupling of individual digit lines 210 of the memory array 805 with individual signal development components 250 of the signal development component array 825 to support various examples of multiplexed signal development described herein.

The selection component 815 may be coupled with the memory array 805 via a bus 810 having N signal paths, and the selection component 815 may be coupled with the signal development component array 825 via a bus 820 having M signal paths. In some examples, the selection component 815 may be coupled with each of the digit lines 210 of the memory array 805 (e.g., where N=B). In some examples, the bus 820 may have fewer signal paths than the bus 810, where M is associated with the size of cache blocks of the signal development component array (e.g., a quantity of storage elements for each cache line of a cache block). For example, the bus 810 may have N=1,024 signal paths, and the bus 820 may have M=64 signal paths, or some other quantity of signal paths.

In various examples, each digit line 210 of the memory array 805 may be configured for selective coupling with a particular one of the signal development components 250 of the signal development component array 825, a particular set of the signal development components 250 of the signal development component array 825, or may be configured for selective coupling with any one of the signal development components 250 of the signal development component array. Additionally or alternatively, a signal development component 250 of the signal development component array 825 may be configured for selective coupling with a particular one of the digit lines 210 of the memory array 805, a particular set of the digit lines 210 of the memory array, or may be configured for selective coupling with any one of the digit lines 210 of the memory array 805. In other words, the mapping between digit lines 210 and signal development components 250 in accordance with the described techniques may include a one-to-many mapping, a many-to-one mapping, or a many-to-many mapping.

The sense amplifier array 845 may include a set of sense amplifiers 290, which may include aspects of sense amplifiers 290 described with reference to FIGS. 2 through 7. In some examples, sense amplifiers of the sense amplifier array 845 may be arranged in a strip or other grouped arrangement. The selection component 835 may be coupled between the signal development component array 825 (e.g., via a bus 830) and the sense amplifier array 845 (e.g., via a bus 840) to support various mappings between signal development components 250 and sense amplifiers 290. In various examples, the sense amplifiers 290 (e.g., of the sense amplifier array 845) may be integrated between cache blocks (e.g., of the signal development component array 825) or may be external to the signal development component cache region (e.g., external to the signal development component array 825). In some examples, the sense amplifier array 845 may be coupled with a bus 850, which may support communication of information with an I/O component (not shown), which may be considered to be within or outside the illustrative boundary of the data path 860.

In some examples, the signal development component array 825 may be coupled with a strip or other group of sense amplifiers 290 (e.g., of the sense amplifier array 845), each of which may also be independently accessible. For example, each of a strip of sense amplifiers 290 may be configured for selective coupling with a particular one of the signal development components 250 of the signal development component array 825, a particular set of the signal development components 250 of the signal development component array 825, or may be configured for selective coupling with any one of the signal development components 250 of the signal development component array. Additionally or alternatively, a signal development component 250 of the signal development component array 825 may be configured for selective coupling with a particular one of the sense amplifiers 290 of the strip of sense amplifiers, a particular set of the sense amplifiers of the strip of sense amplifiers, or may be configured for selective coupling with any one of the sense amplifiers 290 of the strip of sense amplifiers. In other words, the mapping (e.g., via the selection component 835) between signal development components 250 of the signal development component array 825 and sense amplifiers 290 of the sense amplifier array 845 in accordance with the described techniques may include a one-to-many mapping, a many-to-one mapping, or a many-to-many mapping.

In an illustrative example where the memory array 805 is associated with 1,024 digit lines 210, each of the 1,024 digit lines 210 may be coupled with a multiplexer (e.g., of the selection component 815), where they may be reduced to 64×4=256 digit lines. This may support signal transfer of 4 sets of 64 digit lines overlapping in time (e.g., participating in simultaneous transfer between a memory cell 105 and a signal development component 250). In some examples, each of these 4 sets can be routed to any of 8 cache blocks (e.g., of the signal development component array 825), where each cache block may include 8 lines by 64 bits. In other words, the total cache size associated with such a signal development component array 825 may be 64×64 bits. According to this example of array routing, any 64 bit sub-row from memory array may be routed to any of 64 bit signal development component cache lines.

In another illustrative example, the system 800 may include several domains (e.g., of the memory array 805) each with 1,048,576 memory cells 105 arranged in 1,024 uniquely addressed rows and 1,024 columns. Each of the domains of the system 800 may be mapped (e.g., via the selection component 815) with 64 signal development components (e.g., of the signal development component array 825). In other words, 64 signal development components may be mapped to 1,024 digit lines 210 within each domain. In some examples, a particular signal development component 250 may be mapped to 16 digit lines 210 within each domain (e.g., 1,024 digit lines 210 divided by 64 signal development components 250). In some examples, such a mapping may be fixed (e.g., where groups of 16 digit lines 210 are mapped to a respective signal development component 250 within each domain) which, in some examples, may reduce multiplexing or selection circuit complexity. In various other examples, a signal development component 250 may be mapped to more than one domain, more than one set of digit lines 210 (e.g., of a domain), or other configurations. Additionally or alternatively, a domain or a set of digit lines 210 may be mapped to more than one signal development component 250. In other words, a memory device may include various configurations of signal development components 250 to support examples of the multiplexed signal development described herein.

In this illustrative example, a row of 1024 memory cells 105 (e.g., spanning one domain 310) may be selected by a single word line 205 in each domain. With 64 signal development components 250 per domain, 64 of the set of 1,024 memory cells 105 may be accessed at a time in each domain (e.g., by selectively coupling a respective digit line 210 with each of the 64 signal development components 250-*a* via the selection component 815). During such accessing, other digit lines 210 may be selectively isolated from the signal development components 250 interfacing the same domain. Further, the other digit lines 210 may be shunted or masked as described herein.

In some examples, operations of one or more components of the system 800 may be controlled by a memory controller, such as memory controller 870. The memory controller 870 may be an example of, or otherwise be associated with performing operations of a memory controller 170 as described with reference to FIG. 1. The memory controller 870 may be illustrative of a controller or other circuitry that is configured to control various components or operations of the system 800. For example, the system 800 may include various components or circuitry of a data path 860, which may include the memory array 805, the selection component 815, the signal development component array 825, the selection component 835, and the sense amplifier array 845, among other components along a path of information transfer in the system 800 (e.g., a row component 125, a column component 135, a plate component 145, an I/O component 160, and others). In various examples, the memory controller 870 may be in communication with any one or more of the components of the data path 860 for controlling the associated components or operations.

The memory controller 870 may be configured (e.g., by one or more commands received from a host device) for performing one or more write operations, read operations, eviction operations, or bypass operations, among other examples of memory operations of the system 800. In various examples of such operations, the memory controller 870 may be configured for transferring data between one or more portions of the memory array 805, one or more portions of the signal development component array 825 (e.g., a cache block of the signal development component array 825), or one or more portions of the sense amplifier array 845 in accordance with the one or more memory operations.

In some examples, the memory controller 870 may be configured for performing a read operation, which may include transferring data from the signal development component array 825 to the sense amplifier array 845 (e.g., when requested data is stored in the signal development component array 825). In some examples, the memory controller 870 may be configured for transferring the data from the memory array 805 to the signal development component array 825 (e.g., when requested data is not found in the signal development component array 825). Additionally or alternatively, the memory controller 870 may be configured for performing an eviction operation. The eviction operation may include transferring data stored in the signal development component array 825 to the memory array 805 prior to transferring other data (e.g., data associated with a read operation) from the memory array 805 to the signal development component array 825. In some examples, the memory controller 870 may be configured for performing a cache bypass operation, which may include transferring data directly from the memory array 805 to the sense amplifier array 845, which may facilitate, as an example, streaming read operations (e.g., performing multiple read operations in parallel).

In some examples, the memory controller may be configured for performing a write-back operation, which may include transferring data from the sense amplifier array 845 to the signal development component array 825 (e.g., after performing a read operation). Additionally or alternatively, the memory controller 870 may be configured for performing a write-through operation. The write through operation may include transferring data directly from the sense amplifier array 845 to the memory array 805 based on determining that the data is stored at the signal development component array 825 in accordance with a write command. In some examples, the memory controller 870 may be configured for performing a bypass operation. For example, the bypass operation may include transferring data directly from the sense amplifier array 845 to the memory array 805 based on determining that the data is not stored in the signal development cache in accordance with a write command. Such examples of bypass operations may facilitate streaming write operations (e.g., performing multiple write operations in parallel). In some cases, one or more of the write operations described herein may include an eviction operation. For example, the memory controller 870 may transfer data stored in the signal development component array 825 to the memory array 805 based on determining that data corresponding to a write command (e.g., a write-back command) is not currently stored in the signal development component array 825.

Although the system 800 in the example of FIG. 8A is illustrated with a selection component 815 operable to selectively couple the memory array 805 with the signal development component array 825, and a selection component 835 operable to selectively couple the signal development component array 825 with the sense amplifier array 845, other configurations are possible for supporting the described techniques for memory accessing. For example, in some cases, the memory array 805 may be selectively coupled with the sense amplifier array 845 in a manner that bypasses the signal development component array 825, or components thereof. In some examples, a coupling between the memory array 805 and the sense amplifier array 845 may be supported by way of one or more bypass lines, such as the bypass line 260 described with reference to FIG. 2.

Figure 8B:
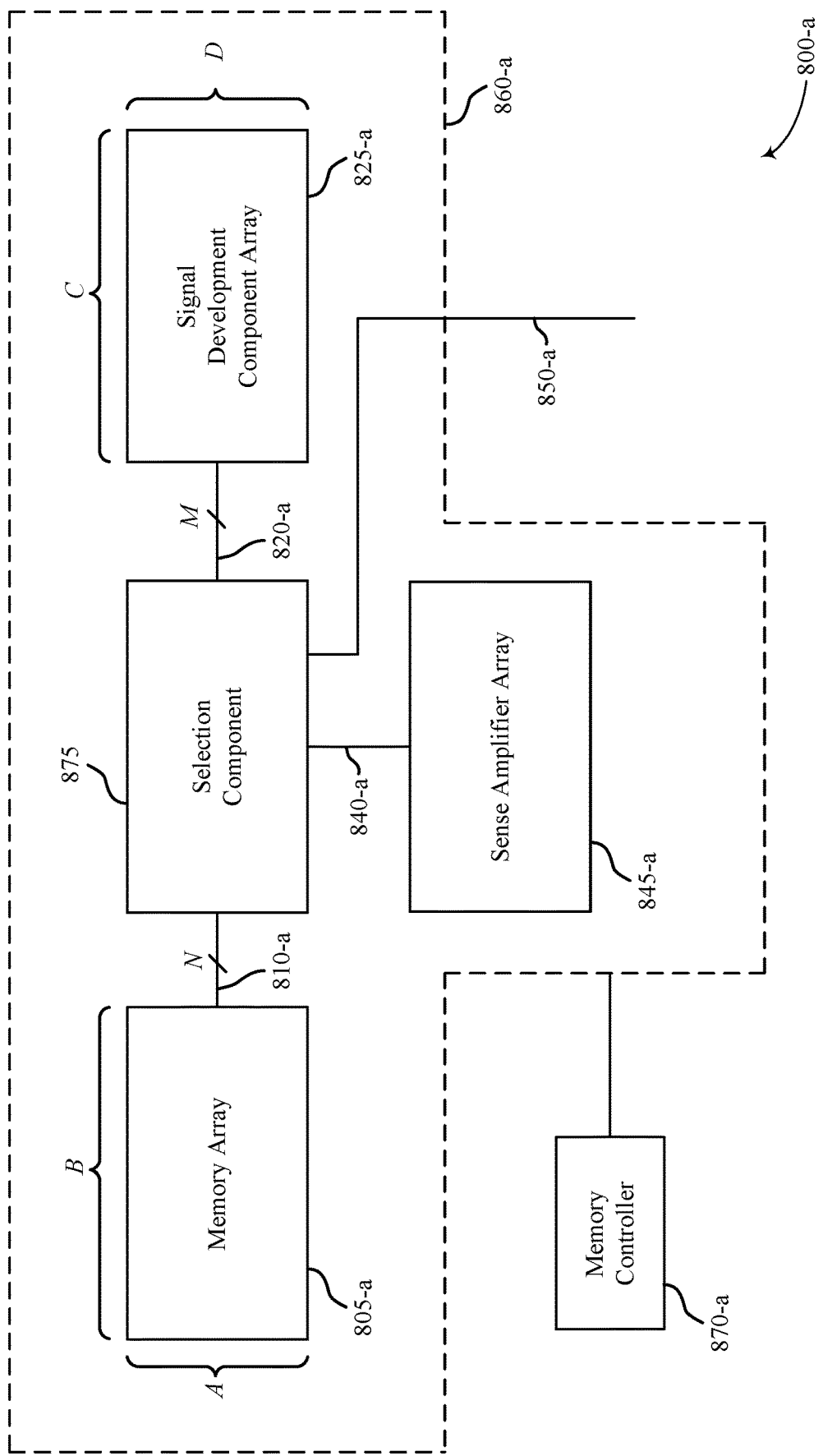

FIG. 8B shows a block diagram of a system 800-*a* that supports signal development caching in accordance with examples as disclosed herein. The system 800-*a* may include a memory array 805-*a*, a bus 810-*a*, a bus 820-*a*, a signal development component array 825-*a*, a bus 840-*a*, a sense amplifier array 845-*a*, a bus 850-*a*, and a memory controller 870-*a*, each of which may be an example of the respective components as described with reference to FIG. 8A. The memory array 805-*a*, the bus 810-*a*, the bus 820-*a*, the signal development component array 825-*a*, the bus 840-*a*, and the sense amplifier array 845-*a*, may be part of a data path 860-*a*, and the memory controller 870-*a* may be coupled with any one or more of these and other components of the data path 860-*a* to support the techniques disclosed herein.

In some examples, a system such as system 800-*a* may include a selection component 875 operable for selectively coupling the memory array 805-*a* with the sense amplifier array 845-*a* (e.g., bypassing the signal development component array 825-*a*, or components thereof), the memory array 805-*a* with the signal development component array 825-*a*, or the signal development component array 825-*a* with the sense amplifier array 845-*a*. In some cases, selection component 875 may be operable for selectively coupling the memory array 805-*a*, the sense amplifier array 845-*a*, and the signal development component array 825-*a* with each other concurrently. The selection component 875 thus may include or otherwise support functionalities described elsewhere herein and ascribed to one or more of switching component 265 described with reference to FIG. 2, selection components 280 described with reference to FIGS. 2 and 3, selection components 320 described with reference to FIG. 3, selection component 815 described with reference to FIG. 8A, or selection component 835 described with reference to FIG. 8A, among other features or functions.

The example of system 800-*a* may in some cases be referred to as a "T" configuration where each of a memory array 805, a signal development component array 825, and a sense amplifier array 845 may be coupled with common selection component 875 (e.g., a central switching network). In such an example, each of the memory array 805-*a*, the signal development component array 825-*a*, and the sense amplifier array 845-*a* may be coupled with the selection component 875 according to the quantity of signal paths in the respective system component, and the common selection component 875 may be configured or operable to perform the described techniques for signal development caching according to various degrees of multiplexing with the respective system component, or other arrangement.

More generally, the selection component 875 may include various switching components, selection components, or other circuitry operable to selectively couple any one of the memory array 805-*a* or components thereof (e.g., a plurality of access lines of the memory array 805-*a*), the signal development component array 825-*a* or components thereof (e.g., cache elements of a signal development cache), or the sense amplifier array 845-*a* or components thereof (e.g., a plurality of sense amplifiers 290 of the sense amplifier array 845-*a*) with any one of the others or with both of the others concurrently (e.g., may couple all three or components thereof concurrently). Selection component 875 may thereby support various access techniques in accordance with examples as disclosed herein. For example, in some cases, each of the memory array 805-*a* or components thereof, the signal development component array 825-*a* or components thereof, and the sense amplifier array 845 or components thereof may be coupled with each other, and the sense amplifier array 845 may reinforce signals passed in either direction between the signal development component array 825 and the memory array 805-*a* (e.g., to support the writing of logic states to the memory array 805-*a* from the signal development component array 825-*a*, or to support the writing of logic states from the memory array 805-*a* to the signal development component array 825-*a*).

In some examples, the bus 850-*a* may support communication of information with an I/O component (not shown), which may be considered to be within or outside the illustrative boundary of the data path 860. In some cases, the bus 850-*a* may be coupled with the selection component 875 as illustrated in the example of system 800-*a*. In other cases, the bus 850-*a* may be coupled with the sense amplifier array 845-*a* as illustrated in the example of system 800. In various examples, operation of the selection component 875 may be coordinated (e.g., by the memory controller 870-*a*) to avoid signaling conflicts in the data path 860-*a*, including coordination to avoid or mitigate conflicts that may inadvertently destroy or degrade information (e.g., logic states, signal states) intended to be maintained at a component of the data path 860-*a*.

Figure 8C:
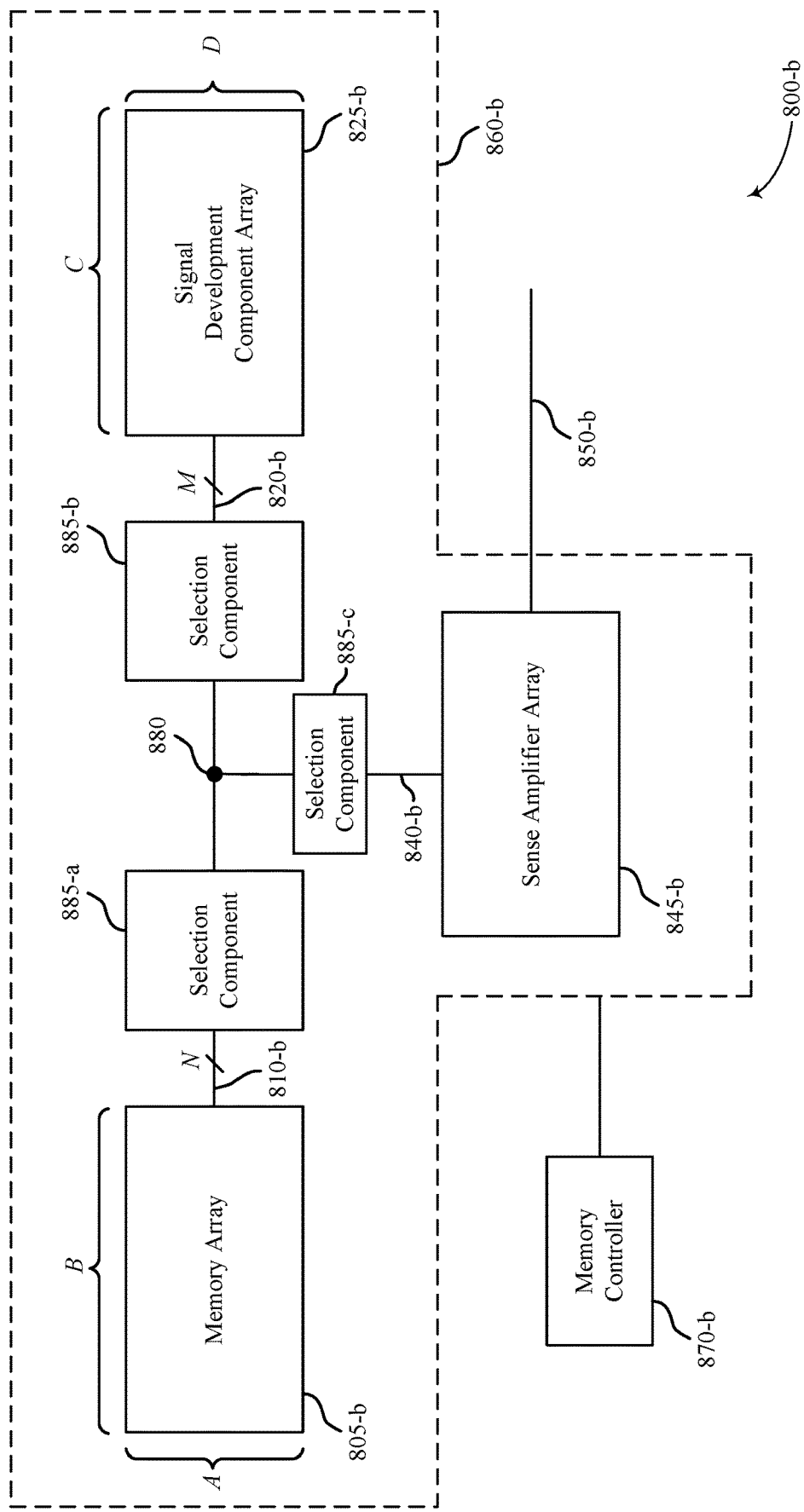

In some cases, a system in accordance with the described techniques for signal development caching may be arranged in a "T" configuration in which each of a memory array 805, a signal development component array 825, and a sense amplifier array 845 may be coupled with a common central node (e.g., a common bus node, a central node for each signal path of a set of signal paths of a common bus). FIG. 8C shows a block diagram of a system 800-*b* that supports signal development caching in accordance with such example. The system 800-*b* may include a memory array 805-*b*, a bus 810-*b*, a bus 820-*b*, a signal development component array 825-*b*, a bus 840-*b*, a sense amplifier array 845-*b*, a bus 850-*b*, and a memory controller 870-*b*, each of which may be an example of the respective components as described with reference to FIGS. 8A and 8B. The memory array 805-*b*, the bus 810-*b*, the bus 820-*b*, the signal development component array 825-*b*, the bus 840-*b*, and the sense amplifier array 845-*b* may be part of a data path 860-*b*, and the memory controller 870-*b* may be coupled with any one or more of these and other components of the data path 860-*b* to support the techniques disclosed herein.

Further, the system 800-*b* may include a central node 880. Each of the memory array 805, the signal development component array 825, and the sense amplifier array 845 may be selectively coupled with the central node 880 by way of a respective selection component 885-*a*, 885-*b*, or 885-*c*. Each respective selection component 885-*a*, 885-*b*, 885-*c* may have a first coupling with the common central node according to the quantity of signal paths of the common bus, and a second coupling with the respective system component (e.g., the memory array 805, the signal development component array 825, or the sense amplifier array 845) according to the quantity of signal paths in the respective system component, a degree of multiplexing with the respective system component, or other arrangement. Thus, although the central node 880 is illustrated as a single point, the central node 880 may illustrate a common bus connection having respective common nodes for each signal path of a set of signal paths coupled with the central node 880. In some cases, central node 880 and the respective selection component 885-*a*, 885-*b*, or 885-*c* may include aspects or otherwise support functions ascribed herein to a common selection component 875 as described with reference to FIG. 8B. In various examples, operation of the selection components 885-*a*, 885-*b*, and 885-*c* may be coordinated (e.g., by the memory controller 870-*b*) to avoid conflicts at the central node 880, including coordination to avoid or mitigate conflicts that may inadvertently destroy or degrade information (e.g., logic states, signal states) intended to be maintained at a component of the data path 860-*b*.

Figure 9:
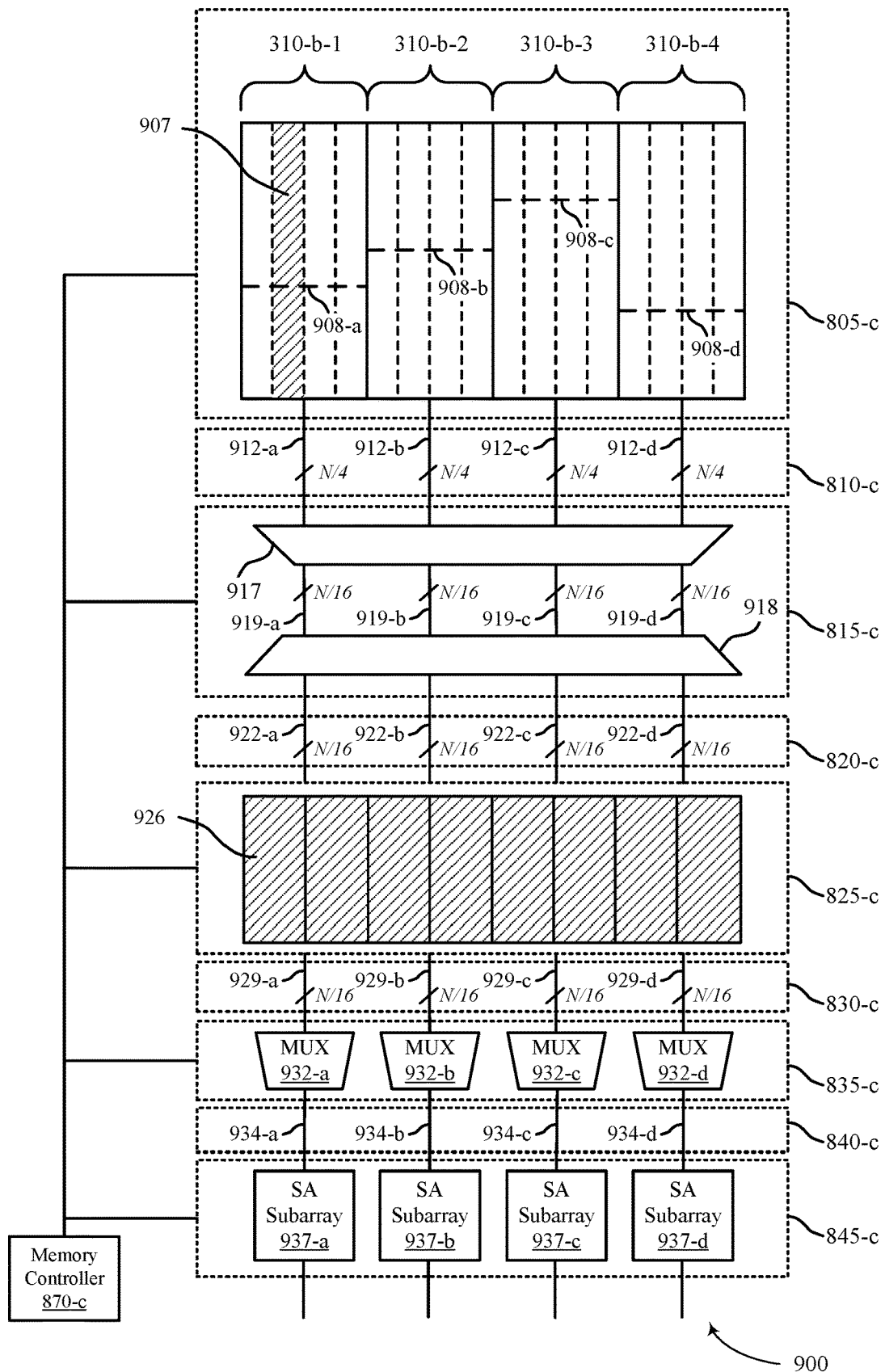
FIG. 9 shows a system diagram that support signal development caching in a memory device in accordance with examples as disclosed herein.

FIG. 9 shows a block diagram of a system 900 that supports signal development caching in accordance with examples as disclosed herein. The system 900 may include a memory array 805-*c*, a bus 810-*c*, a selection component 815-*c*, a bus 820-*c*, a signal development component array 825-*c*, a bus 830-*c*, a selection component 835-*c*, a bus 840-*c*, a sense amplifier array 845-*c*, and a controller 870-*c*, each of which may be an example of the respective components as described with reference to FIGS. 8A, 8B, and 8C.

The memory array 805-c may be arranged according to various quantities of memory cells 105, word lines 205, digit lines 210, and plate lines 215 or other plate nodes. In one example, the memory array 805-c may be arranged according to 1,024 word lines (e.g., A=1,024) and 1,024 digit lines (e.g., B=N=1,024), or some other organization of a 1,024× 1,024 array of memory cells 105.

In some examples, the memory array 805-c may be arranged according to a quantity of domains 310-b, which may each include an equal number of digit lines 210 or columns. For example, the system 900 illustrates an example of memory array 805-c including four domains 310-b (e.g., domains 310-b-1, 310-b-2, 310-b-3, and 310-b-4). In one example, each of the domains 310-b may include 256 digit lines 210. Each of the domains 310-b may have independently controllable word lines 205, and each word line 205 may select or strip a defined quantity of sub-rows 908, which may or may not be aligned across the memory array 805-c. For instance, in the example of system 900, one word line 205 may select or strip 4 sub-rows 908 (e.g., one for each domain 310-b). In some cases, one or more of the sub-rows 908 of a given word line 205 may be activated while the remaining sub-rows 908 of that word line 205 may not be activated. For instance, sub-rows of domains 310-b-1 and 310-b-3 associated with a given word line 205 may be activated, but sub-rows of domains 310-b-2 and 310-b-4 may not be activated. In some examples, sub-rows 908 associated with different word lines 205 may be activated concurrently in different domains 310-b. For instance, in the example of system 900, sub-rows 908-a and 908-b may be associated with different word lines 205 but may be activated concurrently.

In some examples, each domain 310-b may be arranged according to a defined quantity of control zones 907. In the example of system 900, each domain 310-b may include four control zones 907, such that memory array 805-c may include a total of sixteen control zones 907. It is to be understood that all specific numbers included herein are non-limiting examples used solely for the sake of clarity in explaining the concepts herein, and the claims are not so limited in any way. In an example where a domain 310-b includes 256 digit lines 210, each of the control zones 907 may include (e.g., span) 64 digit lines 210. In some examples, each of the control zones 907 may support independent plate control. Independent plate control may refer to a capability for plate lines 215 within a control zone 907 to be activated at a same time as other plate lines within the control zone 907 (e.g., with a same biasing, by a same independently controllable plate node), but to be activated independently from plate lines 215 in other control zones 907. In various examples, each of the control zones 907 may be associated with a common plate or plate node (e.g., common to all memory cells 105 of the control zone), or each of the control zones 907 may be associated with plate lines 215 that can be biased or activated separately from each other.

In some examples, word lines 205 may be further stripped within plate line areas of a domain 310-b (e.g., each control zone 907) providing additional access granularity within a domain 310-b. In one example, for two sub-rows 908 within a domain 310-b, a first row of memory cells 105 may be activated for a first set of control zones 907 within the domain 310-b and a second row of memory cells 105 may be activated for a second set of control zones 907 within the domain 310-b. More generally, for a domain 310-b having a set of sub-rows 908 or control zones 907, a row of memory cells 105 may be activated for some or each of a set of sub-rows or control zones 907 in the domain 310-b.

In some examples, a set of digit lines 210, a set of memory cells 105, or both, that are spanned by a sub-row 908 or a control zone 907 may be referred to as a sub-domain. In some examples, dividing access of a domain 310-b into subdomains may be supported by including multiple contacts from a common driver (e.g., a word line driver) at the top of a word line transistor gate (e.g., relative to a substrate). The contacts may be gated by additional transistors enabling word line charge to deposit on the word line transistor gate. As such, a sub-domain may be created using a stripped word line 205 with a charge-locking pull-up gating transistor. Sub-domains may provide functionality to compose a bit-row from multiple word lines 205 accessed simultaneously on a same domain 310-b, which may expand access patterns, or reduce row-buffer conflicts, among other benefits.

The memory controller 870-c may support various biasing or activations of word lines in the memory array 805-c. In some examples, the memory controller 870-c may be configured or operable to concurrently couple a word line driver with a first segment of a first word line 205 (e.g., a first sub-row 908) within a given domain 310-b and with a second segment of a second word line 205 (e.g., a second sub-row 908) in the given domain 310-b. In some examples, the memory controller 870-c may be configured or operable to concurrently couple another word line driver with a second segment of the first word line 205 (e.g., a third sub-row 908) within the given domain 310-b and with a first segment of the second word line 205 (e.g., a fourth sub-row 908) within the given domain 310-b.

In the example of system 900, each digit line 210 of the memory array 805-c may be coupled with the selection component 815-c (e.g., into multiplexer (MUX) 917) via the bus 810-c. In some examples, the digit lines 210 of a domain 310-b may be grouped according to a respective sub-bus 912 of the bus 810-c, where each sub-bus 912-a may be associated with some quantity of signal paths. For instance, digit lines of domain 310-b-1 may be coupled via sub-bus 912-a, digit lines of domain 310-b-2 may be coupled via sub-bus 912-b, digit lines of domain 310-b-3 may be coupled via sub-bus 912-c, and digit lines of domain 310-b-4 may be coupled via sub-bus 912-d. The example of system 900 may include four sub-busses 912, and each sub-bus 912 may include 256 signal paths. As such, the bus 810-c, in aggregate, may include or be otherwise associated with 1024 digit lines 210.

In some examples, each sub-bus 912 may be mapped, via the MUX 917, to an intermediate sub-bus 919, which may include a different quantity of signal paths (e.g., where the signal paths of a sub-bus 912 is an integer multiple of an intermediate sub-bus 919). For instance, each sub-bus 912 may include 256 signal paths, and each intermediate sub-bus 919 may include 64 signal paths, for a 4:1 multiplexing ratio. In some examples, such a multiplexing may include a mapping between signal paths of an intermediate sub-bus 919 and activated or otherwise selected digit lines 210 of a given domain 310-b, and such digit activated or selected digit lines 210 may be unshunted (e.g., associated with deactivated shunts 330). In some examples, remaining digit lines 210 that are not activated or selected may be shunted (e.g., associated with activated shunts 330), which may mitigate charge leakage or other degradation of logic states stored by non-targeted memory cells 105. In some cases, a logic state may alternatively be referred to as a memory state. In the example of system 900, as supported by a 4:1 multiplexing ratio (e.g., at the MUX 917), four sets of 64 bits may be simultaneously or concurrently transferred (e.g., overlap in time) via the bus 810-*c* and the selection component 815-*c*, with each set corresponding to a different domain 310-*b*.

In the example of system 900, each intermediate sub-bus 919 may be coupled with a MUX 918 (e.g., a routing MUX), where the MUX 918 may be a part of selection component 815-*c*. The MUX 918 may be operable to couple a selected set of digit lines 210 with a corresponding set of storage elements or cache elements in a respective cache block 926 of the signal development component array 825-*c* (e.g., via a respective sub-bus 922 of bus 820-*c*). The example of system 900 may include four sub-busses 922 (e.g., sub-busses 922-*a*, 922-*b*, 922-*c*, and 922-*d*) between the MUX 918 and the signal development component array 825-*c*, and each sub-bus 922 may include 64 signal paths. In the example of system 900, any of the illustrated or logical positions of a sub-bus 922 may be mapped to any of the illustrated or logical positions of an intermediate sub-bus 919. For example, intermediate sub-bus 919-*a* may be mapped to any of sub-bus 922-*a*, 922-*b*, 922-*c*, or 922-*d*, and so on. Accordingly, any of the intermediate sub-busses 919 may be mapped to any of the cache blocks 926. In another example, the bus 820-*c* may include a separate sub-bus 922 for each of the cache blocks 926 (not shown), which may be another configuration that supports any of the intermediate sub-busses 919 being mapped to any of the cache blocks 926 (e.g., via the MUX 918).

The signal development component array 825-*c* may be arranged according to cache blocks 926, each of which may be associated with a quantity of cache lines that are each coupled with a respective set of storage elements (e.g., cache elements). Each of the storage elements may be configured to maintain a signal state (e.g., a cache signal, a cache state) corresponding to a logic state while the respective storage element is isolated from one or both of the memory array 805-*c* or sense amplifier array 845-*c*. In the example of system 900, the signal development component array 825-*c* may include eight cache blocks 926, where each cache block 926 includes eight cache lines, and each cache line includes 64 cache elements. Thus, the total cache size of the signal development component array 825-*c* may be 64×64 bits (e.g., 4,096 bits). In some examples, the signal development component array 825-*c* (e.g., the cache blocks 926) may include another selection component, not shown, operable to select or activate a target cache line of a respective cache block 926 (e.g., to couple a target cache line with a sub-bus 922).

In some examples, the quantity of signal paths of a respective sub-bus 922 may be equal to a quantity of storage elements in a cacheline or row of the signal development component array 825-*c*. Thus, the quantity of storage elements coupled to a cache line may be proportional to (e.g., equal to, an integer multiple of) the quantity of digit lines 210 in a control zone 907 or subdomain. For instance, if a control zone 907 is associated with 64 digit lines 210, a cache line may be associated with 64n (where n=1, 2, 3 . . . ) storage elements. In some examples, a quantity of signal paths of a sub-bus 922, or a quantity of signal paths of an intermediate sub-bus 919, or a quantity of storage elements of a cache line may be equal to a quantity of bits of data of a read command, or a quantity of bits of data of a write command (e.g., where 64 storage elements in a given cache line, or 64 signal paths of a given sub-bus 922 or intermediate sub-bus 919, may correspond to a 64-bit data transfer scheme).

In various examples, the selection component 815-*c* may be operable for coupling more than one memory cell 105 with a given storage element of a cache block 926, for coupling a memory cell 105 with more than one storage element of a cache block 926, or both. For example, where a memory cell 105 of the memory array 805-*c* is operable to store one of a set of more than two logic states, the selection component 815-*c* may be operable to selectively couple one of digit lines 210 of a sub-bus 912 with two or more of the set of storage elements of a cache block 926. In another example, where a storage element of a cache block 926 is operable to store one of a set of more than two signal states, the selection component 815-*c* may be operable to selectively couple one of the storage elements of a cache block with two or more digit lines 210 or memory cells 105 of the memory array 805-*c*.

In some cases, data may be provided from the signal development component array 825-*c* to a requesting device. Retrieving data may include outputting data (e.g., information stored as signal states, cache states) from a cache block 926 to a respective MUX 932 via a respective sub-bus 929 of the bus 830-*c*. The example of system 900 may include four sub-busses 929 (e.g., sub-busses 929-*a*, 929-*b*, 929-*c*, and 929-*d*), where each sub-bus 929 may include one signal path bit of information transfer (e.g., 64 signal paths for a 64-bit information transfer scheme). The MUX 932 may be operable to select a set of bits or signal states from the cache block 926. In one example, if the cache block is configured to output 64 bits, a MUX 932 may be operable to select eight of the 64 bits for transfer to a sense amplifier subarray 937. In another example, if the cache block is configured to output 64 bits, a MUX 932 may be operable to select 64 bits from a particular location of the signal development component array 825-*c*, such as a particular cache block 926 or cache line thereof. In the example of system 900, various selection operations may be supported by the selection component 835-*c* including four MUXs 932 (e.g., MUXs 932-*a*, 932-*b*, 932-*c*, and 932-*d*). In some examples, the system 900 may multiplex multiple sense amplifier subarrays 937 with the signal development component array 825-*c* to increase device bandwidth.

In some examples, a MUX 932 may output selected bits to a respective sense amplifier subarray 937 via a respective sub-bus 934 of bus 840-*c*. The example of system 900 may include four sub-busses 934 (e.g., sub-busses 934-*a*, 934-*b*, 934-*c*, and 934-*d*), and each sub-bus 934 may have one signal path per bit passed between a respective MUX 932 and a respective sense amplifier subarray 937 (e.g., 8 signal paths for 8 bits, 64 signal paths for 64 bits). The sense amplifier subarrays 937 may each include a set of sense amplifiers 290 operable to compare signaling with one or more reference voltages and provide an indication of an associated logic state. In the example of system 900, the sense amplifier array may include four sense amplifier subarrays 937-*a* (e.g., sense amplifier subarrays 937-*a*-1, 937-*a*-2, 937-*a*-3, and 937-*a*-4). Although the sense amplifier subarrays 937-*a* of the system 900 are depicted as external to the signal development component array 825-*c*, in some systems the sense amplifier subarrays 937-*a* may be integrated between cache blocks 926. For example, each of the cache blocks 926 may include 64 integrated sense amplifiers to support a 64-bit information transfer scheme.

In various examples, the selection component 815-*c* and the selection component 835-*c* may be configured for or otherwise operated according to different latencies or bandwidths. For example, the selection component 835-c may be configured for signal exchange between a set of storage elements of signal development component array 825-c and the sense amplifier array 845-c with a first latency and the selection component 815-c may be configured for signal exchange between a set of memory cells and the set of storage elements of signal development component array 825-c with a second latency that is greater than the first latency (e.g., to account for signal development with the memory array 805-c that may be relatively slower than signal development with the sense amplifier array 845-c).

One or more of the memory array 805-c, the selection component 815-c, the signal development component array 825-c, the selection component 835-c, and the sense amplifier array 845-c may be coupled with a memory controller 870-c to support various operations of the system 900. In some cases, the memory controller 870-c may include a content-addressable memory (CAM) that supports mapping between addresses of the memory array 805-c and the signal development component array 825-c, and such mapping may be used for performing various selective coupling via the selection component 815-c or the selection component 835-c. In some examples, a separate CAM may be coupled with each cache block 926 of the signal development component array 825-c, or each MUX 932-d of the selection component 835-c. In some examples, the system 900 may support various associativity techniques, in which an address in the signal development component array 825-c may be associated with or mapped to an address in the memory array 805-c. In some cases, memory controller 870-c may be configured to manage a refresh procedure to maintain cache signals stored by the set of storage elements of the signal development component array 825-c.

In some examples, the system 900 may be operated to provide requested data (e.g., in respond to a read command). For example, a memory device that includes the system 900 may receive one or more commands (e.g., from a requesting device) to perform a read for multiple memory locations of the memory array 805-c. In an illustrative example, the memory device may activate sub-row 908-a of domain 310-b-1, sub-row 908-b of domain 310-b-2, sub-row 908-c of domain 310-b-3, and sub-row 908-d of domain 310-b-4, which may activate word line terminals for a first memory location, a second memory location, a third memory location, and a fourth memory location, respectively. The memory device may also activate control zones 907 within each domain 310-b corresponding to the first memory location, the second memory location, the third memory location, and the fourth memory location, which may include activating plate line terminals for these locations. In examples where each control zone 907 is associated with 64 digit lines, 64 digit lines 210 of the 256 total digit lines 210 associated with each sub-bus 912 may be activated. It should be noted that there may be examples where different portions of word-lines, different sub-domains, or various other patterning techniques may be used to activate the digit lines 210.

Continuing with the illustrative example, the MUX 917 may select the 64 signal paths of each sub-bus 912 that are activated to reduce the total quantity of coupled signal paths from the 1024 signal paths to the MUX 917 to the 256 signal paths output from the MUX 917 (e.g., 64 via intermediate sub-bus 919-a, 64 via intermediate sub-bus 919-b, 64 via intermediate sub-bus 919-c, and 64 via intermediate sub-bus 919-d). The 256 total signal paths may be input to MUX 918, which may route a first set of 64 signal paths to a first sub-bus 922-a, a second set of 64 signal paths to a second sub-bus 922-b, a third set of 64 signal paths to a third sub-bus 922-c, and a fourth set of 64 signal paths to a fourth sub-bus 922-d. It should be noted that the ordering may be different without deviating from the scope of the present disclosure.

Continuing with the illustrative example, the 64 signal paths carried by each of sub-busses 922-a, 922-b, 922-c, and 922-d may be coupled with respective cache blocks 926 (e.g., respective cache lines), where they may support signal development as described with reference to FIGS. 4A and 4B (e.g., according to read signal development portions 410). Based on such signal development, the storage elements of the respective cache blocks may store signal states (e.g., cache states) associated with the logic states that were stored by the coupled memory cells 105 of the memory array 805-c.

After developing or storing the respective signals or signal states at the signal development component array 825-c, the respective cache blocks 926 may each output 64 signals to sub-busses 929-a, 929-b, 929-c, and 929-d. The 64 signals of each of sub-busses 929-a, 929-b, 929-c, and 929-d may then be coupled with the sense amplifier array 845-c via the selection component 835-c according to various multiplexing techniques, where respective sense amplifiers 290 may sense logic states based at least in part on the signals provided by the cache blocks 926, which may be latched by the sense amplifiers 290 or other latching components. For example, the sense amplifier subarrays 937-a may output a logic state and the data may be read out to the requesting device. If the sense amplifier subarrays 937-a are not integrated with a latch, a latch or SRAM cache may be implemented such that the sense amplifiers 290 may be between the signal development component array 825-c and the latch or SRAM cache.

In some cases, information data may be read directly from signal development component array 825-c. For instance, the memory array 805-c may not be accessed and the selection component 815-c may not be operated, but the remaining steps as described herein may occur (e.g., when related signal states are stored at the signal development component array 825-c before receiving an access command). Additionally or alternatively, MUX 917 may support various operations on information passed to the MUX 917. For instance, MUX 917 may shuffle bits according to a pattern or may flip bits (e.g., from a 0 to a 1, from a 1 to a 0). To enable the MUX 917 to perform such operations, the MUX 917 may integrate additional signal development components with reactive components (e.g., transistors) or may have capacitive or inductive features that enable charge sharing or charge transfer to retain their integrity. In such cases, the selection component 815-c in conjunction with the signal development component array 825-c may be referred to as a hierarchical signal development component apparatus (e.g., partly in MUXs 917 or 918 and partly in signal development component array 825-c).

In some examples, the system 900 may be operated to store data (e.g., in response to a write command). For instance, a memory device that includes the system 900 may receive one or more commands (e.g., from a requesting device) to perform a write for multiple memory locations of the memory array 805-c. In an illustrative example, the data may be provided to a sense amplifier subarray 937, where each sense amplifier 290 of the sense amplifier subarray 937 may be configured to receive a target logic state of a write command and to generate a write signal based on the target logic state. For instance, sense amplifier subarrays 937-a, 937-*b*, 937-*c*, and 937-*d* may receive different sets of data and may each output 8 bits or 64 bits (e.g., 8 write signals or 64 write signals) to MUXs 932-*a*, 932-*b*, 932-*c*, and 932-*d* via sub-busses 934-*a*, 934-*b*, 934-*c*, and 934-*d*, respectively. The MUXs 932-*a*, 932-*b*, 932-*c*, and 932-*d* may select eight of 64 signal paths of sub-busses 929-*a*, 929-*b*, 929-*c*, and 929-*d*, respectively and may output respective signals to the signal paths of each sub-bus 929. The signals provided over the coupled signal paths may be stored in a respective cache block 926 (e.g., according to a latch signal generation portion 510) and the process may repeat until a bit has been output from MUXs 932-*a*, 932-*b*, 932-*c*, and 932-*d* for each of the 64 lines of each sub-bus 929.

Continuing with the illustrative example, once 64 bits have been stored in a cache block 926 (e.g., a cache line) coupled with one of the sub-busses 929, the respective cache block 926 may output 64 write signals to a respective sub-bus 922. For instance, the cache block 926 coupled with sub-bus 929-*a* may provide 64 write signals via sub-bus 922-*a*, the cache block 926 coupled with sub-bus 929-*b* may provide 64 write signals via sub-bus 922-*b*, the cache block 926 coupled with sub-bus 929-*c* may provide 64 write signals via sub-bus 922-*c*, and the cache block 926 coupled with sub-bus 929-*d* may provide 64 write signals via sub-bus 922-*d*. Each sub-bus 922 may be routed via MUX 918 to a respective intermediate sub-bus 919, and to the MUX 917, which may couple the signal paths of the intermediate sub-busses 919 with selected subsets of the signal paths of sub-buses 912 (e.g., with subsets of the digit lines 210 of respective domains 310-*b*).

In some examples, the 64 digit lines 210 for each sub-bus 912 along which the 64 bits are output (e.g., as selected by the MUX 917) may be associated with a respective control zone 907 of different domains 310-*b*. To store the 64 bits in a specific memory location, a sub-row 908 containing the memory cells in which the 64 bits are to be stored may be activated. For instance, sub-row 908-*a* may be activated to store 64 bits output on sub-bus 912-*a* in a first memory location (e.g., in memory cells coupled with sub-row 908-*a*); sub-row 908-*b* may be activated to store the 64 bits output on sub-bus 912-*b* in a second memory location (e.g., in memory cells coupled with sub-row 908-*b*); sub-row 908-*c* may be activated to store the 64 bits output on sub-bus 912-*c* in a third memory location (e.g., in memory cells coupled with sub-row 908-*c*); and sub-row 908-*d* may be activated to store the 64 bits output on sub-bus 912-*d* in a fourth memory location (e.g., in memory cells coupled with sub-row 908-*d*). In some examples, such operations may be included in a write signal generation portion 520.

In various examples, the routing or multiplexing supported by the system 900 (e.g., selection component 815-*c*) may be capable of routing between a 64 bit sub-row from memory array 805-*c* and one of each potential 64-bit cache line of signal development component array 825-*c*. As such, the system 900 may be configured (e.g., by CAM, by cache associativity) to provide signal caching with various set associativity depending on the application in which the system 900 is used. A cache controller (e.g., memory controller 870-*c*) that orchestrates the system 900 to operate according to such configurations may be micro-code driven. As such, a memory device that includes the system 900 may be able to perform dynamic changes in associativity when micro-code is sent to the controller via control signals from an operating system (OS).

The described techniques for signal development caching and multiplexing may support clusters of signal development components 250 (e.g., of a signal development component array 825-*c*) intermixed with a memory array (e.g., memory array 805-*c*) and may act as an in-memory cache with various set associativity. For example, row address or tag matching may be used for detecting which rows of the memory array 805-*c* may have information stored (e.g., as signal states, as cache states) in the signal development component array 825-*c*. In some examples, a local CAM may be used to enable the signal development component array 825-*c* to be fully associative. Write-back and write-through policies or operations (e.g., with or without combining) may be supported, and may include one or more reconfigurable options to change them.

In some examples, the system 900 may support rank-level and chip-level parallelism. For example, multiple chips may have the same timing specifications or operations and may be synchronously clocked to scale bandwidth for one or more apparatuses (e.g., DIMM, PCIe-attached). In some cases, simultaneous write-reads may be performed on a same domain 310 or in a sub-domain by activating a set of multiplexed digit lines 210 from a row while pre-charging another set of digit lines 210 from the same row. In some cases, the data paths of both transfers may be isolated (e.g., due to not toggling a respective plate). Latencies of a read data path, a write data path, or both may be equalized, which may enable greater efficiency over the latencies of the read data path, the write data path, or both not being equalized.

To configure a memory device with an optional signal development caching configuration enabled via BIOS, dynamic bandwidth amplification may be performed via an OS or memory controller (e.g., a memory controller 870). For instance, dynamic adjusting of multiplexing rate may occur. In some cases, a signal development component array 825-*c* may have integration with OS page mapping. For instance, a physical page may be at a granularity of rows, which may support integration with OS page tables, or distributed hardware-accelerated in-memory page table walks, or other operations.

In some examples, the system 900 may support computational operations at a signal development component array 825. For example, if values are stored such that they fit the multiplexed structure, then their bit accesses may be overlapped in time, which may be referred to as pipeline-multiplexed in-memory computing. Sub-domain computation using staggered charge-sharing waves may also be supported. Moreover, using sub-domains may provide functionality for staggered activations. For example, an activation wave may be directed toward a signal development component array 825 such that multiple memory cells 105 may be charge-sharing on the same digit line 210, providing charge-sharing-based analog computation. Such a computational wave may be used to perform mathematical operations on digit lines 210 encoded by access patterns configured by one or more hierarchical components of system 900 to activate a domain 310, a sub-domain, a plate line or zone, or other division in a wave-like or synchronous pattern. In such a computational wave, proximity to sensing logic along the wave may provide a latency gradient for the wave and may aid the speed of the computation.

In some examples, a storage page-migration system, in which a page cache does not have a backing store but instead has byte-addressable storage extension may be supported. Such a system may be associated with a value of a persistent memory (e.g., a persistent FeRAM). In addition, extended capacity may increase efficiency of relatively slower multi-level cell architectures (e.g., quad-level cell (QLC) architectures) by extending page cache size.

In some examples, signal development component storage elements may not maintain a strong enough signal to write memory cells 105, in which case reinforcement may be supported. For instance, charge pumping of signal development components 250 may be performed, and sense amplifiers 290 may be used to amplify or generate a write signal to both signal development component storage elements and memory cells 105.

In some examples, the system 900 may implement a T-type connection, where a bottom of the T-type connection may be coupled with a sense amplifier array 845 and the sides of T-type connection may be coupled with a memory array 805 and a signal development component array 825, respectively. Thus, a tri-state connector may be present where each node of the T-type connection is connected with at least one other node, which may support enhanced flexibility for signal reinforcement. The T-type connection may enable signals to be reinforced as charge coupling may not be sufficient when performing write operations. A tri-state connection may be capable of connecting the memory array 805 with the signal development component array 825, the signal development component array with the sense amplifier array 845, the sense amplifier array 845 with the memory array 805, or to connect all three together.

In some cases (e.g., when enacting a write-through cache policy), signal development component array 825 and a main memory connection may be active on a same physical line through enabling selection components (e.g., a selection component 815, a selection component 835), which may support concurrently writing information to a signal development component array 825 and a memory array 805. In such cases, information may be available in the signal development component array 825 for subsequent reads. However isolating the main memory connection and a signal development component array 825 may enable writes to be streamed. Such isolation may be dependent on whether or not information to be written to a memory address is also to be maintained in a signal development component array 825.

Techniques for signal development caching in accordance with examples disclosed herein may be supported by various physical configurations of a memory device or components thereof. In some examples, a signal development cache (e.g., an array of cache elements, a signal development component array 825) and a memory array 805 may be formed on a same die (e.g., a same or different level of a memory die or chip, a same or different layer of a memory die or chip, at similar or overlapping distances from a substrate of a memory die or chip). In some examples, a signal development cache and a memory array 805 may leverage similar memory architectures (e.g., capacitive memory architectures), and modifications may be made during a manufacturing process to selectively form the different memory architectures in a same component (e.g., in a same die, to form ferroelectric capacitors for memory cells of a memory array 805 and form linear capacitors for cache elements of a signal development cache). In various examples, sense amplifiers 290 (e.g., or a sense amplifier array 245) may be formed on a same, different, or overlapping level or layer (e.g., relative to a substrate, of a same memory die or chip) as cache elements or memory elements.

In some examples, when a memory device includes multiple decks or levels, one deck or level may include a memory array 805 and another deck or level may include a signal development cache. In various examples, a sense amplifier array 845, a memory controller 870, or both, may be included in a different (e.g., third) deck or level that is above or below (e.g., relative to a substrate) decks or levels that include a memory array 805 or a signal development cache.

In some examples, a memory array 805 and a signal development cache (e.g., a signal development component array 825) may be formed on different memory dies or chips, and such different dies or chips may be coupled to each other (e.g., using bonding techniques, using through-silicon vias). In various examples, a sense amplifier array 845 or a memory controller 870 may be included on a same or different memory die or chip. Several memory dies or chips, or stacks thereof, may be included in a same memory device package. In any of the described examples, various physical or logical arrangements of the described components, or combinations thereof, may be used to support the described techniques for signal development caching, including, but not limited to, the arrangements described with reference to FIGS. 1, 2, 3, 6, 7, 8A, 8B, 8C, and 9.

Figure 10:
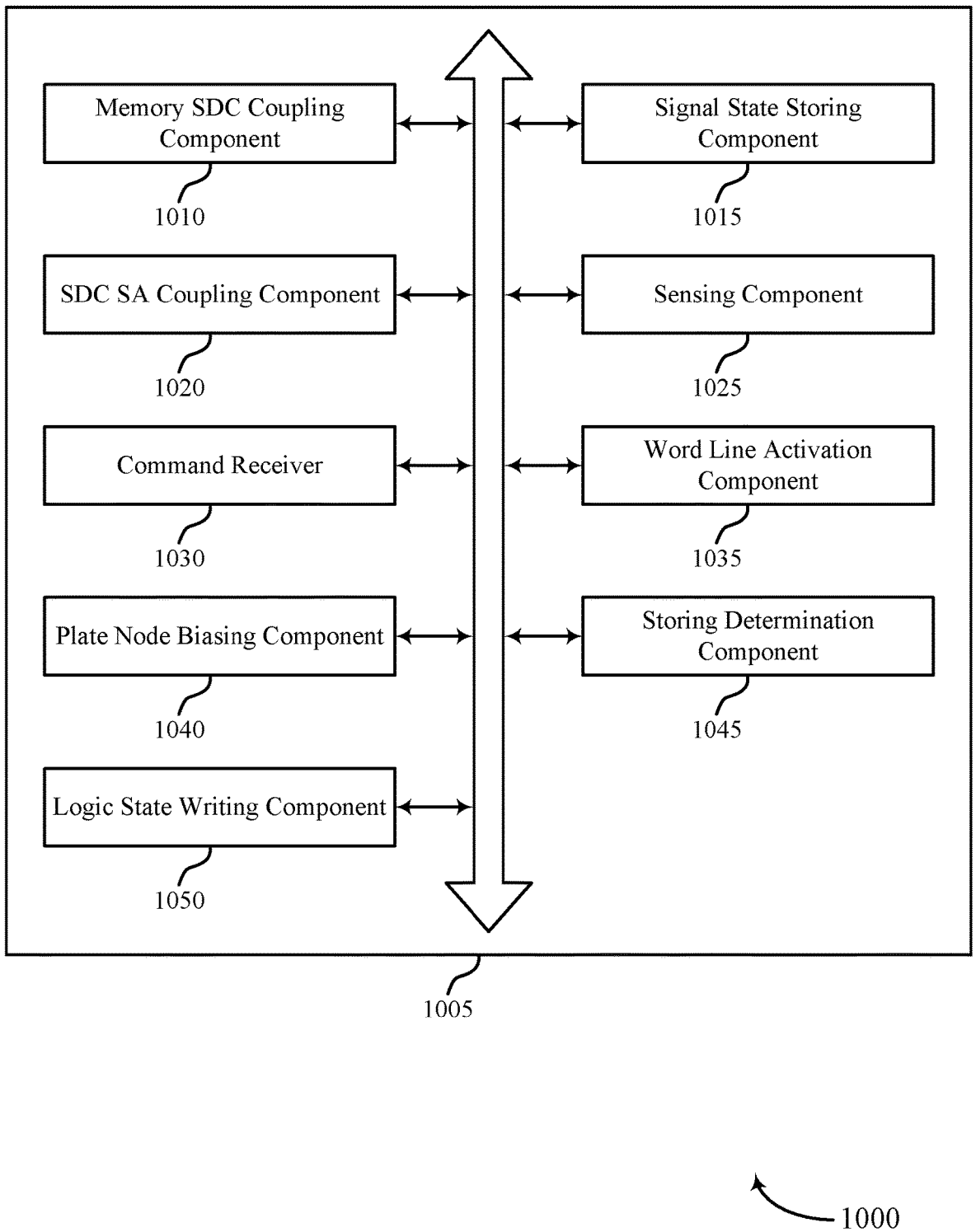
FIG. 10 shows a block diagram of a memory device that supports signal development caching in a memory device in accordance with examples as disclosed herein

FIG. 10 shows a block diagram 1000 of a memory device 1005 that supports signal development caching in a memory device in accordance with examples as disclosed herein. The memory device 1005 may be an example of aspects of a memory device as described with reference to FIGS. 1 through 9. The memory device 1005 may include a memory SDC coupling component 1010, a signal state storing component 1015, a SDC SA coupling component 1020, a sensing component 1025, a command receiver 1030, a word line activation component 1035, a plate node biasing component 1040, a storing determination component 1045, and a logic state writing component 1050. Each of these modules may communicate, directly or indirectly, with one another (e.g., via one or more buses).

The memory SDC coupling component 1010 may perform various coupling operations between a memory array and a signal development cache. In some examples, the memory SDC coupling component 1010 may couple a set of access lines of a memory array with a signal development cache, where each of the set of access lines may correspond to a respective one of a set of memory cells of the memory array. In some examples, the memory SDC coupling component 1010 may couple, during a first time interval, a first access line of the set of access lines with a first cache element of the set of cache elements. In some examples, the memory SDC coupling component 1010 may couple, during a second time interval that at least partially overlaps the first time interval, a second access line of the set of access lines with a second cache element of the set of cache elements.

In some examples, the memory SDC coupling component 1010 may couple, after storing the respective cache signal for each of the set of logic states to the respective storage element, the set of storage elements with the set of memory cells. In some examples, the memory SDC coupling component 1010 may couple, during a third time interval, the first storage element of the set of storage elements with a first memory cell of the set of memory cells. In some examples, the memory SDC coupling component 1010 may couple, during a fourth time interval that overlaps the third time interval, the second storage element of the set of storage elements with a second memory cell of the set of memory cells.

The signal state storing component 1015 may store, at each of a set of cache elements of the signal development cache and based on coupling the set of access lines with the signal development cache, a signal state (e.g., cache signal) corresponding to a logic state stored by a respective one of the set of memory cells (e.g., corresponding to a signal developed based on the coupling).

The SDC sense amplifier (SA) coupling component 1020 may perform various coupling operations between a signal development cache and a sense amplifier array. In some examples, the SDC SA coupling component 1020 may couple the set of cache elements of the signal development cache with a sense amplifier array based on (e.g., after concurrently with) the storing. In some examples, the SDC SA coupling component 1020 may couple, during a third time interval, the first cache element of the set of cache elements with a first sense amplifier of the sense amplifier array. In some examples, the SDC SA coupling component 1020 may couple, during a fourth time interval that follows the third time interval, the second cache element of the set of cache elements with the first sense amplifier of the sense amplifier array. In some examples, the SDC SA coupling component 1020 may couple, during a third time interval, the first cache element of the set of cache elements with a first sense amplifier of the sense amplifier array. In some examples, the SDC SA coupling component 1020 may couple, during a fourth time interval that at least partially overlaps the third time interval, the second cache element of the set of cache elements with a second sense amplifier of the sense amplifier array.

In some examples, the SDC SA coupling component 1020 may couple, based on the determining, a set of sense amplifiers of a sense amplifier array to the set of storage elements of the signal development cache to store the respective cache signal for each of the set of logic states to the respective storage element. In some examples, the SDC SA coupling component 1020 may couple, during a first time interval, a first sense amplifier of a sense amplifier array with a first storage element of the set of storage elements. In some examples, the SDC SA coupling component 1020 may couple, during second time interval that follows the first time interval, the first sense amplifier of the sense amplifier array with a second storage element of the set of storage elements.

The sensing component 1025 may sense (e.g., capture, latch, or reinforce), at each of a set of sense amplifiers of the sense amplifier array, a respective logic signal based on a respective signal state stored and the coupling of the set of cache elements with the sense amplifier array.

The command receiver 1030 may receive various commands from a requesting device. In some examples, the command receiver 1030 may receive a write command including a set of logic states for writing to a set of memory cells of the memory array. In some examples, the command receiver 1030 may receive a read command from a requesting device (e.g., a host device, another device different than the memory device), and coupling the set of access lines of the memory array with the signal development cache may be based on the read command. In some examples, the command receiver 1030 may receive a read command from a requesting device (e.g., a host device, another device different than the memory device) after or during storing the respective cache signal or cache signal state at each of the set of cache elements of the signal development cache, and coupling the signal development cache with the sense amplifier array may be based on the read command.

In some examples, a memory array may include a plurality of domains each associated with a respective subset of a plurality of word lines, and the word line activation component 1035 may activate a word line of a first domain of the set of domains to couple a first subset of the set of memory cells with a first subset of the set of access lines. In some examples, the word line activation component 1035 may activate a word line of a second domain of the set of domains to couple a second subset of the set of memory cells with a second subset of the set of access lines.

In some examples, each of a plurality of domains of a memory array may be associated with one or more of a plurality of plate nodes that are operable to be biased independent of other plate nodes of the plurality of plate nodes. In some examples, the plate node biasing component 1040 may bias a plate node of the first domain, where storing the cache signals corresponding to the logic states stored by the first subset of memory cells is based on biasing the plate node of the first domain. In some examples, the plate node biasing component 1040 may bias a plate node of the second domain, where storing the cache signals corresponding to the logic states stored by the second subset of memory cells is based on biasing the plate node of the second domain.

The storing determination component 1045 may determine, based on the write command, to store a respective cache signal (e.g., signal state) for each of the set of logic states at a respective storage element of a set of storage elements of a signal development cache.

The logic state writing component 1050 may write the set of logic states to the set of memory cells of the memory array based on coupling the set of storage elements with the set of memory cells.

Figure 11:
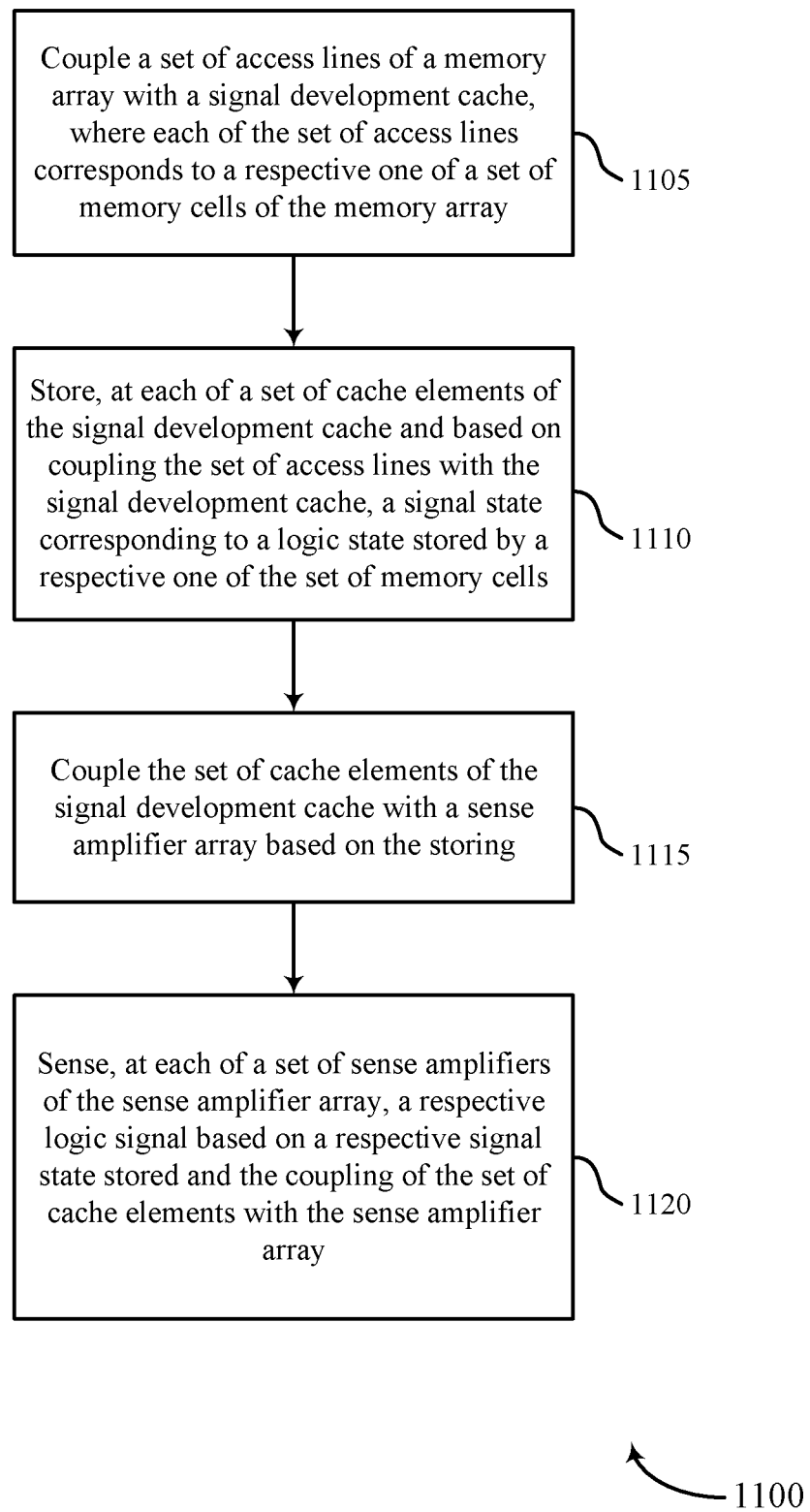
FIGS. 11 and 12 show flowcharts illustrating methods for signal development caching in a memory device in accordance with examples as disclosed herein.

FIG. 11 shows a flowchart illustrating a method or methods 1100 that support signal development caching in a memory device in accordance with examples as disclosed herein. The operations of method 1100 may be implemented by a memory device or its components as described with reference to FIGS. 1 through 9. For example, the operations of method 1100 may be performed by a memory device as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1105, the memory device may couple a set of access lines of a memory array with a signal development cache, where each of the set of access lines corresponds to a respective one of a set of memory cells of the memory array. The operations of 1105 may be performed in accordance with techniques as described with reference to FIGS. 1 through 9. In some examples, aspects of the operations of 1105 may be performed by a memory SDC coupling component as described with reference to FIG. 10.

At 1110, the memory device may store, at each of a set of cache elements of the signal development cache and based on coupling the set of access lines with the signal development cache, a signal state (e.g., cache signal) corresponding to a logic state stored by a respective one of the set of memory cells (e.g., corresponding to a signal developed based on the coupling). The operations of 1110 may be performed in accordance with techniques as described with reference to FIGS. 1 through 9. In some examples, aspects of the operations of 1110 may be performed by a signal state storing component as described with reference to FIG. 10.

At 1115, the memory device may couple the set of cache elements of the signal development cache with a sense amplifier array based on (e.g., after concurrently with) the storing. The operations of 1115 may be performed in accordance with techniques as described with reference to FIGS. 1 through 9. In some examples, aspects of the operations of 1115 may be performed by a SDC SA coupling component as described with reference to FIG. 10.

At 1120, the memory device may sense (e.g., capture, latch, or reinforce), at each of a set of sense amplifiers of the sense amplifier array, a respective logic signal based on a respective signal state stored and the coupling of the set of cache elements with the sense amplifier array. The operations of 1120 may be performed in accordance with techniques as described with reference to FIGS. 1 through 9. In some examples, aspects of the operations of 1120 may be performed by a sensing component as described with reference to FIG. 10.

In some examples, an apparatus as described herein may perform a method or methods, such as the method 1100. The apparatus may include features, circuitry, means, or instructions (e.g., a non-transitory computer-readable medium storing instructions executable by a processor) for coupling a set of access lines of a memory array with a signal development cache, where each of the set of access lines corresponds to a respective one of a set of memory cells of the memory array, storing, at each of a set of cache elements of the signal development cache and based on coupling the set of access lines with the signal development cache, a signal state (e.g., cache signal) corresponding to a logic state stored by a respective one of the set of memory cells (e.g., corresponding to a signal developed based on the coupling), coupling the set of cache elements of the signal development cache with a sense amplifier array based on (e.g., after concurrently with) the storing, and sensing (e.g., capturing, latching, or reinforcing), at each of a set of sense amplifiers of the sense amplifier array, a respective logic signal based on a respective signal state stored and the coupling of the set of cache elements with the sense amplifier array.

In some examples of the method 1100 and the apparatus described herein, coupling the set of access lines of the memory array with the signal development cache may include operations, features, circuitry, means, or instructions for coupling, during a first time interval, a first access line of the set of access lines with a first cache element of the set of cache elements, and coupling, during a second time interval that at least partially overlaps the first time interval, a second access line of the set of access lines with a second cache element of the set of cache elements.

In some examples of the method 1100 and the apparatus described herein, coupling the signal development cache with a sense amplifier array may include operations, features, circuitry, means, or instructions for coupling, during a third time interval, the first cache element of the set of cache elements with a first sense amplifier of the sense amplifier array, and coupling, during a fourth time interval that follows the third time interval, the second cache element of the set of cache elements with the first sense amplifier of the sense amplifier array.

In some examples of the method 1100 and the apparatus described herein, coupling the signal development cache with a sense amplifier array may include operations, features, circuitry, means, or instructions for coupling, during a third time interval, the first cache element of the set of cache elements with a first sense amplifier of the sense amplifier array, and coupling, during a fourth time interval that at least partially overlaps the third time interval, the second cache element of the set of cache elements with a second sense amplifier of the sense amplifier array.

Some examples of the method 1100 and the apparatus described herein may further include operations, features, circuitry, means, or instructions for receiving a read command from a requesting device (e.g., a host device, another device different than the memory device), where coupling the set of access lines of the memory array with the signal development cache may be based on the read command.

Some examples of the method 1100 and the apparatus described herein may further include operations, features, circuitry, means, or instructions for receiving, at the memory device, a read command from a requesting device (e.g., a host device, another device different than the memory device) after or during storing the respective cache signal or cache signal state at each of the set of cache elements of the signal development cache, where coupling the signal development cache with the sense amplifier array may be based on the read command.

In some examples of the method 1100 and the apparatus described herein, the memory array may include a set of domains each associated with a respective subset of a set of word lines, and the method 1100 or the apparatus may include operations, features, circuitry, means, or instructions for activating a word line of a first domain of the set of domains to couple a first subset of the set of memory cells with a first subset of the set of access lines, and activating a word line of a second domain of the set of domains to couple a second subset of the set of memory cells with a second subset of the set of access lines.

In some examples of the method 1100 and the apparatus described herein, each of the set of domains may be associated with one or more of a set of plate nodes that are each operable to be biased independent of other plate nodes of the set of plate nodes, and the method 1100 or the apparatus may further include operations, features, circuitry, means, or instructions for biasing a plate node of the first domain, where storing the cache signals corresponding to the logic states stored by the first subset of memory cells may be based on biasing the plate node of the first domain, and biasing a plate node of the second domain, where storing the cache signals corresponding to the logic states stored by the second subset of memory cells may be based on biasing the plate node of the second domain.

Figure 12:
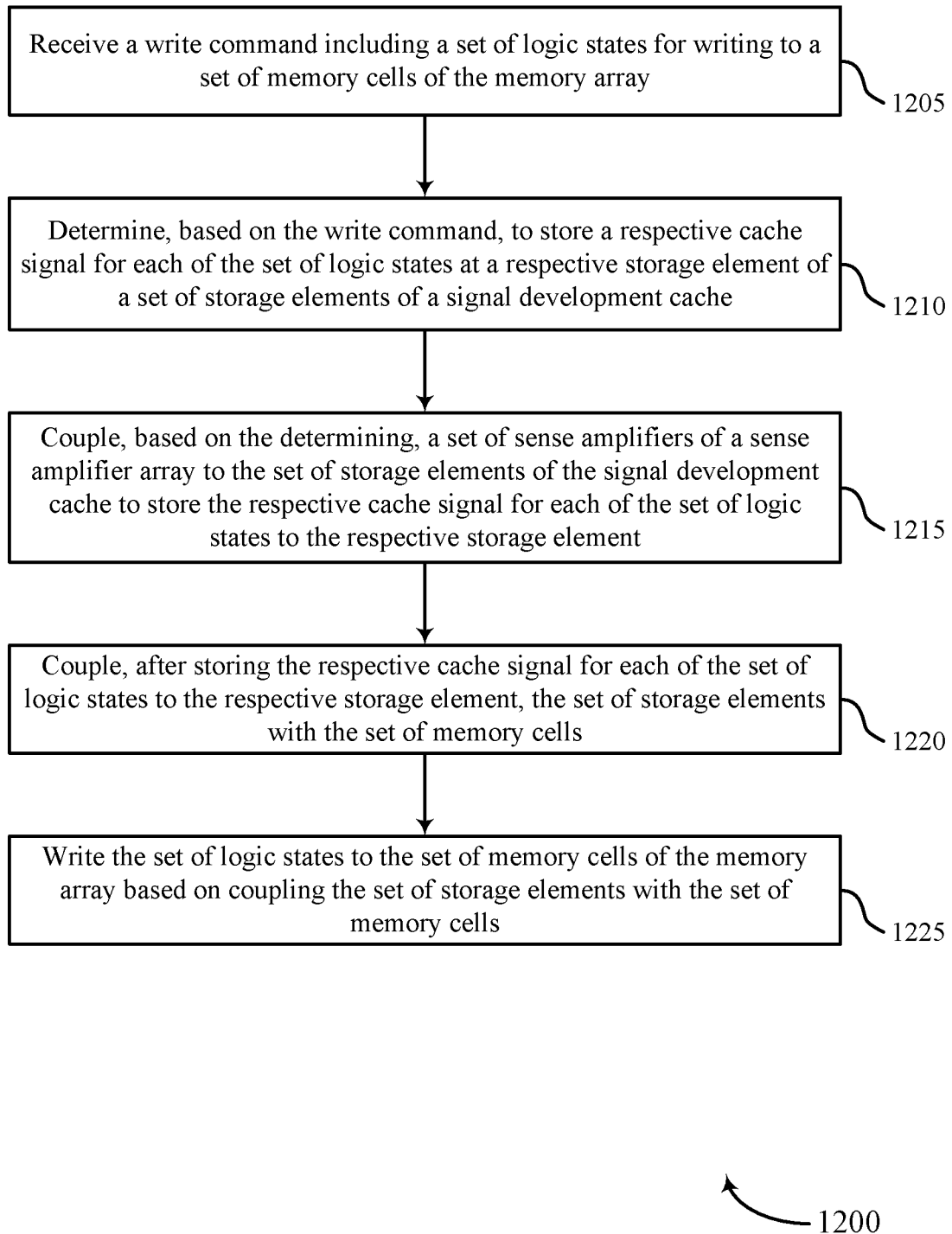

FIG. 12 shows a flowchart illustrating a method or methods 1200 that supports signal development caching in a memory device in accordance with examples as described with reference to FIGS. 1 through 9. The operations of method 1200 may be implemented by a memory device or its components as described with reference to FIGS. 1 through 9. For example, the operations of method 1200 may be performed by a memory device as described with reference to FIG. 10. In some examples, a memory device may execute a set of instructions to control the functional elements of the memory device to perform the described functions. Additionally or alternatively, a memory device may perform aspects of the described functions using special-purpose hardware.

At 1205, the memory device may receive a write command including a set of logic states for writing to a set of memory cells of the memory array. The operations of 1205 may be performed in accordance with techniques as described with reference to FIGS. 1 through 9. In some examples, aspects of the operations of 1205 may be performed by a command receiver as described with reference to FIG. 10.

At 1210, the memory device may determine, based on the write command, to store a respective cache signal (e.g., signal state) for each of the set of logic states at a respective storage element of a set of storage elements of a signal development cache. The operations of 1210 may be performed in accordance with techniques as described with reference to FIGS. 1 through 9. In some examples, aspects of the operations of 1210 may be performed by a storing determination component as described with reference to FIG. 10.

At 1215, the memory device may couple, based on the determining, a set of sense amplifiers of a sense amplifier array to the set of storage elements of the signal development cache to store the respective cache signal for each of the set of logic states to the respective storage element. The operations of 1215 may be performed in accordance with techniques as described with reference to FIGS. 1 through 9. In some examples, aspects of the operations of 1215 may be performed by a SDC SA coupling component as described with reference to FIG. 10.

At 1220, the memory device may couple, after storing the respective cache signal for each of the set of logic states to the respective storage element, the set of storage elements with the set of memory cells. The operations of 1220 may be performed in accordance with techniques as described with reference to FIGS. 1 through 9. In some examples, aspects of the operations of 1220 may be performed by a memory SDC coupling component as described with reference to FIG. 10.

At 1225, the memory device may write the set of logic states to the set of memory cells of the memory array based on coupling the set of storage elements with the set of memory cells. The operations of 1225 may be performed in accordance with techniques as described with reference to FIGS. 1 through 9. In some examples, aspects of the operations of 1225 may be performed by a logic state writing component as described with reference to FIG. 10.

In some examples, an apparatus as described herein may perform a method or methods, such as the method 1200. The apparatus may include features, circuitry, means, or instructions (e.g., a non-transitory computer-readable medium storing instructions executable by a processor) for receiving, at a memory device including a memory array, a write command including a set of logic states for writing to a set of memory cells of the memory array, determining, based on the write command, to store a respective cache signal (e.g., signal state) for each of the set of logic states at a respective storage element of a set of storage elements of a signal development cache, coupling, based on the determining, a set of sense amplifiers of a sense amplifier array to the set of storage elements of the signal development cache to store the respective cache signal for each of the set of logic states to the respective storage element, coupling, after storing the respective cache signal for each of the set of logic states to the respective storage element, the set of storage elements with the set of memory cells, and writing the set of logic states to the set of memory cells of the memory array based on coupling the set of storage elements with the set of memory cells.

In some examples of the method 1200 and the apparatus described herein, storing the respective cache signal for each of the set of logic states at the respective storage element of the signal development cache may include operations, features, circuitry, means, or instructions for coupling, during a first time interval, a first sense amplifier of a sense amplifier array with a first storage element of the set of storage elements, and coupling, during second time interval that follows the first time interval, the first sense amplifier of the sense amplifier array with a second storage element of the set of storage elements.

In some examples of the method 1200 and the apparatus described herein, coupling the set of storage elements with the set of memory cells may include operations, features, circuitry, means, or instructions for coupling, during a third time interval, the first storage element of the set of storage elements with a first memory cell of the set of memory cells, and coupling, during a fourth time interval that overlaps the second time interval, the second storage element of the set of storage elements with a second memory cell of the set of memory cells.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array having a set of memory cells, each memory cell of the set of memory cells associated with one of a set of access lines of the memory array, a signal development cache having a set of storage elements different than the set of memory cells of the memory array, a sense amplifier array having a set of sense amplifiers, each sense amplifier of the set of sense amplifiers configured to output a logic state based on sensing, capturing, or latching signaling from the signal development cache, a first selection component operable to selectively couple the set of access lines of the memory array with the signal development cache, and a second selection component operable to selectively couple the signal development cache with the set of sense amplifiers of the sense amplifier array.

Some examples of the apparatus may include a third selection component operable to selectively couple the set of access lines of the memory array with the set of sense amplifiers of the sense amplifier array.

In some examples, the memory array includes a set of domains, each of the domains associated with a respective subset of the set of access lines of the memory array, and each of the domains associated with a respective set of second access lines for selectively coupling memory cells of the memory array with the respective subset of the set of access lines.

In some examples, the apparatus may be operable to concurrently select one or more of the respective set of second access lines of a first of the set of domains and one or more of the respective set of second access lines of a second of the set of domains.

In some examples, each of the domains includes a respective set of subdomains, each of the subdomains associated with a respective group within the subset of the set of access lines corresponding to the respective domain.

In some examples, each of the subdomains may be associated with an independently-controllable plate node.

In some examples, each of the domains includes a respective segment of a second access line within a domain, each of the subdomains associated with a respective group within the subset of the set of access lines corresponding to the respective domain.

In some examples, the second access lines may include word lines and, for a given domain, the apparatus may be operable to concurrently couple a first word line driver with a first segment of a first word line within the given domain and with a second segment of a second word line within the given domain, and concurrently couple a second word line driver with a second segment of the first word line within the given domain and with a first segment of the second word line within the given domain.

In some examples, the signal development cache may be associated with a set of cache lines, each of the cache lines coupled with a respective subset of the set of storage elements.

In some examples, a quantity of the respective subsets of the set of storage elements of each of the cache lines may be proportional to (e.g., equal to, an integer multiple of) a quantity of the respective group within the subsets of the set of access lines corresponding to a respective domain.

In some examples, an integer multiple of the quantity of the respective subsets of the set of storage elements of each of the cache lines may be equal to a quantity of bits of data of a read command, a quantity of bits of data of a write command, or both.

In some examples, the first selection component may be configured for signal exchange between the set of memory cells and the set of storage elements of the signal development cache having a first latency, and the second selection component may be configured for signal exchange between the set of storage elements of the signal development cache and the set of sense amplifiers having a second latency that is less than the first latency.

In some examples, the first selection component may be operable to concurrently couple each of a subset of the set of access lines of the memory array with a respective one of a subset of the set of storage elements of the signal development cache.

In some examples, the second selection component may be operable to couple each of a subset of the set of storage elements of the signal development cache with a respective one of the set of sense amplifiers of the sense amplifier array.

In some examples, each storage element of the set of storage elements may be configured to maintain a signal state (e.g., a cache signal, a cache state), corresponding to a logic state, while the respective storage element is isolated from one or both of the memory array or the sense amplifier array.

In some examples, each sense amplifier of the set of sense amplifiers may be configured to receive a target logic state of a write command and generate a write signal based on the target logic state.

In some examples, to write the target logic state to a target memory cell, the apparatus may be configured to convey the write signal via the second selection component from a respective one of the set of sense amplifiers to one of the set of storage elements of the signal development cache, and convey a second write signal via the first selection component from the one of the set of storage elements of the signal development cache to the target memory cell, the second write signal based on conveying the write signal to the one of the set of storage elements of the signal development cache.

In some examples, to write the target logic state to a target memory cell, the apparatus may be configured to isolate the set of storage elements of the signal development cache from the write signal, and convey the write signal to the target memory cell via the first selection component and the second selection component.

In some examples, each memory cell of the set of memory cells includes a respective storage element having a different architecture than the set of storage elements of the signal development cache.

In some examples, the respective storage element of each memory cell of the set of memory cells includes a ferroelectric cell (e.g., a ferroelectric capacitor).

In some examples, the respective storage element of each memory cell of the set of memory cells includes a material memory element (e.g., a material operable to store a logic state in a configurable material property, a configurable atomic arrangement, a configurable resistance, a configurable threshold voltage).

In some examples, each storage element of the set of storage elements of the signal development cache includes a linear capacitor.

Some examples of the apparatus may include a controller configured to manage a refresh procedure to maintain cache signals stored by the set of storage elements of the signal development cache.

In some examples, each memory cell of the set of memory cells may be operable to store one of a set of more than two logic states, and the first selection component may be operable to selectively couple one of the access lines of the memory array with two or more of the set of storage elements of the signal development cache.

In some examples, each storage element of the signal development cache may be operable to store one of a set of more than two cache signal states, and the first selection component may be operable to selectively couple one of the set of storage elements of the signal development cache with two or more of the access lines of the memory array.

In some examples, each storage element of the signal development cache may be operable to store one of a set of more than two cache signal states, and the first selection component may be operable to selectively couple one of the set of storage elements of the signal development cache with two or more of the set of memory cells.

An apparatus is described. The apparatus may include a memory array including a set of memory cells, a signal development cache including a set of cache elements different than the set of memory cells, a sense amplifier including a set of sense amplifiers, and a controller. The controller may be operable to cause the apparatus to couple a set of access lines of the memory array with the signal development cache, where each of the plurality of access lines corresponds to a respective one of the set of memory cells, store, at each of the set of cache elements and based on coupling the set of access lines with the signal development cache, a signal state (e.g., cache signal) corresponding to a logic state stored by a respective one of the set of memory cells (e.g., corresponding to a signal developed based on the coupling), couple the set of cache elements with the sense amplifier array based on (e.g., after, concurrently with) the storing, and sense (e.g., capture, latch, reinforce) at each of the set of sense amplifiers, a respective logic signal based on a respective signal state and coupling the set of cache elements with the sense amplifier array.

Another apparatus is described. The apparatus may include a memory array including a set of memory cells, a signal development cache including a set of cache elements different than the set of memory cells, a sense amplifier including a set of sense amplifiers, and a controller. The controller may be operable to receive a write command including a set of logic states for writing to the set of memory cells, determine, based on the write command, to store a respective cache signal (e.g., signal state) for each of the set of logic states at a respective one of the set of cache elements, couple, based on the determining, the set of sense amplifiers with the set of cache elements to store the respective cache signal for each of the set of logic states to the respective cache element, couple, after storing the respective cache signal for each of the set of logic states to the respective cache element, the set of cache elements with the set of memory cells, and write the set of logic states to the set of memory cells based on coupling the set of cache elements with the set of memory cells.

Another apparatus is described. The apparatus may include a memory array having a set of memory cells, each memory cell of the set of memory cells associated with one of a set of access lines of the memory array, a signal development cache having a set of storage elements different than the set of memory cells of the memory array, a sense amplifier array having a set of sense amplifiers, each sense amplifier of the set of sense amplifiers configured to output a logic state based on latching signaling from the signal development cache, and selection circuitry. The selection circuitry may be configured for or operable to selectively couple the plurality of access lines of the memory array with the signal development cache, selectively couple the signal development cache with the plurality of sense amplifiers of the sense amplifier array, selectively couple the plurality of access lines of the memory array with the plurality of sense amplifiers of the sense amplifier array, or any combination thereof.

In some examples, the selection circuitry may be operable to support concurrent coupling of the set of access lines of the memory array, the signal development cache, and the set of sense amplifiers of the sense amplifier array.

In some examples, the selection circuitry may be operable to support concurrent coupling of one of the set of access lines of the memory array, one of the cache elements of the signal development cache, and one of the set of sense amplifiers of the sense amplifier array.

In some examples, the selection circuitry may be reconfigurable to support a change between policies for writing back information to the memory array.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
coupling a set of access lines of a memory array with a signal development cache, each of the set of access lines corresponding to a respective one of a set of memory cells of the memory array, wherein coupling the set of access lines with the signal development cache comprises:
coupling, during a first time interval, a first access line of the set of access lines with a first cache element of a plurality of cache elements of the signal development cache; and
coupling, during a second time interval that at least partially overlaps the first time interval, a second access line of the set of access lines with a second cache element of the plurality of cache elements;
storing, at each of the plurality of cache elements of the signal development cache and based at least in part on coupling the set of access lines with the signal development cache, a cache signal state corresponding to a logic state stored by a respective one of the set of memory cells;
coupling the plurality of cache elements of the signal development cache with a sense amplifier array based at least in part on the storing; and
sensing, at each of a plurality of sense amplifiers of the sense amplifier array, a respective logic signal based at least in part on a respective signal state stored and the coupling of the plurality of cache elements with the sense amplifier array.

2. The method of claim 1, wherein coupling the signal development cache with the sense amplifier array comprises:
coupling, during a third time interval, the first cache element of the plurality of cache elements with a first sense amplifier of the sense amplifier array; and
coupling, during a fourth time interval that follows the third time interval, the second cache element of the plurality of cache elements with the first sense amplifier of the sense amplifier array.

3. The method of claim 1, wherein coupling the signal development cache with the sense amplifier array comprises:
coupling, during a third time interval, the first cache element of the plurality of cache elements with a first sense amplifier of the sense amplifier array; and
coupling, during a fourth time interval that at least partially overlaps the third time interval, the second cache element of the plurality of cache elements with a second sense amplifier of the sense amplifier array.

4. The method of claim 1, further comprising:
receiving, at a memory device, a read command from a requesting device, wherein coupling the set of access lines of the memory array with the signal development cache is based at least in part on the read command.

5. The method of claim 1, further comprising:

receiving, at a memory device, a read command from a requesting device after storing the respective cache signal state at each of the plurality of cache elements of the signal development cache, wherein coupling the signal development cache with the sense amplifier array is based at least in part on the read command.

6. The method of claim 1, wherein the memory array comprises a plurality of domains each associated with a respective subset of a plurality of word lines, the method further comprising:

activating a word line of a first domain of the plurality of domains to couple a first subset of the set of memory cells with a first subset of the set of access lines; and activating a word line of a second domain of the plurality of domains to couple a second subset of the set of memory cells with a second subset of the set of access lines.

7. The method of claim 1, wherein:

each of the set of memory cells comprises a ferroelectric capacitor; and each of the plurality of cache elements comprises a linear capacitor.

8. A method, comprising:

activating a word line of a first domain, of a plurality of domains each associated with a respective subset of a plurality of word lines, to couple a first subset of a set of memory cells of a memory array with a first subset of a set of access lines of the memory array, wherein each of the plurality of domains is associated with one or more of a plurality of plate nodes that are each operable to be biased independent of other plate nodes of the plurality of plate nodes;

activating a word line of a second domain of the plurality of domains to couple a second subset of the set of memory cells with a second subset of the set of access lines;

biasing a plate node of the first domain;

biasing a plate node of the second domain;

coupling the set of access lines with a signal development cache, each of the set of access lines corresponding to a respective one of the set of memory cells;

storing, at each of a plurality of cache elements of the signal development cache and based at least in part on coupling the set of access lines with the signal development cache, a cache signal state corresponding to a logic state stored by a respective one of the set of memory cells, wherein storing the cache signal states corresponding to the logic states stored by the first subset of the set of memory cells is based at least in part on biasing the plate node of the first domain, and wherein storing the cache signal states corresponding to the logic states stored by the second subset of the set of memory cells is based at least in part on biasing the plate node of the second domain;

coupling the plurality of cache elements of the signal development cache with a sense amplifier array based at least in part on the storing; and sensing, at each of a plurality of sense amplifiers of the sense amplifier array, a respective logic signal based at least in part on a respective signal state stored and the coupling of the plurality of cache elements with the sense amplifier array.

9. A memory device, comprising:

a memory array comprising a plurality of memory cells;

a signal development cache comprising a plurality of cache elements different than the plurality of memory cells;

a sense amplifier array comprising a plurality of sense amplifiers; and one or more controllers operable to cause the memory device to:

couple a plurality of access lines of the memory array with the signal development cache, each of the plurality of access lines corresponding to a respective one of the plurality of memory cells, wherein, to couple the plurality of access lines of the memory array with the signal development cache, the one or more controllers are operable to cause the memory device to:

couple, during a first time interval, a first access line of the plurality of access lines with a first cache element of the plurality of cache elements; and couple, during a second time interval that at least partially overlaps the first time interval, a second access line of the plurality of access lines with a second cache element of the plurality of cache elements;

store, at each of the plurality of cache elements and based at least in part on coupling the plurality of access lines with the signal development cache, a signal state corresponding to a logic state stored by a respective one of the plurality of memory cells;

couple the plurality of cache elements with the sense amplifier array based at least in part on the storing; and sense at each of the plurality of sense amplifiers, a respective logic signal based at least in part on a respective signal state and coupling the plurality of cache elements with the sense amplifier array.

10. The memory device of claim 9, wherein, to couple the signal development cache with the sense amplifier array, the one or more controllers are operable to cause the memory device to:

couple, during a third time interval, the first cache element of the plurality of cache elements with a first sense amplifier of the sense amplifier array; and couple, during a fourth time interval that follows the third time interval, the second cache element of the plurality of cache elements with the first sense amplifier of the sense amplifier array.

11. The memory device of claim 9, wherein, to couple the signal development cache with the sense amplifier array, the one or more controllers are operable to cause the memory device to:

couple, during a third time interval, the first cache element of the plurality of cache elements with a first sense amplifier of the sense amplifier array; and couple, during a fourth time interval that at least partially overlaps the third time interval, the second cache element of the plurality of cache elements with a second sense amplifier of the sense amplifier array.

12. The memory device of claim 9, wherein the one or more controllers are further operable to cause the memory device to:

receive a read command from a requesting device, wherein coupling the plurality of access lines of the memory array with the signal development cache is based at least in part on the read command.

13. The memory device of claim 9, wherein the one or more controllers are further operable to cause the memory device to:
  receive a read command from a requesting device after storing the respective cache signal state at each of the plurality of cache elements of the signal development cache, wherein coupling the signal development cache with the sense amplifier array is based at least in part on the read command.

14. The memory device of claim 9, wherein the memory array comprises a plurality of domains each associated with a respective subset of a plurality of word lines, and the one or more controllers are further operable to cause the memory device to:
  activate a word line of a first domain of the plurality of domains to couple a first subset of the plurality of memory cells with a first subset of the plurality of access lines; and
  activate a word line of a second domain of the plurality of domains to couple a second subset of the plurality of memory cells with a second subset of the plurality of access lines.

15. The memory device of claim 9, wherein:
  each of the plurality of memory cells comprises a ferroelectric capacitor; and
  each of the plurality of cache elements comprises a linear capacitor.

16. A memory device, comprising:
  a memory array having a plurality of memory cells, each memory cell of the plurality of memory cells associated with one of a plurality of access lines of the memory array;
  a signal development cache having a plurality of cache elements different than the plurality of memory cells of the memory array;
  a sense amplifier array having a plurality of sense amplifiers, each sense amplifier of the plurality of sense amplifiers configured to output a logic state based at least in part on latching signaling from the signal development cache; and
  selection circuitry operable to:
    selectively couple the plurality of access lines of the memory array with the signal development cache, wherein, to couple the plurality of access lines of the memory array with the signal development cache, the selection circuitry is operable to:
      couple, during a first time interval, a first access line of the plurality of access lines with a first cache element of the plurality of cache elements; and
      couple, during a second time interval that at least partially overlaps the first time interval, a second access line of the plurality of access lines with a second cache element of the plurality of cache elements;
    selectively couple the signal development cache with the plurality of sense amplifiers of the sense amplifier array;
    selectively couple the plurality of access lines of the memory array with the plurality of sense amplifiers of the sense amplifier array;
    or any combination thereof.

17. The memory device of claim 16, wherein the selection circuitry is operable to support concurrent coupling of the plurality of access lines of the memory array, the signal development cache, and the plurality of sense amplifiers of the sense amplifier array.

18. The memory device of claim 16, wherein the selection circuitry is operable to support concurrent coupling of one of the plurality of access lines of the memory array, one of the cache elements of the signal development cache, and one of the plurality of sense amplifiers of the sense amplifier array.

19. The memory device of claim 16, wherein the selection circuitry is reconfigurable to support a change between policies for writing back information to the memory array.

20. A memory device, comprising:
  a memory array comprising a plurality of memory cells and a plurality of domains, each of the plurality of domains associated with a respective subset of a plurality of word lines and associated with one or more of a plurality of plate nodes that are each operable to be biased independent of other plate nodes of the plurality of plate nodes;
  a signal development cache comprising a plurality of cache elements different than the plurality of memory cells;
  a sense amplifier array comprising a plurality of sense amplifiers; and
  one or more controllers operable to cause the memory device to:
    activate a word line of a first domain of the plurality of domains to couple a first subset of the plurality of memory cells with a first subset of a plurality of access lines of the memory array;
    activate a word line of a second domain of the plurality of domains to couple a second subset of the plurality of memory cells with a second subset of the plurality of access lines;
    bias a plate node of the first domain;
    bias a plate node of the second domain;
    couple the plurality of access lines with the signal development cache, each of the plurality of access lines corresponding to a respective one of the plurality of memory cells;
    store, at each of the plurality of cache elements and based at least in part on coupling the plurality of access lines with the signal development cache, a signal state corresponding to a logic state stored by a respective one of the plurality of memory cells, wherein storing the cache signal states corresponding to the logic states stored by the first subset of the plurality of memory cells is based at least in part on biasing the plate node of the first domain, and wherein storing the cache signal states corresponding to the logic states stored by the second subset of the plurality of memory cells is based at least in part on biasing the plate node of the second domain;
    couple the plurality of cache elements with the sense amplifier array based at least in part on the storing; and
    sense at each of the plurality of sense amplifiers, a respective logic signal based at least in part on a respective signal state and coupling the plurality of cache elements with the sense amplifier array.

* * * * *